(12) United States Patent
Fujioka et al.

(10) Patent No.: US 9,505,177 B2
(45) Date of Patent: Nov. 29, 2016

(54) METHOD FOR PRODUCING A METAL COMPOSITE

(75) Inventors: Takashi Fujioka, Iyo-gun (JP); Masato Honma, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 387 days.

(21) Appl. No.: 13/990,970

(22) PCT Filed: Nov. 24, 2011

(86) PCT No.: PCT/JP2011/076999
§ 371 (c)(1),
(2), (4) Date: May 31, 2013

(87) PCT Pub. No.: WO2012/073775
PCT Pub. Date: Jun. 7, 2012

(65) Prior Publication Data
US 2013/0242487 A1    Sep. 19, 2013

(30) Foreign Application Priority Data

| Dec. 2, 2010 | (JP) | 2010-269150 |
| Feb. 15, 2011 | (JP) | 2011-029457 |
| Mar. 17, 2011 | (JP) | 2011-058929 |
| Mar. 17, 2011 | (JP) | 2011-058930 |

(51) Int. Cl.
*B29C 70/00* (2006.01)
*B29C 70/02* (2006.01)
(Continued)

(52) U.S. Cl.
CPC ....... *B29C 70/021* (2013.01); *B29C 45/14221* (2013.01); *B29C 45/14811* (2013.01);
(Continued)

(58) Field of Classification Search
CPC .......... B32B 2255/00; B32B 2260/00; B32B 37/00; B32B 38/08; B32B 1/00; B32B 15/14; B32B 15/20; B32B 2250/03; B32B 2250/40; B32B 2250/021; B32B 2250/046; B32B 2305/076; B32B 2305/77; B32B 2457/00; B29C 45/14221; B29C 45/14811; B29C 70/021; B29C 70/088; B29C 2045/14286; B29C 70/46; B29C 70/885; B29C 2045/14245; B23K 2701/00; B23K 2705/00; H05K 7/02; H05K 9/0084
See application file for complete search history.

(56) References Cited

U.S. PATENT DOCUMENTS 4,296,215 A * 10/1981 Markiewitz ...................... 525/28
4,390,489 A    6/1983 Segal
(Continued)

FOREIGN PATENT DOCUMENTS

| GB | 2108427 | 5/1983 |
| GB | 2290045 | 12/1995 |

(Continued)

OTHER PUBLICATIONS

International Search Report dated Jan. 31, 2012, from PCT International Application No. PCT/JP2011/076999.
(Continued)

*Primary Examiner* — Carl Arbes
(74) *Attorney, Agent, or Firm* — RatnerPrestia

(57) ABSTRACT

A method is provided for producing a metal composite. The composite includes a metal material and a resin curing layer provided along the metal material, and is obtained by using heat and pressure to mold a preform. The preform includes a sheet-shaped base material containing a thermosetting resin, and a metal material arranged or layered so as to contact the sheet-shaped base material. The method for producing a metal composite includes heating the sheet-shaped base material and semi-curing the thermosetting resin while the metal material in the preform arranged inside a mold is heated to a temperature exceeding 180° C., and molding the preform into a composite using pressure, wherein the thermosetting resin is at least one type selected from the group consisting of epoxy resins, phenol resins, benzoxazine resins, and unsaturated polyester resins.

14 Claims, 10 Drawing Sheets

(51) Int. Cl.
*B29C 45/14* (2006.01)
*B32B 1/00* (2006.01)
*B32B 15/14* (2006.01)
*B32B 15/20* (2006.01)
*H05K 9/00* (2006.01)
*B29C 70/46* (2006.01)
*B29C 70/88* (2006.01)
*B29C 70/08* (2006.01)
*H05K 7/02* (2006.01)
*B29K 701/10* (2006.01)
*B29K 705/00* (2006.01)

(52) U.S. Cl.
CPC ............. *B29C70/088* (2013.01); *B29C 70/46* (2013.01); *B29C 70/885* (2013.01); *B32B 1/00* (2013.01); *B32B 15/14* (2013.01); *B32B 15/20* (2013.01); *H05K 7/02* (2013.01); *H05K 9/0084* (2013.01); *B29C 2045/14245* (2013.01); *B29C 2045/14286* (2013.01); *B29K 2701/10* (2013.01); *B29K 2705/00* (2013.01); *B32B 2250/03* (2013.01); *B32B 2250/40* (2013.01); *B32B 2260/021* (2013.01); *B32B 2260/046* (2013.01); *B32B 2305/076* (2013.01); *B32B 2305/77* (2013.01); *B32B 2457/00* (2013.01)

(56) References Cited

U.S. PATENT DOCUMENTS

| | | | |
|---|---|---|---|
| 4,456,657 A * | 6/1984 | Cassat et al. | ................ 428/415 |
| 4,657,717 A | 4/1987 | Cattanach et al. | |
| 4,670,080 A | 6/1987 | Schwarz | |
| 4,833,226 A | 5/1989 | Ishimura et al. | |
| 4,857,579 A * | 8/1989 | Domeier | ................ 524/507 |
| 4,909,886 A | 3/1990 | Noguchi | |
| 5,047,198 A | 9/1991 | Kim | |
| 5,138,018 A * | 8/1992 | Tashiro et al. | ................ 528/111 |
| 5,200,494 A | 4/1993 | Kubota et al. | |
| 5,736,254 A | 4/1998 | Suzuki | |
| 2002/0185221 A1 | 12/2002 | Iida | |
| 2009/0082525 A1 | 3/2009 | Nakamura | |
| 2010/0143648 A1 | 6/2010 | Tsai | |

FOREIGN PATENT DOCUMENTS

| | | | |
|---|---|---|---|
| JP | 61-2518 A | | 1/1986 |
| JP | 64-70523 A | | 3/1989 |
| JP | 3-177418 A | | 8/1991 |
| JP | 3-296525 A | | 12/1991 |
| JP | 7-162161 A | | 6/1995 |
| JP | 2001-230586 A | | 8/2001 |
| JP | 2001-298277 A | | 10/2001 |
| JP | 2001-315162 A | | 11/2001 |
| JP | 2003238710 A | * | 8/2003 |
| JP | 2005-161852 A | | 6/2005 |
| JP | 2006-123209 A | | 5/2006 |
| JP | 2006-297929 A | | 11/2006 |
| JP | 2009-45129 A | | 3/2009 |
| JP | 2010-131789 A | | 6/2010 |

OTHER PUBLICATIONS

Extended European Search Report dated Feb. 20, 2015 for European Application No. 11845386.9.

* cited by examiner

METHOD FOR PRODUCING A METAL COMPOSITE

CROSS-REFERENCE TO RELATED APPLICATIONS

This application is the U.S. National Phase application of PCT International Application No. PCT/JP2011/076999, filed Nov. 24, 2011, and claims priority to Japanese Patent Application No. 2010-269150, filed Dec. 2, 2010; Japanese Patent Application No. 2011-029457, filed Feb. 15, 2011; Japanese Patent Application No. 2011-058929, filed Mar. 17, 2011; and Japanese Patent Application No. 2011-058930, filed Mar. 17, 2011, the disclosures of which are incorporated herein by reference in their entireties for all purposes.

FIELD OF THE INVENTION

The present invention relates to a method for producing a metal composite and an electronic equipment chassis using a metal composite produced by the method.

BACKGROUND OF THE INVENTION

A metal composite produced by laminating a metal material and a fiber-reinforced resin material and bonding them together combine homogeneous strength and elastic modulus, excellent impact resistance, thermal conductivity and other characteristics provided with a metal and excellent lightweightness, specific strength, specific modulus, anisotropy of reinforcement according to fiber direction and other characteristics provided with a fiber-reinforced resin. For this reason, they are used in a variety of applications, including aircraft body parts, motor vehicle body parts, marine vessel parts, machine mechanical parts, golf clubs, and parts of notebook computers, video cameras and other electronic equipment (see patent documents 1 to 5).

Conventionally, it has generally been the case that, when producing such a metal composite, a metal material is first molded into a predetermined shape, and then reinforcement fibers impregnated with a thermosetting resin are placed in contact with the metal material, followed by curing of the thermosetting resin to form a fiber-reinforced resin material that integrates with the metal material. In patent document 4, for instance, a composite structural material comprising a metal and fiber-reinforced resin is produced by injecting reinforcement fibers and thermosetting resin into a molded metal pipe and curing the thermosetting resin.

Similarly, it has also generally been the case that, when producing a metal composite in which two or more metal materials are bonded by means of a thermosetting resin, the metal materials are first molded into their respective predetermined shapes and then the thermosetting resin is placed between the metal materials, followed by the curing of the thermosetting resin to bond those metal materials.

However, such a manufacturing method is problematic in that it separately requires a metal material molding step and a molding step for whatever other structural material to be composted with the metal material, resulting in a low composite production efficiency. Furthermore, since a thermosetting resin is introduced after a metal material has been molded into a complex shape, it is difficult to guarantee that the required bonding strength is provided in the manufacturing process, and, for this reason, there is a risk that, if, for instance, a thermosetting resin is not adequately placed, even if only in parts, problems such as the flaking of the metal composites arise during use.

Also conventionally, it has generally been the case that, with metal composites for electronic equipment chassis, a resin that serves as a binder layer between the metal material and the fiber-reinforced resin is placed to integrate them. Patent document 1, for instance, discloses a configuration that incorporates an intermediate resin layer containing thermoplastic resin particles to improve the bonding strength between the metal material and the fiber-reinforced resin. Even with regard to the shaping of a metal composite, it has generally been the case that, when a complex shape is required, the metal material is processed to the desired shape in advance through press molding or punch molding before it is integrated with the fiber-reinforced resin (patent documents 6 and 7).

Furthermore, since such electronic equipment chassis require a resin layer aimed at providing bonding, there is deficiency in the amenability to thin-wall design and degree of design freedom, and this has given rise to the problem of undermining the ongoing efforts to reduce the weight of electronic equipment. There is another problem in that, since separate processing steps are required for the metal material and fiber-reinforced resin, the production cost of chassis is high due to a need for a large amount of production equipment needed.

PATENT DOCUMENTS

Patent document 1: JP 2006-297929 A
Patent document 2: JP 2010-131789 A
Patent document 3: JP 2005-161852 A
Patent document 4: JP 2006-123209 A
Patent document 5: JP 2009-045129 A
Patent document 6: JP 2001-298277 A
Patent document 7: JP 2001-315162 A
Patent document 8: JP 03-177418 A
Patent document 9: JP 03-296525 A
Patent document 10: JP 64-070523 A

SUMMARY OF THE INVENTION

The task of the present invention is to provide manufacturing methods for metal composites which integrate metal materials together or metal materials and other structural materials via a cured resin layer or layers, which easily achieve an ability to process high-rigidity metal materials with an excellent amenability to thin-walling and light-weighting and a high degree of design freedom into complex shapes and an ability for fast compositing as demanded by the market, and which are able to produce metal composites having excellent bonding strength, as well as electronic equipment chassis that use metal composites obtained through such manufacturing methods.

The first aspect of the manufacturing method for metal composites of the present invention is as described below:

A method for producing a metal composite which is molded by heating and pressurizing a preform including a sheet substrate containing a thermosetting resin and a metal material disposed in contact with the sheet substrate or laminated therewith to form the metal composite comprising the metal material and a cured resin layer formed by curing the thermosetting resin provided along the metal material, wherein the method comprises:

a step 1 for placing the preform in a mold and heating the metal material to a temperature in excess of 180° C. while heating the sheet substrate to semi-cure the thermosetting resin, and a step 2 for applying a pressure to the preform being heated in the step 1 to form a composite material; and wherein the thermosetting resin is at least one selected from the group consisting of epoxy resin, phenol resin, benzoxazine resin and unsaturated polyester resin.

The second aspect of the manufacturing method for metal composites of the present invention is as described below:

A method for producing a metal composite which is molded by heating and pressurizing a preform including a sheet substrate containing at least one thermosetting resin selected from the group consisting of epoxy resin, phenol resin, benzoxazine resin and unsaturated polyester resin, and a metal material disposed in contact with the sheet substrate or laminated therewith to form the metal composite comprising the metal material and a cured resin layer formed by curing the thermosetting resin provided along the metal material, wherein the method comprises:

a step 1 for placing the preform in a mold and heating the metal material so as to raise its surface temperature in excess of 180° C. while semi-curing the thermosetting resin, a step 2 for applying a pressure to the preform being heated in the step 1 to form the metal composite, and a step 3 for cooling down the metal composite molded in the step 2 under pressure so as to lower the surface temperature of the metal material to 180° C. or less.

In the second aspect, it is preferable that the pressure applied to the metal composite in the step 3 is equal to or larger than the pressure applied to the preform in the step 2.

In the second aspect, it is preferable that the time taken by the surface temperature of the metal material to fall from more than 180° C. to 180° C. or less is 3 minutes or less.

In the first or second aspect, it is preferable that the mold has a surface temperature of 200 to 300° C. when the preform is placed in the step 1.

The third aspect of the manufacturing method for metal composites of the present invention is as described below.

A method for producing a metal composite including a metal material and a cured resin layer provided along the metal material, wherein the method comprises:

a step 1-1 for heating a sheet substrate containing at least one thermosetting resin selected from the group consisting of epoxy resin, phenol resin, benzoxazine resin and unsaturated polyester resin, to semi-cure the thermosetting resin, a step 1-2 for preheating the metal material to its surface temperature of more than 180° C. but not more than 400° C., and a step 2 for placing in contact with each other or laminating the sheet substrate, which has undergone the step 1-1, and the metal material, which has been preheated in the step 1-2, inside a mold having a surface temperature of 180° C. or less and applying a pressure to mold them into the metal composite.

In the third aspect, it is preferable that heating in the step 1-1 and heating in the step 1-2 are performed in apparatuses different from each other.

In the third aspect, it is preferable that the step 1-1 and the step 1-2 are performed in parallel.

In the third aspect, it is preferable that the step 1-1 and the step 1-2 are completed substantially at the same time.

In the third aspect, it is preferable that a preform combined the sheet substrate and the metal material is prepared prior to molding the metal composite in the step 2.

In the first, second or third aspect, it is preferable that the thermosetting resin contained in the sheet substrate reaches a cured state when heated at 130° C. for 10 minutes.

In the first, second or third aspect, it is preferable that the thermosetting resin contains a curing accelerator.

In the first, second or third aspect, it is preferable that the preform has a sandwich structure configured by laminating the metal material onto both sides of the sheet substrate or a laminate of such substrates.

In the first, second or third aspect, it is preferable that the thermosetting resin reaches a cured state in the step 2 or the step 3.

In the first, second or third aspect, it is preferable that an edge of the preform undergoes a hemming or crimping treatment in the step 2 or the step 3.

In the first, second or third aspect, it is preferable that the sheet substrate is a prepreg obtained by impregnating a fiber base with a thermosetting resin.

In the first, second or third aspect, it is preferable that the metal material is a plate body having a thickness of 0.1 to 1 mm.

In the first, second or third aspect, it is preferable that the metal material has physically, chemically or electrically undergone surface roughening on a surface thereof that comes in contact with the sheet substrate.

In the first, second or third aspect, it is preferable that a surface of the metal material that comes in contact with the sheet substrate has multiple pores 0.01 to 100 μm in size.

In the first, second or third aspect, it is preferable that a metal constituting the metal material is at least one selected from the group consisting of an aluminum alloy, magnesium alloy and titanium alloy.

In the first, second or third aspect, it is preferable that the bonding strength between the metal material and the cured resin layer in the metal composite to be produced is 10 MPa or more.

The electronic equipment chassis of the invention are as described below:

An electronic equipment chassis obtained by integrating a metal composite A that is produced by any of the metal composite manufacturing methods of the present invention, and a part B composed of a thermoplastic resin b.

It is preferable that, in the electronic equipment chassis, part B is at least one type of shaped part selected from the group consisting of a boss, rib, hinge, frame, keyboard base, vertical wall and seat.

It is preferable that, in the electronic equipment chassis, a resin layer C composed of a thermoplastic resin c is formed on a surface of the metal composite A.

It is preferable that, in the electronic equipment chassis, the melting point or glass transition temperature of the thermoplastic resin c is lower than that of the thermoplastic resin b.

It is preferable that, in the electronic equipment chassis, the pores formed on a surface of the metal material are filled with at least one type of resin selected from the group consisting of the thermosetting resin, thermoplastic resin b and thermoplastic resin c.

It is preferable that, in the electronic equipment chassis, the metal composite A is provided with at least one type of shaping treatment selected from the group of tapering, grooving, hole-drilling and match jointing, with the part B joined to the metal composite A by fitting into that shape.

It is preferable that, in the electronic equipment chassis, the metal composite A and part B are joined by placing the metal composite A in a mold and injection-molding the part B into it.

The present invention provides manufacturing methods for metal composites which integrate metal materials together or metal materials and other structural materials via a cured resin layer or layers, which easily achieve an ability to process high-rigidity metal materials having an excellent amenability to thin-walling and lightweighting and a high degree of design freedom into complex shapes and an ability for fast compositing as demanded by the market, and which are able to produce metal composites having excellent bonding strength, as well as electronic equipment chassis that use metal composites obtained through such manufacturing methods. It also provides electronic equipment chassis incorporating an electromagnetic shielding capability and antenna characteristics as required of electronic equipment fitted with telecommunications features.

DESCRIPTION OF EMBODIMENTS OF THE INVENTION

Figure 1:
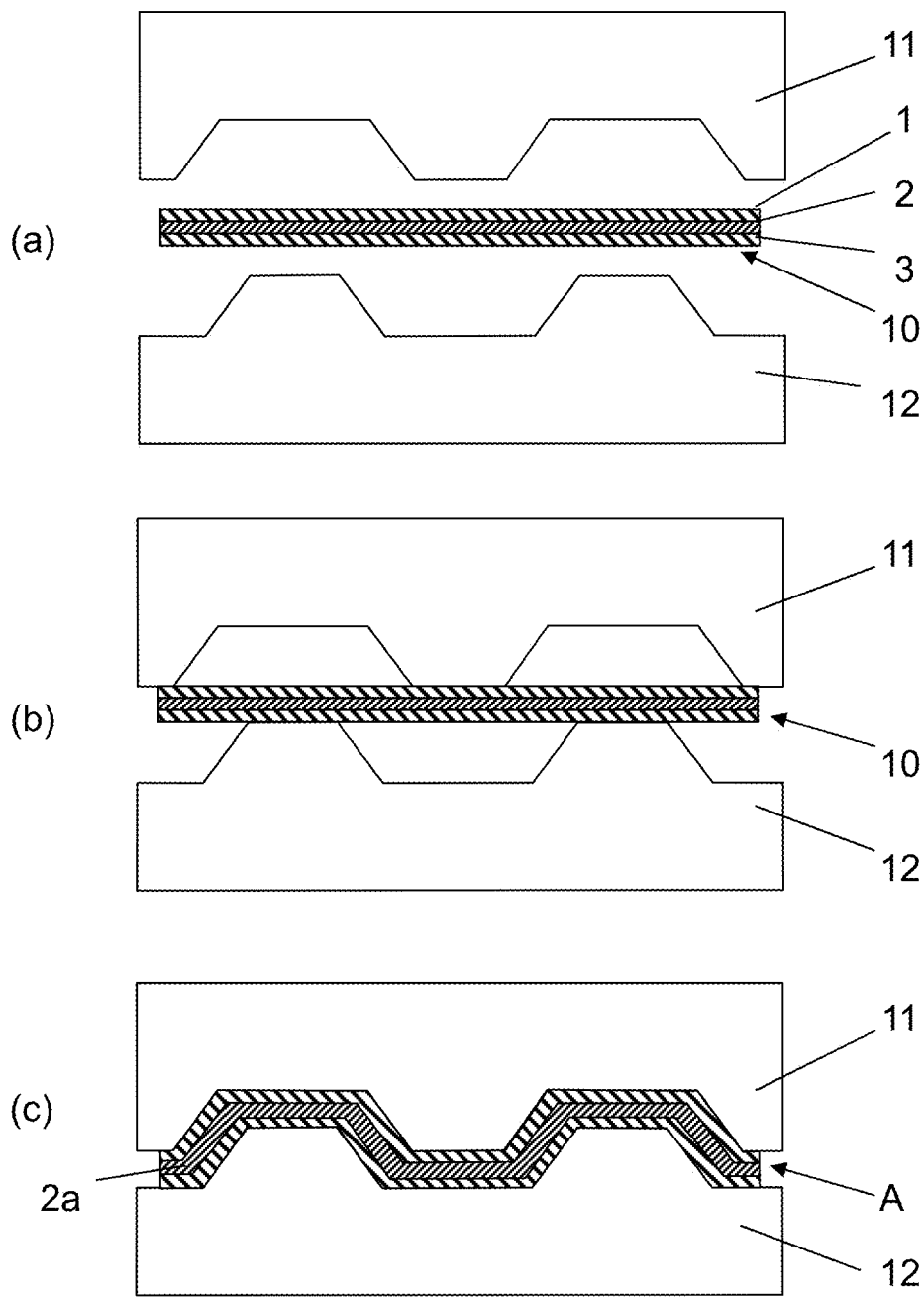
FIGS. 1 (a), 1 (b) and 1 (c) are a set of schematic sectional drawings illustrating the manufacturing procedure for an embodiment of the present invention with regard to manufacturing methods for metal composites.

Preferred embodiments of the present invention with regard to manufacturing methods for metal composites and electronic equipment chassis based thereon are described below:

In the present embodiment, a metal composite featuring a metal material and a cured resin layer formed in such as manner as to line the metal material is produced from a preform comprising a sheet substrate, containing such a thermosetting resin, and such a metal material, placed in contact with the sheet substrate or laminated with it, using a manufacturing method comprising a step 1 to a step 2 and/or a step 3 to be described later.

Sheet Substrate:

The sheet substrate contains a thermosetting resin, which starts undergoing a curing reaction in a step 1 and/or a step 1-1 to be described later. The sheet substrate is molded with a metal material in a step 2 and/or a step 3 to be described later to form a cured resin layer in the metal composite.

The sheet substrate is subject to no particular restrictions except being a material based on a thermosetting resin or a resin composition containing a thermosetting resin that has been processed to ensure its suitability for handling in sheet form. For instance, it can be a resin film obtained by coating a sheet of release paper or the like. It can also be a prepreg obtained by impregnating a fiber base with a thermosetting resin or a resin composition containing a thermosetting resin.

In this regard, there are no particular restrictions on the degree of impregnation, and acceptable states of impregnation include: complete impregnation with no voids, semi-complete impregnation, in which voids are present inside the fiber base throughout, partial impregnation, in which the fiber base contains unevenly distributed impregnated regions and unimpregnated regions, and surface deposition, in which the resin composition is deposited and fixed onto the surface layer of the base material.

Using at least one type of resin chosen from a set containing an epoxy resin, phenol resin, benzoxazine resin and unsaturated polyester resin as such a thermosetting resin makes it possible to obtain a metal composite with excellent productivity and economic efficiency. Of these, an epoxy resin is preferable for the high degree of design freedom it offers according to the bonding strength required and type of environment in which the final product is used.

Typically, such an epoxy resin is one that contains two or more epoxy groups in its molecule. Concrete examples of an epoxy resin that can be used include bisphenol A-type epoxy resin, bisphenol F-type epoxy resin, bisphenol S-type epoxy resin, novolac-type epoxy resin, naphthalene-type epoxy resin, fluorine-backbone epoxy resin, epoxy resin obtained from a phenol compound and dicyclopentadiene copolymer as ingredients, glycidyl ether-type epoxy resin composition, such as diglycidyl resorcinol, tetrakis (glycidyl oxy phenyl) ethane or tris (glycidyl oxy phenyl) methane, glycidyl amine type epoxy resin, such as tetraglycidyl diaminodiphenyl methane, triglycidyl aminophenol, triglycidyl aminocresol or tetraglycidyl xylene diamine, biphenyl-type epoxy resin, isocyanate modified epoxy resin, as well as a mixture thereof.

Any of these epoxy resins can be used singly or as a mixture. In particular, when a composite material with well-balanced heat resistance and mechanical characteristics is required, a combination of a polyfunctional epoxy resin and difunctional epoxy resin, e.g. one that combines a phenol novolac-type epoxy resin as the polyfunctional epoxy resin and a bisphenol A-type epoxy resin or bisphenol F-type epoxy resin as the difunctional epoxy resin, is preferable.

It is preferable that the thermosetting resin of the sheet substrate reaches a cured state under 130° C.×10 minutes conditions. To obtain such a sheet substrate, a curing agent may be added to the thermosetting resin-containing resin composition.

The type of curing agent may be changed as necessary according to the thermosetting resin. For instance, when an epoxy resin is used as the thermosetting resin, possible choices of a curing agent include a polyaddition polymerization type, such as an amine compound, anhydride, phenol, mercaptan or isocyanate, and one functioning as an initiator of anion polymerization or cationic polymerization, such as a tertiary amine, imidazole or Lewis acid. Of these, an amine compound is particularly preferable for the high degree of design freedom it offers according to the application.

An amine-based curing agent refers to a curing agent that contains a nitrogen atom in its molecule. Examples of a compound that can be used as such a curing agent include an aromatic polyamine compound having active hydrogen atoms, such as 4,4'-diaminodiphenyl methane, 4,4'-diaminodiphenyl sulfone, 3,3'-diaminodiphenyl sulfone, m-phenylene diamine, m-xylylene diamine or diethyl toluene diamine, an aliphatic amine having active hydrogen atoms, such as diethylene triamine, triethylenetetramine, isophorone diamine, bis(aminomethyl)norbornane, bis(4-aminocyclohexyl)methane, a dimer acid ester of polyethylene imine, a tertiary amine having no active hydrogen atoms, such as a modified amine obtained by having any of the above active hydrogen-containing amines with an epoxy compound, acrylonitrile, a compound of phenol and formaldehyde, thiourea, and the like, dimethyl aniline, dimethyl benzyl amine, 2,4,6-tris-(dimethyl aminomethyl)phenol, or monosubstituted imidazole, a polycarboxylic acid hydrazide, such as dicyandiamide, tetramethyl guanidine, adipic acid hydrazide or naphthalene dicarboxylic acid hydrazide, and a Lewis acid complex, such as boron trifluoride ethyl amine complex.

Of the above compounds, dicyandiamide and an aromatic polyamine compound are preferably used as amine-based curing agents. When dicyandiamide or an aromatic polyamine compound is used, a hardened material having a high elastic modulus and heat resistance can be obtained from a thermosetting resin. Of such compounds, dicyandiamide, 3,3'-diaminodiphenyl sulfone, and 4,4'-diaminodiphenyl sulfone are particularly preferable for such reasons as an ability to provide a resin composition with excellent heat resistance, especially moisture and heat resistance, and storage stability when mixed into an epoxy resin to become part of a one-component epoxy resin.

In any of the above resin compositions, the curing agent may be combined with a suitable curing accelerator to enhance curing activity. For instance, a urea derivative, such as 3-phenyl-1,1-dimethyl urea, 3-(3,4-dichlorophenyl)-1,1-dimethyl urea (DCMU), 3-(3-chloro-4-methyl phenyl)-1,1-dimethyl urea or 2,4-bis(3,3-dimethyl ureido) toluene, or an imidazole derivative may be advantageously used as a curing accelerator in combination with dicyandiamide. A combination between dicyandiamide and a compound having two or more urea bonds in a single molecule is particularly preferable. As a compound having two or more urea bonds in a single molecule, 1,1'-4(methyl-m-phenylene)bis(3,3-dimethylurea) or 4,4'-methylene bis(phenyl dimethylurea) is preferable, especially so when used in electrical/electronic material and similar applications as the use of such a compound greatly improves fire retardancy in thin plate use.

Another example of a curing accelerator that can be combined is a boron trifluoride ethyl amine complex.

A latent curing agent that becomes active at temperatures between 70 to 125° C. can also be used as a curing agent. Here, "becomes active at temperatures between 70 to 125° C." means that the reaction starting temperature lies in the 70 to 125° C. range. The reaction starting temperature (hereinafter referred to as "activation temperature") can be found through a differential scanning calorimetric analysis (hereinafter abbreviated as "DSC").

In concrete terms, with regard to an epoxy resin composition in which 10 parts by weight of the curing agent to be evaluated is added to 100 parts by weight of a bisphenol A-type epoxy resin with an epoxy equivalent of around 184 to 194, the activation temperature is found from the intersection between the tangent line at the inflection point of the heat generation curve obtained in DSC and the baseline. If the activation temperature is less than 70° C., storage stability is sometimes inadequate, whereas, if it exceeds 125° C., curing performance sometimes falls short of expectations.

In the case of latent curing agents that become active at temperatures between 70 to 125° C., no particular restrictions apply as long as they have such an activation temperature. Examples include an amine adduct-type latent curing agent, micro capsule-type latent curing agent, amine imide, block isocyanate, compound with an oxazolidinone ring obtained by having an epoxy group react with a carbamic acid ester, vinyl ether block carboxylic acid, salt of imidazole and carboxylic acid, carbamic salt of amine, and onium salt.

Here, an amine adduct-type latent curing agent refers to a compound having a primary, secondary or tertiary amino group or high-molecular weight compound insoluble at storage temperatures that is obtained by having active components in imidazole or a similar compound react with any compound capable of reacting with it. Commercially available amine adduct-type latent curing agents include "Amicure" (registered trademark) PN-23 and MY-24 (both manufactured by Ajinomoto Fine-Techno Co., Inc.), "Adeka Hardener" (registered trademark) EH-3293S, EH-3615S and EH-4070S (all manufactured by Asahi Dennka Kogyo K.K.), and "Fujicure" (registered trademark) FXE1000 and FXR-1020 (both manufactured by Fuji Kasei Kogyo Co., Ltd.), while commercially available micro capsule-type latent curing agents include "Novacure" (registered trademark) HX-3721 and HX-3722 (both manufactured by Asahi Chemical Industry Co., Ltd.). Of these, the "Amicure" PN-23 and other amine adduct-type latent curing agents are particularly advantageously used as they exhibit excellent storage stability at room temperature and outstanding quick curing performance.

Micro capsule-type latent curing agents are designed to reduce contact between the epoxy resin and curing agent by, for instance, covering the curing agent, as the core, with a polymer, such as an epoxy resin, polyurethane resin, polystyrene derivative or polyimide, cyclodextrin or the like, as the shell.

Combining a latent curing agent that becomes active at a temperature between 70 to 125° C. with a specific curing agent makes rapid curing at low temperatures possible. For instance, a family of curing agents that combine a latent curing agent, such as the "Amicure" PN-23, and an organic acid dihydrazid, and another that combines a latent curing agent and a curing accelerator, such as DCMU, are advantageously used as they take only around 10 minutes to become active at a temperature of 110° C.

It is also possible to use a master batch-type curing agent based on a curing agent compound obtained by having an amine compound, epoxy resin and urea undergo a thermal reaction as described in patent document 8, a curing compound obtained by having N,N-dialkyl aminoalkyl amine, nitrogen atom-containing cyclic amine having active hydrogen atoms and isocyanate, as well as an epoxide, undergo a thermal reaction as described in patent document 9, or a specific amine compound as described in patent document 10 as the core and on a reaction product between the core and an epoxy resin as the shell, each singly or in combination of two or more.

Compounds other than those mentioned above may also be blended into the resin composition, with examples including a thermoplastic resin aimed at controlling viscoelasticity or adding ductility. To improve fire retardant, it is also possible to blend a halogenated compound, phosphorous compound, nitrogen-based compound, metal oxide, metal hydroxide, or the like.

If the sheet substrate is a prepreg, the fiber base can have one of a range of fiber structures, such as the following: long fiber (drawn in one direction), single tow, woven fabric, knit fabric, nonwoven fabric, mat, and braid.

A unidirectional prepreg is advantageously used as its fibers are aligned in a single direction, resulting in little fiber bending and a high fiber-direction strength utilization rate. The use of two or more unidirectional prepregs as a laminate with a suitable layer configuration as a fiber base is also advantageous as it allows the elastic modulus and strength in each direction to be freely controlled. A woven fabric prepreg is also advantageous as it provides a composite material with low anisotropy in strength and elastic modulus. It is possible to prepare a fiber base using two or more different types of prepregs, e.g., a unidirectional prepreg and woven fabric prepreg.

Although there are no particular restrictions on the type of fiber used in the fiber base, so-called reinforcement fibers are preferable, and carbon fiber, which is excellent in specific modulus and specific strength, is particularly preferable in applications where materials are subject to tough requirements for light weight and high strength.

Apart from carbon fiber, glass fiber, aramid fiber, boron fiber, PBO fiber, high-strength polyethylene fiber, alumina fiber and silicon carbide fiber can, for instance, be used as reinforcement fibers, and it is possible to use two or more of these fibers as a mixture.

A thermosetting resin or a resin composition containing a thermosetting resin may penetrate into the interior of the fiber base, while, in the case of a sheet prepreg, it can be localized near the surface.

A prepreg may be prepared using the wet method, in which a thermosetting resin or a resin composition containing a thermosetting resin is dissolved into a solvent, such as methyl ethyl ketone or methanol, to reduce its viscosity and made to impregnate reinforcement fibers, the hot-melt method (dry method), in which a thermosetting resin or a resin composition containing a thermosetting resin is heated to reduce its viscosity and have it impregnate reinforcement fibers, or some other method.

In the wet method, reinforcement fibers are first immersed in a solution of a thermosetting resin or a resin composition containing a thermosetting resin and retrieved, and then the solvent is removed through evaporation using an oven, etc. to obtain a prepreg.

The hot-melt method may be implemented by impregnating reinforcement fibers directly with a thermosetting resin or a resin composition containing a thermosetting resin, made fluid by heating in advance, or by first coating a piece or pieces of release paper or the like with a thermosetting resin or a resin composition containing a thermosetting resin for use as resin film and then placing a film over one or both side(s) of the fiber base, followed by the application of heat and pressure to impregnate the reinforcement fibers with resin. The hot-melt method is preferable as the prepreg has virtually no residual solvent in it.

When a prepreg is produced using the hot-melt method, it is preferable that the temperature of the thermosetting resin in the resin film coating step be 30 to 80° C., more preferably 40 to 70° C. If the temperature is less than 30° C., the coating density (weight per unit surface area) of the resin film may become inconsistent due to too high a viscosity, while, if the temperature exceeds 80° C., curing may progress during coating, resulting in a sharp rise in viscosity.

Metal Material:

The metal material is heated to a temperature in excess of 180° C. in a step 1 and/or a step 1-1 to be described later and molded in a step 2 to be described later to form the metal material part of a metal composite.

Generally speaking, it is difficult to mold a metal material into a complex shape during hot metal processing at a temperature of 180° C. or less due to low metal moldability. However, the manufacturing method of the present embodiment makes it possible to easily mold a metal material into a complex shape as it is capable of sufficiently softening the metal material by heating it to a temperature in excess of 180° C.

It is preferable that the metal material comprise at least one type of metal chosen from a set containing an aluminum alloy, magnesium alloy and titanium alloy.

The metal may be selected according to the desired application and physical properties. Examples of an aluminum alloy include A2017 and A2024 based on the Al—Cu combination, A3003 and A3004 based on the Al—Mn combination, A4032 based on the Al—Si combination, A5005 and A5052 based on the Al—Mg combination, A5083, A6061 and A6063 based on the Al—Mg—Si combination, and A7075 based on the Al—Zn combination. It is also possible to use industrial pure aluminum on which all aluminum alloys are based, such as A1050, A1100 or A1200.

Examples of a magnesium alloy include AZ31, AZ61 and AZ91 based on the Mg—Al—Zn combination. Although a plate-shaped pure magnesium is scarce, it may still be used as a metal material of the present invention.

Examples of a titanium alloy include Grades 11 to 23, which comprise palladium-added alloys and cobalt and palladium-added alloys, and Ti-6Al-4V, which encompasses Grade 50 ($\alpha$ alloy), Grade 60 ($\alpha$-$\beta$ alloy) and Grade 80 ($\beta$ alloy). It is also possible to use industrial titanium aluminum on which all titanium alloys are based, such as TP270H, which encompasses Grades 1 to 4.

Such metal materials are preferable to achieve thin-walledness, lightweightness and high rigidity in the manufacturing method of the present embodiment as they can be molded into a complex shape with particular ease, while being highly rigid.

There are no particular restrictions on the shape of the metal material. It can be unmolded as raw material for molding, molded into a desired shape, or preformed closed to a desired shape.

From the viewpoint of economic efficiency, an unmolded state as raw material for molding is preferable, and the use of a plate body having a thickness of, for instance, 0.1 to 1 mm is more preferable, with 0.3 to 0.8 mm most preferable. The use of such metal materials makes complex shaping particularly easy.

The metal material may have physically, chemically or electrically undergone surface roughening, and it is preferable the metal material have been provided with surface roughening on the surface that comes in contact with the sheet substrate from the viewpoint of obtaining a metal composite with excellent bonding between the metal material and the cured resin layer.

As the method of such surface roughening, any generally known method may be used. Examples of physical surface roughening include sand blasting and sand-papering. Chemical surface roughening methods include the immersion of the desired surface of the metal material in a polishing solution capable of eroding the material. Electrical surface roughening methods include electrochemical surface roughening through the immersion of the desired surface of the metal material in an electrolytic solution. Those surface roughening methods may be used singularly or in combination of two or more.

It is preferable that multiple pores 0.01 to 100 μm in size, more preferably 0.1 to 10 μm in size, have formed on the surface of the metal material that comes in contact with the sheet substrate. Such a metal material makes it possible to produce a metal composite that exhibits even more outstanding bonding performance between the metal material and the cured resin layer.

Preform:

The preform features a sheet substrate as described above and a metal material placed in contact with the sheet substrate or laminated with the sheet substrate. The preform is heated in a step 1 to be described later and compression-molded in a step 2 to be described later to become a metal composite.

The preform can take a variety of structures according to the metal composite to be obtained. They include a two-layer structure obtained by laminating a sheet substrate and metal material together, a sandwich structure obtained by laminating a metal material onto both sides of the sheet substrate, and a side-by-side structure obtained by pressing the metal material against a side face of the sheet substrate.

Furthermore, other preform structures can be derived from the above, including, for instance, an alternate lamination structure of sheet substrates and metal materials, a complex lamination structure obtained by laminating a metal material onto a laminate of sheet substrates, and a sandwich structure obtained by further incorporating a generally known general-purpose core material into either of these structures. Such lamination structures are preferable from the viewpoint that a symmetric layer configuration can minimize the warping or twisting of the metal composite obtained.

Of the above preform structures, a sandwich structure obtained by laminating a metal material onto both sides of the sheet substrate and another sandwich structure obtained by laminating a metal material onto both sides of a laminate of sheet substrates are preferable. Preforms with such structures make it possible to produce molded metal composites with a sandwich structure based on the lining with a metal material of both sides of a cured resin layer.

Namely, implementing the manufacturing method of the present embodiment using such a preform makes it possible to produce metal composite with excellent dimensional precision and do so easily in a short time, compared to other methods, such as one in which two metal materials are separately molded and bonded together using a thermosetting resin.

Although there are no particular restrictions on the thickness of the above preform, 0.5 to 5 mm is preferable, or more preferably 1 to 3 mm, from the viewpoint of molding a metal composite with a complex shape.

Manufacturing Method for Metal Composites:

Various steps involved in the manufacturing method for metal composites of the present embodiment are described below in detail.

First Aspect:

In a step 1, the metal materials that form part of a preform placed in a mold are heated to a temperature in excess of 180° C., and this also simultaneously heats the sheet substrate to semi-cure the thermosetting resin.

Here, to "semi-cure" means bringing a thermosetting resin into a semi-cured state, a state that is halfway between the uncured state and cured state. A semi-cured state is associated with a degree of fluidity. In concrete terms, for instance, if a viscosity curve is plotted against time while a thermosetting resin is heated, "semi-cured" can be defined as the state of a thermosetting resin in which it exhibits 10 to 90% of saturation viscosity as measured by expressing the difference between saturation viscosity and minimum viscosity in percentage terms. The cured state is a state in which a thermosetting resin does not flow or deform, and is defined as the state of a thermosetting resin when it exhibits a viscosity in excess of 90% of saturation viscosity according to the above measurement.

There are also ways to ascertain the cured state from the glass transition temperature of the thermosetting resin (hereinafter abbreviated as "Tg"). For instance, "semi-cured" is defined as the state of a thermosetting resin in which its Tg is 10 to 90% of the saturated Tg when the difference between the saturated Tg and the minimum Tg is expressed in percentage terms on the basis of measurements of Tg obtained over the range from the saturated Tg to the minimum Tg in advance. The cured state is defined as a state in which Tg is in excess of 90% of the saturated Tg. In addition, if the relationship between the heating temperature and heating duration is plotted while a thermosetting resin is heated, approximate values of Tg can be obtained from molding conditions through interpolation. By the way, Tg can be measured as part of DSC using a generally known method.

Furthermore, there are ways to ascertain the cured state of a thermosetting resin from the calorific value measured as part of DSC. For instance, "semi-cured" is defined as a state in which the residual reaction rate is 10 to 90%, where an approximate value of the residual reaction rate can be found from the calorific value after heating of the thermosetting resin as a percentage of the calorific value before heating of the thermosetting resin measured in advance. The state in which the calorific value is less than 10% is the cured state.

For the purpose of the present invention, a thermosetting resin can be deemed to be in a semi-cured state if a semi-cured state is confirmed with any of the measurement methods described above.

By undergoing the step 1 and/or the step 1-1, a thermosetting resin reaches a semi-cured state, and is then molded in the step 2 along with the metal materials without becoming excessively fluid. Instead, it reaches a cured state after assuming a shape dictated by the metal materials.

There are no particular restrictions on the heating of the metal materials. For instance, it can be carried out by bringing the metal materials into contact with a mold that has been heated to a certain temperature. In this regard, it may be preheated with a heater, oven, torch, or the like to shorten the heating duration.

In the step 2, the preform, which has been heated in the step 1, is molded into the desired shape by compression.

Second Aspect:

In the step 1, the metal materials that form part of a preform placed in a mold are heated to a surface temperature in excess of 180° C., while the sheet substrate is heated at the same time to get curing underway and eventually semi-cure the thermosetting resin. This aspect also features a step 3, which provides cooling under pressure until the surface temperature of the metal materials falls to 180° C. or less.

In the step 3, the metal composite, which has been molded in the step 2, is cooled down until the surface temperature of the metal material falls to 180° C. or less under pressure (pressure P3). The duration over which the metal composite is held at temperatures of 180° C. or less in the step 3 is preferably up to 10 minutes, more preferably up to 5 minutes, and most preferably up to 3 minutes.

From the viewpoint of keeping the warping and deformation associated with cooling under control, it is preferable that pressure P3, applied during cooling, be larger than or equal to, more preferably exceeds, pressure P2, applied in the step 2. In concrete terms, it is preferable that pressure P3 be set above pressure P2 by 0 to 10 MPa, more preferably by 3 to 5 MPa. Although there are no particular restrictions on the upper limit, around 30 MPa is considered optimum in consideration of the risk of overloading the mold.

In the step 1, it is preferable that the surface temperature of the metal material be kept at 200 to 300° C. Such a manufacturing method makes the molding of the metal materials into a complex shape in the step 2 that follows easier by softening it. The metal material only needs to be heated at least partially to the above temperature.

There are no particular restrictions on the way to heat the metal materials. For instance, the metal materials may be heated by bringing them into contact with a mold heated to a surface temperature in excess of 180°, preferably at 200 to 300° C., more preferably at 200 to 250° C. Here, the surface temperature of the mold means the temperature of the cavity in which the metal composite is molded. There are no particular restrictions on the way to raise the surface temperature of the mold. Examples include mounting the mold on a hot press, embedding a heater into the mold, and direct heating from outside using an electromagnetic induction heater or halogen heater. In this regard, the mold may be preheated with a heater, oven, torch, or the like to shorten the heating duration.

In the step 1, pressure may be applied to the preform as necessary. Examples include pressurization to hold the preform from above and below and preliminary compression to mold the preform into the desired shape. It is preferable that the pressure applied to the preform in such manner be 0 to 3 MPa, more preferably 0.2 to 2 MPa.

Here, the sheet substrate is also heated, but it never reaches the same temperature as the metal materials due to the fact that it is low in thermal conductivity compared to the metal materials, only heated through the metal material, located far from the heat source, high in specific heat, and so on. Namely, to heat the whole sheet substrate to the above temperature, additional heating is necessary, and this make it possible to control the curing reaction of the thermosetting resin. This is considered to be one of the reasons why the present invention has an advantageous effect.

Under the present invention, the metal materials are heated to a temperature in excess of 180° C., preferably 200 to 250° C., in the step 2.

Third Aspect:

The third aspect features a step 1-1 designed to heat the sheet substrate to semi-cure the thermosetting resin, a step 1-2 designed to preheat the metal materials to a surface temperature of more than 180° C. but not more than 400° C., and a step 2 designed to mold the sheet substrate, whose thermosetting resin has been semi-cured, and the metal materials, which have been preheated, into a metal composite by compression.

In the step 1-1, the sheet substrate is heated to semi-cure its thermosetting resin. The temperature to which the sheet substrate is heated in the step 1-1 is preferably 100 to 180° C. There are no particular restrictions on the method of heating, and a heater or oven whose ambient temperature setting is set to the above temperature or a torch, for instance, may be used. Alternatively, the sheet substrate may be heated through contact with the mold used in the step 2.

In the step 1-2 of the manufacturing method of the present invention, the metal materials are preheated to a surface temperature of more than 180° C. but not more than 400° C., preferably 200 to 300° C., more preferably 200 to 250° C.

There are no particular restrictions on the method to preheat the metal materials in the step 1-2 and a range of methods are available. Examples include, the use of the same techniques as the step 1-1, insertion into a hot press, and direct heating from outside using an electromagnetic induction heater or halogen heater.

There are no particular restrictions on how to carry out heating in the step 1-1 and the step 1-2, but it is preferable to use different pieces of equipment from the viewpoint of selecting an optimum heating method for each type of material, although this does not exclude the use of the same equipment.

From the viewpoint of further improving productivity, it is preferable that the step 1-1 and the step 1-2 be carried out in parallel, and it is also preferable that the step 1-1 and the step 1-2 be completed virtually at the same time. This makes it possible to minimize time loss in production.

In the step 2, a laminate comprising a sheet substrate or substrates and metal material is molded into the desired shape by compression inside a mold having a surface temperature of 180° C. or less. Although there are no particular restrictions on the surface temperature of the mold in the step 2, it is preferably 100° C. or more, more preferably 130° C. or more. If the surface temperature of the mold is too low, the surface temperature of the preform and/or metal materials do not rise sufficiently when coming into contact with the mold, making it difficult to mold the preform into the desired shape. If, on the other hand, it is too high, energy consumption becomes excessive, thus pushing up the cost.

It is preferable that the metal materials having been heated in the step 1-2 be forwarded to the step 2 while its surface temperature is above 180° C., more preferably from 200 to 300° C. Before being molded into a metal composite, the preform that comprises and integrates a sheet substrate or substrates and metal material may be formed, for instance, in a manner shown below. Although the step 2 may be carried out in a different mold from the step 1-1, it is preferable that these take place in the same mold.

It is preferable that, in the step 2, the preform be molded by applying a pressure of, for instance, 3 to 30 MPa, more preferably 5 to 25 MPa. Such compression molding makes molding easy, even if a complicated shape is involved. It is also preferable that the pressure be maintained until the preform is molded into the desired shape, although it may be reduced after that.

It is preferable that, in the step 2 and/or the step 3, the thermosetting resin be cured until it reaches the cured state. For instance, the thermosetting resin may be cured by holding the preform inside the mold even after the preform has been molded into the desired shape. In this regard, there are no particular restrictions on the holding duration, but the shorter it is the better from the viewpoint of productivity, for instance, preferably up to 10 minutes, more preferably up to 3 minutes, and most preferably up to 1 minute.

It is preferable that, from the viewpoint of curing reaction, the holding temperature be 180° C. or less, more preferably 160° C. or less, in terms of the temperature of the sheet substrate. The advantageous effect may be obtained by allowing the curing reaction to progress sufficiently in the step 1 and thereby shortening the holding duration.

The manufacturing method of the present embodiment may also incorporate a step 4 designed to provide a post cure after demolding. The benefits of incorporating the step 4 include, for instance, a shortening of the duration of holding the preform inside the mold. The post curing method can be any method capable of curing a thermosetting resin, so that generally known methods, such as holding a demolded metal composite inside a drier or oven heated to a predetermined temperature, may be used.

Furthermore, an edge of the preform may be provided with a hemming or crimping treatment in the step 2 in the first, second or third aspect or the step 3 in the second aspect. Such a treatment not only enhances the appearance of the edges of the metal composite but also makes the bond between the metal materials and the cured resin layer stronger. This treatment may be provided after the step 2 as an additional step.

FIG. 1 is a set of schematic sectional drawings illustrating an embodiment of the first aspect of a manufacturing method for metal composites. As illustrated in FIG. 1 (*a*), the mold has an upper mold 11 and a lower mold 12. The preform 10 has a sandwich structure in which a plate-shaped metal material 1 and metal material 3 are laminated onto either surface of the sheet substrate 2.

In the step 1, the preform 10 is sandwiched between the upper mold 11 and the lower mold 12 as illustrated in FIG. 1 (*b*). Here, both the upper mold 11 and the lower mold 12 have been heated to a temperature in excess of 180° C., and the metal material 1 and metal material 3 are heated to a temperature in excess of 180° C. through the upper mold 11 and lower mold 12, with which they are respectively in contact. The sheet substrate 2, meanwhile, is heated through the metal material 1 and metal material 3, and this sets off the curing reaction of the thermosetting resin contained in the sheet substrate 2 and takes the thermosetting resin to a semi-cured state.

Next, the step 2 is carried out using an identical set of the upper mold 11 and the lower mold 12. In the step 2, as illustrated in FIG. 1 (*c*), the preform 10 is compressed by the upper mold 11 and lower mold 12 and goes on to be molded by deforming to the shape of the mold.

Figure 2:
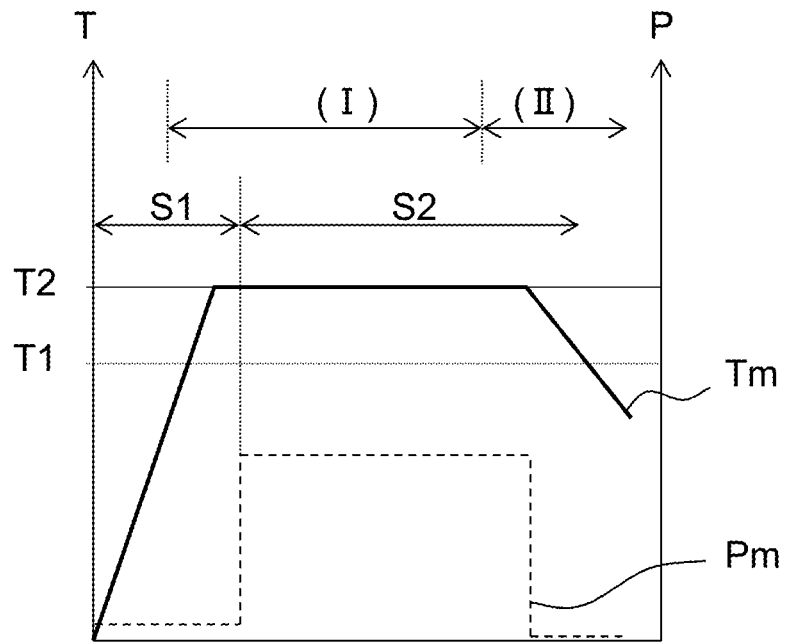
FIG. 2 is a graph illustrating an example of the relationship between temperature, duration and pressure under a manufacturing method for metal composites of the present invention.

FIG. 2 is a graph illustrating an example of the relationship between temperature (left-side longitudinal axis), duration (horizontal axis) and pressure (right-side longitudinal axis) under the first aspect of a manufacturing method for metal composites. In FIG. 2, the mold temperature T2 indicates the surface temperature of the upper mold 11 and the lower mold 12. In the step 1 (S1), the surface temperature Tm of the metal materials 1, 3 rise beyond 180° C. as the metal materials 1, 3 are heated as a result of being in contact with a mold that has been heated to a temperature in excess of 180° C. (T1), T2. This sets off the curing reaction of the thermosetting resin contained in the sheet substrate 2 and takes the thermosetting resin to a semi-cured state (II).

Next, the preform 10 is molded by compression at a predetermined pressure in the step 2 (S2). By this time, the metal materials 1, 3 have been heated to a comparable temperature to the temperature of the mold. At the same time, the curing reaction of the thermosetting resin progresses, preferably right to the cured state (II). Notably, since the thermosetting resin is in a semi-cured state, it does not flow excessively when compressed, and this allows a cured resin layer 2a to form right between the metal materials 1, 3.

When the step 2 (S2) is completed, the metal composite is demolded by releasing the lock on the upper mold 11 and the lower mold 12.

Figure 3:
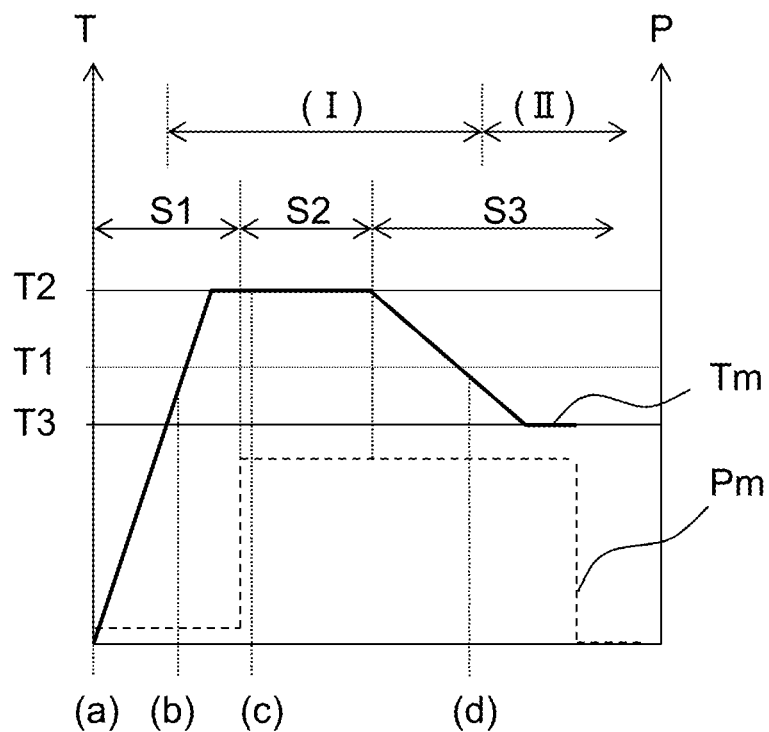
FIG. 3 is a graph illustrating another example of the relationship between temperature, duration and pressure under a manufacturing method for metal composites of the present invention.

FIG. 3 is a graph illustrating an example of the relationship between temperature (left-side longitudinal axis), duration (horizontal axis) and pressure (right-side longitudinal axis) under the second aspect of a manufacturing method for metal composites. In FIG. 3, the mold temperatures T2 and T3 are the surface temperatures of the upper mold 11 and the lower mold 12, respectively. In the step 1 (S1), the surface temperature Tm of the metal materials 1, 3 rises to a comparable level to the temperature of the mold as a result of being in contact with the mold, which has been heated to a temperature in excess of 180° C. (T1), T2. This sets off the curing reaction of the thermosetting resin contained in the sheet substrate 2 and takes the thermosetting resin to a semi-cured state.

Next, the preform 10 is molded by compression at a predetermined pressure in the step 2 (S2). During this process, since the thermosetting resin is in a semi-cured state (I), it does not flow excessively when compressed, and this allows a cured resin layer 2a to form right between the metal materials 1, 3.

Continuing from the step 2 (S2), the mold temperature is reduced to a temperature of 180° C. or less (T3) while keeping the pressure up. In the step 3 (S3), the thermosetting resin reaches the cured state (II) as the metal materials 1, 3 are kept at a surface temperature of T3 for a certain period. It is preferable that the duration between the time the surface temperature of the metal materials 1, 3 starts falling after reaching a point in excess of 180° C. in the step 2 (S2) and the time it falls below 180° C. is not more than 3 minutes.

When the step 3 (S3) is completed, the metal composite is demolded by releasing the lock on the upper mold 11 and the lower mold 12.

Figure 4:
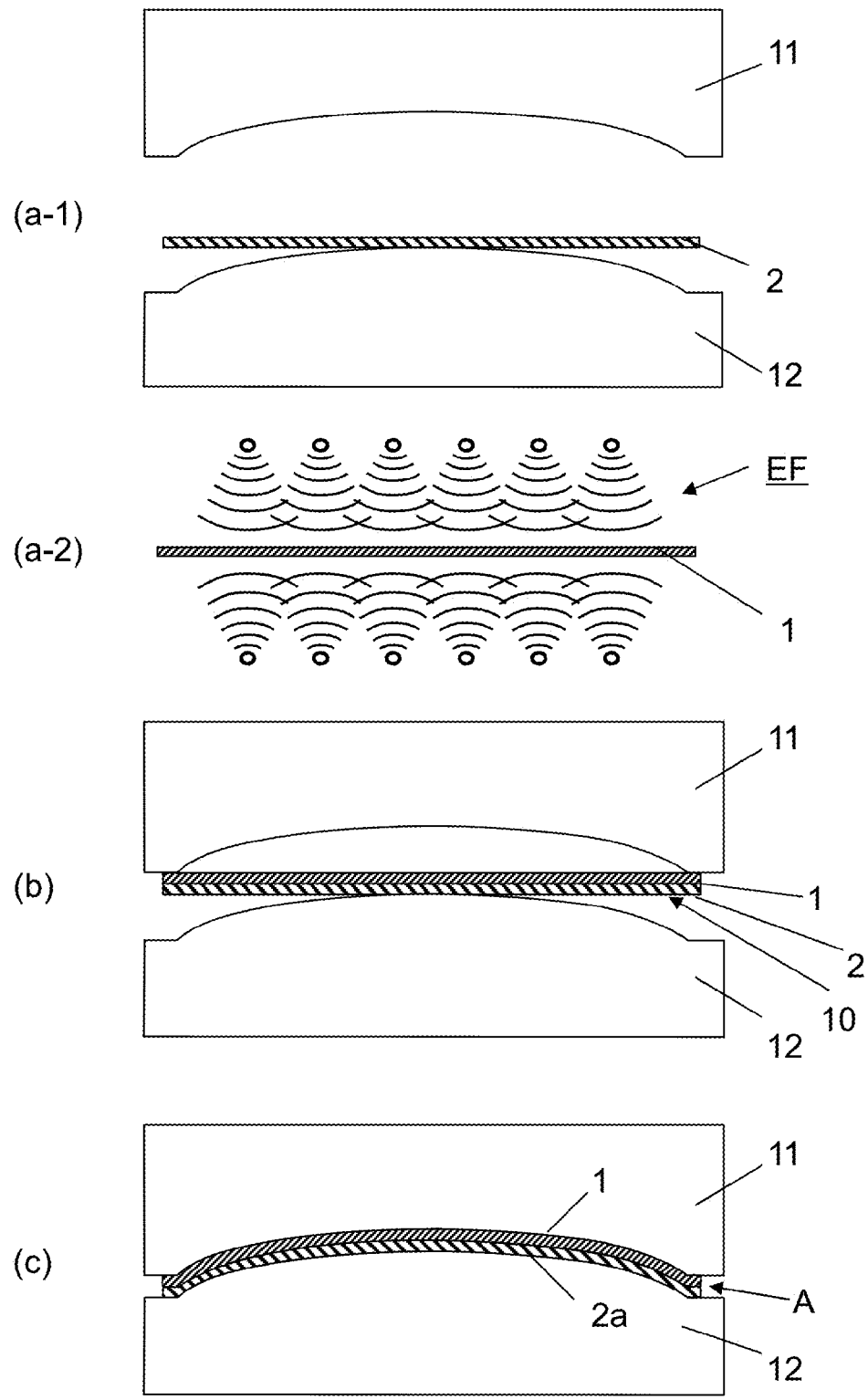
FIGS. 4 (a-1), 4 (a-2), 4 (b) and 4 (c) are a set of schematic sectional drawings illustrating the manufacturing procedure for another embodiment of the present invention with regard to manufacturing methods for metal composites.

FIG. 4 is a set of schematic sectional drawings illustrating another embodiment of the present invention with regard to manufacturing methods for metal composites. In the step 1-1, a sheet substrate 2 is heated through contact with the lower mold 12 as illustrated in FIG. 4 (*a*-1). In the step 1-2, which preferably takes place in parallel with the step 1-1, a plate-shaped metal material 1 is preheated inside an electric furnace EF as illustrated in FIG. 4 (*a*-2).

In the step 2, the preheated metal material 1 is laminated onto the sheet substrate 2, and the laminate is held between the upper mold 11 and the lower mold 12 to form a preform 10 as illustrated in FIG. 4 (b). Next, the preform 10 is compressed by the upper mold 11 and the lower mold 12 as illustrated in FIG. 4 (c) and molded into a metal composite, featuring a cured resin layer 2a that has formed from the sheet substrate 2a by conforming to the shape of the mold.

Figure 5:
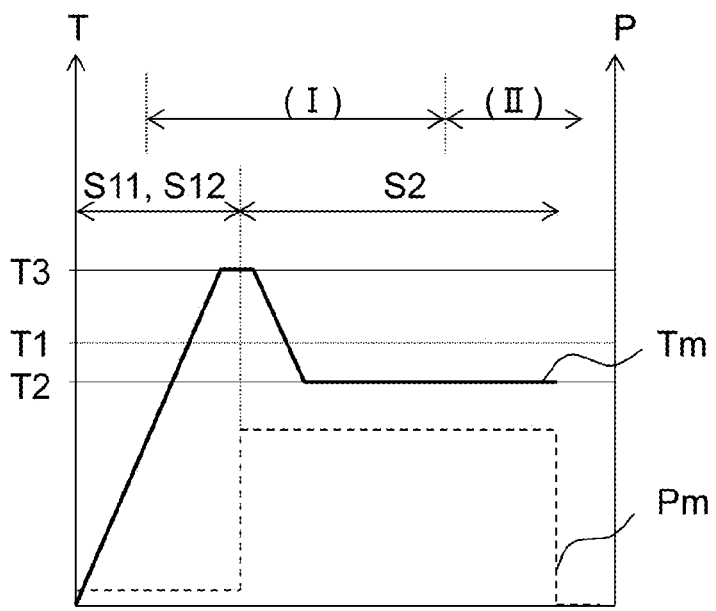
FIG. 5 is a graph illustrating another example of the relationship between temperature, duration and pressure under a manufacturing method for metal composites of the present invention.

FIG. 5 is a graph illustrating another example of the relationship between temperature (left-side longitudinal axis), duration (horizontal axis) and pressure (right-side longitudinal axis) under a manufacturing method for metal composites. In FIG. 5, the mold temperature T2 is the surface temperature of the upper mold 11 and the lower mold 12. In the step 1-2 (S12), the metal material 1 is preheated to a surface temperature in excess of 180° C. inside an electric furnace EF. At the same time, the sheet substrate 2 is heated in the step 1-1 (S11), held between the upper mold 11 and the lower mold 12 to semi-cure its thermosetting resin.

Next, in the step 2, the sheet substrate 2 and metal material 1 are molded by compression at a predetermined pressure inside a mold set to a surface temperature of 180° C. or less. Notably, since the thermosetting resin is in a semi-cured state, it does not flow excessively when compressed, and this allows a cured resin layer 2a to form right along the metal material 1. Over this process, the surface temperature of the metal material 1 falls to 180° C. or less. This state is maintained for a certain period and the thermosetting resin reaches the cured state.

When the step 2 is completed, the metal composite is demolded by releasing the lock on the upper mold 11 and the lower mold 12.

Such a manufacturing method makes it possible to shorten the length of time over which the mold is taken up for the molding of a metal composite by allocating the preheating mechanism and molding mechanism to different pieces of equipment. For this reason, it constitutes a high productivity manufacturing method when applied to continuous molding based on a production line, etc.

Since the manufacturing method of the present embodiment semi-cures the thermosetting resin in the step 1 and/or the step 1-1, it can prevent excessive material flow, such as the resin flowing out of the mold during a hot processing of metal in the step 2, thanks to the pressure applied as part of the process, while developing a strongly bonded structure comprising a metal material 1 and cured resin layer 2a.

Generally speaking, it is difficult to mold a metal material into a complex shape during hot metal processing at a temperature of 180° C. or less due to low metal moldability. However, the manufacturing method of the present embodiment makes it possible to easily mold a metal material into a complex shape as it is capable of sufficiently softening the metal material by heating it to a temperature in excess of 180° C.

Figure 6:
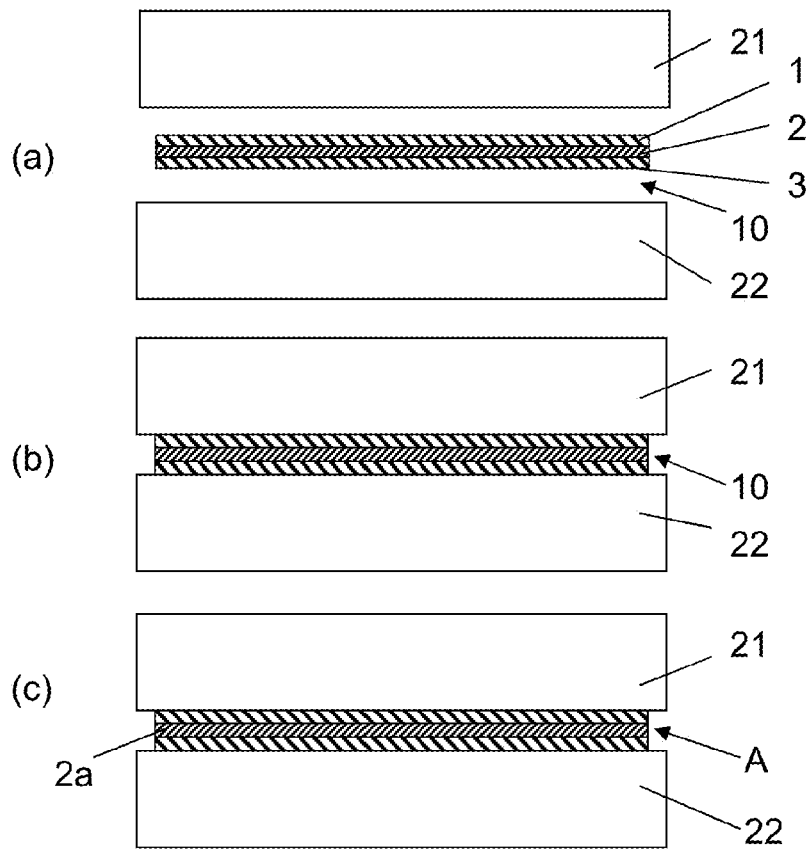
FIGS. 6 (a), 6 (b) and 6 (c) are a set of schematic sectional drawings illustrating the manufacturing procedure for another embodiment of the present invention with regard to manufacturing methods for metal composites.

FIG. 6 is a schematic sectional drawing of an embodiment of the present invention with regard to manufacturing methods for metal composites. As illustrated in FIG. 6 the step 2, "molding" does not necessarily involve a deformation of a metal material, and can include the bonding of a plate-shaped metal material 1 and plate-shaped metal material 3 via a sheet substrate 2 by compression, while allowing them to maintain their plate shapes throughout the process.

Metal Composite:

The metal composite produced using the manufacturing method of the present embodiment is based on metal materials and a cured resin layer sandwiched between the metal materials. Here, the cured resin layer is a layer created by curing the thermosetting resin contained in the sheet substrate through heating.

An example of the manufacturing method of the present embodiment makes it possible to form a strong bonding structure between the metal materials and the cured resin layer, and this is partially attributable to the presence of fine or coarse irregularities on the surface of the metal materials designed to be filled by the thermosetting resin and thus generate an extra grip upon curing of the resin and to an enhanced chemical bond between the thermosetting resin and the metal materials because of a curing reaction taking place at a relatively high temperature.

It is preferable that the bonding strength between the metal materials and the cured resin layer be 10 MPa or more, more preferably 20 MPa or more. These figures indicate that a metal composite that integrates metal materials together or metal materials and other structural parts via a cured resin layer or layers has adequate bonding strength according to the use environments or application.

If bonding strength is 10 MPa or more, there is adequate bonding strength in applications where a general adhesive would be used as an alternative means to provide bonding, and the metal composite has better durability than one that employs an adhesive. If bonding strength is 20 MPa or more, there is adequate bonding strength in applications involving a severe use environment, and the metal composite has better durability than one that employs a structural adhesive.

Bonding strength may be measured using generally known methods, such as the JIS K 6849 adhesive tensile bonding strength test. However, if the metal composite has a complex shape, it is sometimes difficult to conduct a bonding strength test based on reputable standards. In such cases, it is possible to obtain a rough indication of a metal composite's bonding strength relative to the bonding strength of an adhesive whose bonding strength is known by cutting a specimen out of the metal composite, bonding both ends of it to a jig and performing a bonding strength test through the jig. In concrete terms, if the jig is destroyed in the adhesive layer, the bonding strength of the metal composite is, as a general rule, judged to be higher than that of the adhesive. If, on the other hand, it is destroyed through a peeling of metal composite, the bonding strength of the metal composite is, as a general rule, judged to be lower than that of the adhesive.

It is also preferable that the composite A be provided with at least one type of shaping treatment chosen from tapering, grooving, hole-drilling and match jointing, with part B joined to the metal composite A by fitting into that shape. To obtain an electronic equipment chassis with high rigidity, it is very important that the metal composite A and the thermoplastic resin-based part B be strongly bonded, and from this viewpoint, it is preferable that the metal composite A and part B be integrated as a result of part B flowing into the taper, grooves, holes, or joint pattern.

Although there are no particular restrictions on the shape that the metal composite A assumes from a tapering, grooving, hole-drilling or match jointing treatment, it is preferable that, from the viewpoint of maintaining the rigidity of the metal composite A, the area used for such a treatments be 50% or less, more preferably 30% or less, than the entire area of the composite A. If such a treatment involves too large an area, it gives rise to the risk of reducing the rigidity of the metal composite A too much.

The application areas of metal composites include, for instance, aircraft body parts, motor vehicle body parts, motor cycle body parts, marine vessel parts, machine mechanical parts, civil engineering parts, building materials, and electronic equipment parts. In view of their productivity enhancing effect, metal composites are advantageously used in motor vehicle body parts and electrical equipment parts, and because of their excellent effects in lightweighting, mechanical characteristics, heat radiation performance, and so on, they are even more advantageously used in electronic equipment chassis.

Electronic Equipment Chassis:

An electronic equipment chassis is made of a structural part that integrates a metal composite A, obtained using a manufacturing method of the present invention, and part B constituted of a thermoplastic resin b. Part B constituted of a thermoplastic resin b may be a complex-shaped part comprising at least one type chosen from a boss, rib, hinge, frame, keyboard base, vertical wall, and seat. Since part B, which is joined to a metal composite, is constituted of a thermoplastic resin b, which is suited to molding into a complex shape, it may be given an even more complex shape than a metal composite.

Figure 7:
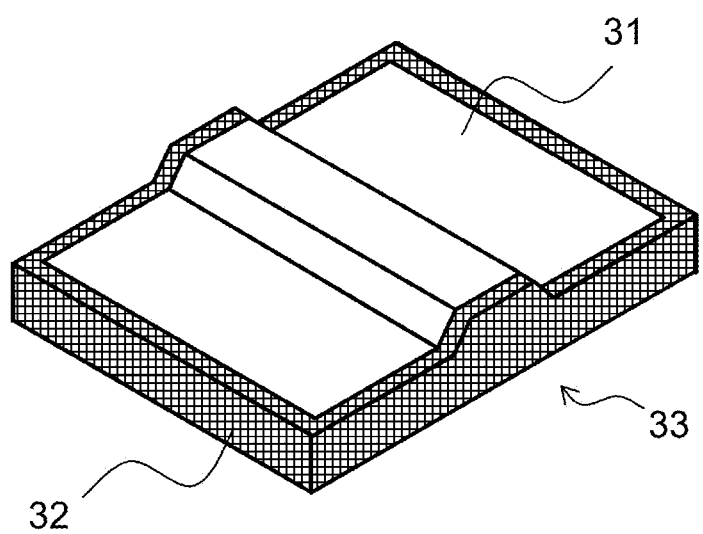
FIG. 7 is a schematic perspective-view drawing of an example of an electronic equipment chassis of the present invention.

FIG. 7 is a schematic perspective-view drawing of an example of an electronic equipment chassis of the present invention. In FIG. 7, the electronic equipment chassis 33 has been formed of part B, constituted of thermoplastic resin b, and a metal composite 31 (metal composite A) of the present invention by integrated molding.

Part B Constituted of Thermoplastic Resin b:

Examples of a thermoplastic resin in part B constituted of a thermoplastic resin b include polyethylene terephthalate (PET), polybutylene terephthalate (PBT), polytrimethylene terephthalate (PTT), polyethylene naphthalate, polyester-based resin, such as a liquid crystal polyester, polyethylene (PE), polypropylene (PP), polyolefin, such as polybutylene, styrene-based resin, and urethane resin, as well as polyoxymethylene (POM), polyamide (PA), polycarbonate (PC), polymethyl methacrylate (PMMA), polyvinyl chloride (PVC), polyphenylene sulfide (PPS), polyphenylene ether (PPE), modified PPE, polyimide (PI), polyamide-imide (PAI), polyetherimide (PEI), polysulfone (PSU), modified PSU, polyethersulfone (PES), polyacrylic butadiene polyketone (PK), polyether ketone (PEK), polyether ether ketone (PEEK), polyether ketone ketone (PEKK), polyallylate (PAR), polyether nitrile (PEN), phenolic resin and phenoxy resin. Other choices of a thermoplastic resin include a copolymer or modified compound of any of the above resins and/or a blend of two or more.

It is preferable that, for specific purposes, one, two or more of the above thermoplastic resins be contained in the thermoplastic resin b by 60 wt % or more. From the viewpoint of the strength and impact resistance of the molding, polyamide (PA) and polyester are advantageously used. From the viewpoint of heat resistance and chemical resistance, a polyarylene sulfide, particularly polyphenylene sulfide (PPS), is advantageously used. From the viewpoint of the appearance and dimensional stability of the molding (e.g., a part of an electronic equipment chassis), polycarbonate (PC) and a styrene-based resin are particularly advantageously used. From the viewpoint of moldability and lightweightness, a polyolefin-based resin, e.g., a polypropylene resin, is preferable. From the viewpoint of the strength of the molding, a polyamide resin is particularly advantageously used.

To improve impact resistance of the thermoplastic resin, an elastomer or rubber component may be added. This provides a protective effect for internal electronic parts, liquid crystal parts, etc. against an impact associated with a fall of the electronic equipment chassis.

To improve the strength and rigidity of the molding, reinforcement fibers may be added. Examples include fiber-reinforced thermoplastic resin pellets, such as short fiber-reinforced pellets and long fiber-reinforced pellets, a thermoplastic sheet molding compound (TH-SMC), glass fiber mat-reinforced thermoplastic (GMT), and carbon fiber mat containing a thermoplastic resin.

Adding reinforcement fibers to a thermoplastic resin makes it possible to obtain not only an electrical/electronic equipment chassis with high rigidity but also part B that is low in shrinkage and high in dimensional precision, and this, in turn, supports precision design. Reinforcement fibers to be added to a thermoplastic resin may be chosen by applying the same kind of philosophy as that for fibers added to a sheet substrate.

Apart from reinforcement fibers, the thermoplastic resin may also contain fillers and additives as necessary according to the application, etc., as long as it does not undermine the objectives of the present invention. Examples of a filler or additive include an inorganic filler, flame retardant, electrical conductivity enhancer, crystal nucleating agent, ultraviolet absorber, antioxidant, dampener, antibacterial agent, insect repellant, deodorant, color protection agent, thermal stabilizer, mold releasing agent, antistatic agent, plasticizer, lubricant, coloring agent, pigments, dye, foaming agent, foaming control agent, and coupling agent.

Resin Layer C Constituted of Thermoplastic Resin c:

Under the present invention, it is preferable that, to strongly join the metal composite A and part B together, a resin layer C constituted of a thermoplastic resin c have formed over at least part of the surface of the metal composite A. This makes it possible to obtain a chemical bond in addition to a mechanical joint. Although there are no particular restrictions on the thermoplastic resin c contained, at least partially, in the skin of the metal composite A, it is preferable to select a thermoplastic resin that is compatible with part B, which is constituted of a thermoplastic resin b.

From a productivity viewpoint, it is preferable to form a resin layer C simultaneously with the curing of the thermosetting resin by further placing a sheet substrate that contains a thermoplastic resin c between a pair of molds. Although there are no particular restrictions on the technique to form the resin layer C, it may be done, for instance, as a side by side or laminated preform in the same manner as the metal material a1 and sheet substrate a2, or through the use of metal materials coated with a resin layer C.

It is preferable that the melting point or glass transition temperature of the thermoplastic resin c be lower than that of the thermoplastic resin b. Although there are no particular restrictions on the difference between the melting points or glass transition temperatures of the thermoplastic resin c and thermoplastic resin b, it is preferable that it be 10° C. or more, more preferably 30° C. or more. Choosing thermoplastic resins with such a relationship allows the heat from part B constituted of a thermoplastic resin b, which is in a melted state inside a mold, to cause the thermoplastic resin c to soften and/or melt and become strongly bonded to the metal materials during cooling inside the mold.

Figure 8:
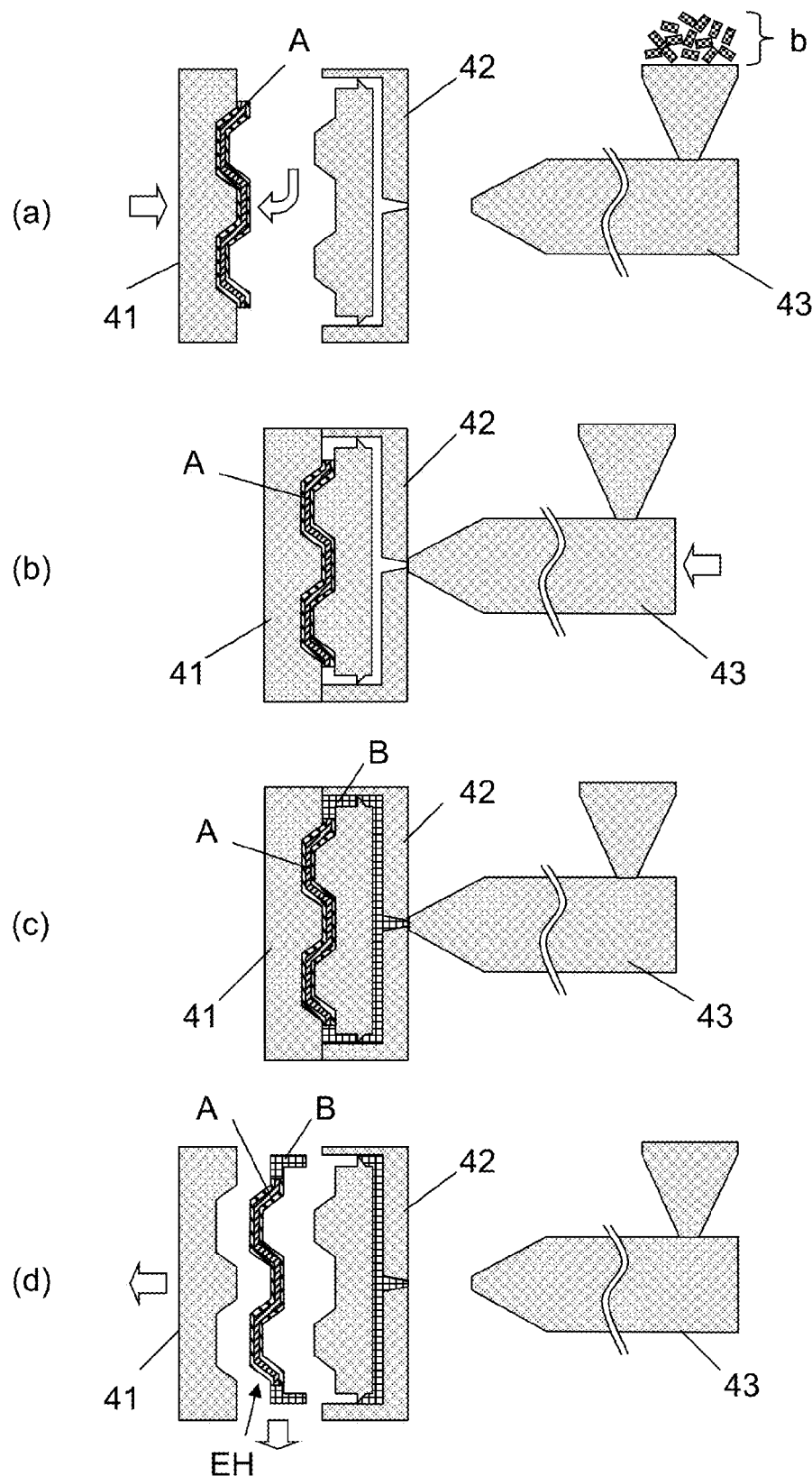
FIGS. 8 (a), 8 (b), 8 (c) and 8 (d) are a set of schematic sectional drawings illustrating the production procedure for an embodiment of the present invention with regard to electronic equipment chassis.

FIG. 8 illustrates the production procedure for an electronic equipment chassis. As illustrated in FIG. 8 (a), the metal composite A is inserted in the movable-side mold 41. Next, as illustrated in FIG. 8 (b), the movable-side mold 41, in which the metal composite A has been inserted, is moved towards the fixed-side mold 42, and the mold is closed. Subsequently, the thermoplastic resin b, which constitutes part B, is injected from the injection molding machine 43, mounted on the fixed-side mold 42, into the mold to form part B constituted of a thermoplastic resin b around the metal composite A in an integrated manner. After molding is completed, the movable-side mold 41 is moved as illustrated in FIG. 8 (d), followed by the ejection of the molding EH from the opened mold, namely, demolding.

The method to integrate the metal composite A and part B is not limited to the injection molding method. Examples of an alternative method include press molding, in which the metal composite A and part B are placed in a mold and integrated by heating and compression, and laser or ultrasonic heat welding, in which the metal composite A and part B, both shaped as desired, are placed in contact with each other and welded. However, injection molding is preferable as it allows parts with a complex shape, such as a boss, rib, hinge, frame, keyboard base, vertical wall and seat, to be easily formed and facilitates the thermoplastic resin b that constitutes part B to flow into the patterned recesses created on the surface of the metal composite A through a tapering, grooving, hole-drilling or match jointing treatment, as well as pores introduced on the surfaces of the metal materials.

It is preferable that the pores introduced on the surfaces of the metal materials used in an electronic equipment chassis be filled by at least one type of resin chosen from the thermosetting resin constituting the sheet substrate a1, thermoplastic resin b, and thermoplastic resin c. Resin inflows into the pores introduced on the surfaces of the metal materials resulting from, for instance, compression during the preparation of a metal composite and resin injection during preparation of an electronic equipment chassis improves the bonding strength between the metal materials and various resins.

It is preferable that Part B constituted of thermoplastic resin b, which forms part of an electronic equipment chassis, has a volume specific resistance of $10^4$ Ω·cm or more from the viewpoint of providing antenna characteristics. Although there are no particular restrictions on the material having this kind of volume specific resistance, it can be chosen by applying the same kind of philosophy as that for the above thermoplastic resin b, and two or more thermoplastic resins b may be used in combination.

Figure 9:
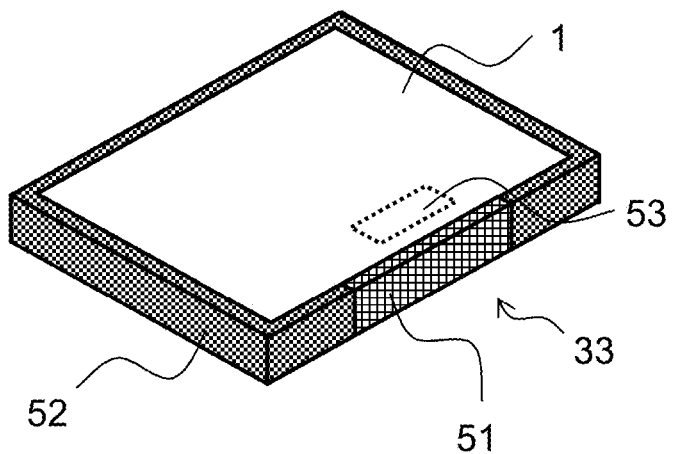
FIG. 9 is a schematic perspective-view drawing of an example of an electronic equipment chassis of the present invention that uses two part Bs, each comprising a thermoplastic resin b.

As illustrated in FIG. 9, for instance, it may be possible to place a part 51 constituted of a thermoplastic resin b with a volume specific resistance of $10^4$ Ω·cm or more near the antenna part 53 that forms part of the metal composite A in an electronic equipment chassis 33, with a part 52 constituted of a different thermoplastic resin b used in other areas. No particular restrictions apply to the actual arrangement, and there are a few ways to place different parts B with regard to the metal composite A, including the molding of different parts B in multiple rounds by inserting dummy materials and use of multicolor molding, in which different colors are allocated to different parts B.

Although preferred embodiments of the present invention have been described above, the present invention is not limited to those embodiments.

EXAMPLES

The present invention is described in more concrete terms below using examples. However, the present invention is not limited to those examples.

Example 1-(1)

Preparation of Thermosetting Resin Composition

Using the mixing ratio shown in Table 1, a resin composition was prepared from "Epikote" 828, "Epikote" 834, "Epikote" 1001 (all bisphenol A-type epoxy resins, manufactured by Japan Epoxy Resins Co., Ltd.) and "Epikote" 154 (a phenol novolac-type epoxy resin, manufactured by Japan Epoxy Resins Co., Ltd.) as epoxy resins, Dicy7 (dicyanamide, manufactured by Japan Epoxy Resins Co., Ltd.) as a curing agent, and "Omicure" 24 (2,4-toluene bis(dimethylurea), manufactured by PTI Japan Co., Ltd.) as a curing accelerator.

The glass transition temperature (Tg) of the prepared resin composition was measured. The measurement was conducted at a heating rate of 10 minutes/min in accordance with a method described in JIS K 7121 using Pyris 1DSC (a differential scanning calorimeter, manufactured by Perkinelmer Instruments Inc.). The halfway point of the section of the obtained DSC curve where it exhibits a stepwise change was taken as the glass transition temperature. In this measurement, the initial glass transition temperature (Tg) of the obtained resin composition was 6° C., while the saturated glass transition temperature (Tg) was 138° C. This resin composition was judged to be in a semi-cured state over the glass transition temperature (Tg) range of 19 to 125° C.

The relationship between the heating temperature, heating duration and glass transition temperature (Tg) of the prepared resin composition was then examined. With the heating temperature fixed at 130° C. and 150° C., the glass transition temperature (Tg) was measured as the heating duration was changed, and the glass transition temperature (Tg) became 138° C. under heating conditions of 130° C.×10 minutes, indicating that the resin composition had reached the cured state. Here, heating temperature means the surface temperature of the plates of the press between which the specimen was sandwiched for heating.

Preparation of Sheet Substrate:

The prepared resin composition was applied over a piece of release paper using a reverse roll coater to prepare a resin film. The resin film had a resin coating density of 25 g/m².

A unidirectional prepreg continuous fiber-reinforced prepreg (CF-PPg) containing 125 g of fibers per m² was prepared by placing filaments of the carbon fiber Torayca (registered trademark) T700SC-12K-50C (manufactured by Toray Industries, Inc, tensile strength 4900 MPa and tensile modulus 230 GPa) in one direction to form a sheet shape, laminating a resin film onto the carbon fiber sheet from both sides, and impregnating it with the resin composition by heating and compression.

Four rectangular prepreg sheets of a predetermined size were cut out of the prepared prepreg. With the direction of the longer side of each cut-out rectangular prepreg sheet designated as 0°, the four sheets were symmetrically laminated in such a manner that their continuous reinforcement fibers were oriented in the [0°/90°/90°/0°] directions, thus producing a 0.5 mm-thick sheet substrate. During the lamination process, a thermocouple (K thermocouple) was inserted between the 90° layers of the prepreg substrate.

Using press molding equipment, the sheet substrate was mounted on a plate with a surface temperature of 130° C. and simultaneously heated and compressed at 1 MPa for 10 minutes. When the glass transition temperature of the obtained molding (Tg) was measured using a method similar to the one described above, it was found to be 137° C., thus confirming that the resin was in the cured state.

Preparation of Preform:

Next, 0.5 mm-thick aluminum alloy plates (A5052) on whose surfaces a sand blasting treatment had been provided were furnished for use as metal materials. Numerous pores with an average size of 30 μm were observed on the surfaces of the aluminum alloy plates.

The prepared sheet substrate and metal materials were laminated in the metal material/sheet substrate/metal material order to produce a preform. During the lamination process, a thermocouple (K thermocouple) was attached to the surface of one of the metal materials using heat-resistant tape.

Production of Metal Composite:

As illustrated in FIG. 1 (b), the preform 10 was placed between the upper mold 11 and the lower mold 12 and held under a pressure of 0.5 MPa. Both the upper mold 11 and the lower mold 12 had a surface temperature of 220° C.

About 1 minute after placing the preform 10 inside a mold in the step 1, it was compressed at 10 MPa by means of the upper mold 11 and the lower mold 12 in the step 2. During this process, the temperature of the metal materials 1, 3 was 210° C. and the temperature of the sheet substrate 2 was 150° C. According to the correlations between the heating temperature, heating duration and glass transition temperature (Tg), the glass transition temperature (Tg) was found to be 115° C., which was 82% of the saturated glass transition temperature (Tg), and this indicated that the resin was in a semi-cured state. The graph in FIG. 2 illustrates how the temperature of the metal materials 1, 3 and compression pressure changed with time.

After about 2 minutes of compression, the mold was opened, and the metal composite A was taken out of it. In the obtained metal composite A, the metal materials 1, 3 were strongly bonded by virtue of the cured resin layer 2a, so that it was difficult to manually peel them apart. Furthermore, there was no misalignment between the two metal materials 1, 3, and a 1.5 mm-thick metal composite A with no shrinkage or twisting was obtained. The metal composite A was subjected to a bonding strength measurement to be described later, and a bonding strength of 16 MPa was obtained. After the completion of the bonding test, a specimen was shaved off the cured resin layer 2a, which had formed between the metal materials 1, 3, and its glass transition temperature (Tg) was measured and found to be 137° C., confirming that the resin was in the cured state. The manufacturing conditions and evaluation results for Example 1-(1) are shown in Table 1 and Table 2.

Example 1-(2)

Preparation of Preform

For use as metal materials, 0.5 mm-thick magnesium alloy plates (AZ31) on whose surfaces a sand blasting treatment had been provided were furnished. Numerous pores with an average size of 50 μm were observed on the surfaces of the magnesium alloy plates. Using the same sheet substrate as the Example 1-(1), a preform was produced in the same manner as Example 1-(1).

Production of Composite Material:

As illustrated in FIG. 1 (b), the preform 10 was inserted between the upper mold 11 and the lower mold 12 and held under a pressure of 0.5 MPa. Both the upper mold 11 and the lower mold 12 had a surface temperature of 210° C.

About 1 minute after placing the preform 10 inside a mold in the step 1, it was compressed at 15 MPa with the upper mold 11 and the lower mold 12 in the step 2. During this process, the temperature of the metal materials 1, 3 was 200° C. and the temperature of the sheet substrate 2 was 140° C. The glass transition temperature (Tg) of the thermosetting resin was 108° C., which was 77% of the saturated glass transition temperature (Tg), and this indicated that the resin was in a semi-cured state.

After about 2 minutes of compression, the mold was opened, and the metal composite A was taken out of it. There was no misalignment between the two metal materials 1, 3, and a 1.5 mm-thick metal composite A with no surface defects, such as wrinkling, cracking or tearing, was obtained. In the obtained metal composite A, the metal materials 1, 3, which featured patterned recesses on their surfaces, were strongly bonded by virtue of the cures resin layer 2a, so that it was difficult to manually peel them apart. A bonding strength measurement was conducted in the same manner as Example 1-(1), and the bonding strength was found to be 18 MPa. After the completion of the bonding test, a specimen was shaved off the cured resin layer 2a, which had formed between the metal materials 1, 3, and its glass transition temperature (Tg) was measured and found to be 137° C., confirming that the resin was in the cured state. The manufacturing conditions and evaluation results for Example 1-(2) are shown in Table 1 and Table 2.

Example 1-(3)

Using the same method as the Example 1-(1), except that 0.5 mm-thick aluminum alloy plates (A5052) on whose surfaces an alumite treatment had been provided were adopted as metal materials, a metal composite was produced and evaluated. Numerous pores with an average size of 0.05 μm were observed on the surfaces of the metal plates. The manufacturing conditions and evaluation results for Example 1-(3) are shown in Table 1 and Table 2.

Example 1-(4)

Preparation of Sheet Substrate

Employing the thermosetting resin composition prepared in Example 1-(1), a resin film was prepared. The resin film had a resin coating density of 50 g/m². Using the same method as the Example 1-(1), except that the above resin film was adopted as the sheet substrate, a metal composite was produced and evaluated. The manufacturing conditions and evaluation results for Example 1-(4) are shown in Table 3 and Table 4.

Example 1-(5)

Prepared of Preform

Using the same method as the Example 1-(1), except that the preform was prepared as a two-layer laminate of a metal material/sheet substrate configuration using the sheet substrate and metal material prepared in Example 1-(1) and that the surface temperature of the lower mold was set to 150° C., a metal composite was produced and evaluated. The manufacturing conditions and evaluation results for Example 1-(5) are shown in Table 3 and Table 4.

Example 1-(6)

Using the same method as Example 1-(1), except that, about 0.5 minute after placing the preform 10 inside a mold in the step 1, it was compressed for about a minute in the step 1-2, a metal composite was produced. After this minute or so-long compression, the mold was opened, and the metal composite was taken out of it, followed by 10 minutes of post curing performed by placing the metal composite into a hot air furnace whose ambient temperature had been adjusted to 150° C. The obtained metal composite was evaluated in the same manner as Example 1-(1). The manufacturing conditions and evaluation results for Example 1-(6) are shown in Table 3 and Table 4.

Example 1-(7)

Employing an F-a-type benzoxazine resin (manufactured by Shikoku Chemicals Corporation) as a benzoxazine resin and the DY9577 (a boron trichloride octyl amine complex, manufactured by Huntsman Advanced Materials Gmbh) as an acid catalyst, a resin composition was prepared at the mass mixing ratio shown in Table 17. Except that this resin composition was adopted as the thermosetting resin to produce a sheet substrate, the same method as Example 1-(1) was used. From the results of viscosity measurements based on a viscometer, the degree of curing of the resin was calculated, and it was found that the resin had been in a semi-cured state in the step 1. The manufacturing conditions and evaluation results for Example 1-(7) are shown in Table 5 and Table 6.

Example 1-(8)

The same setup as Example 1-(1) was used, except that, as a phenol resin, the PHENOLITE (registered trademark) 5010 (a resol-type phenol resin, manufactured by DIC) was furnished and used as the thermosetting resin to prepare a sheet substrate. The manufacturing conditions and evaluation results for Example 1-(8) are shown in Table 5 and Table 6.

Example 1-(9)

Using the same method as Example 1-(1), except that 0.2 mm-thick titanium alloy plates (Ti-6Al-4V) on whose surfaces a sand blasting treatment had been provided were adopted as metal materials and that the surface temperature of the mold and molding pressure were set to 240° C. and 15 MPa, respectively, a metal composite was produced and evaluated. Numerous pores with an average size of 15 μm an were observed on the surfaces of the metal materials. The manufacturing conditions and evaluation results for Example 1-(9) are shown in Table 5 and Table 6.

Example 1-(10)

Using the same method as the Example 1-(1), except that the temperature of the upper and lower molds was set to 190° C., a metal composite was produced and evaluated. The surface temperature of the metal materials in the step 1 was 185° C. The manufacturing conditions and evaluation results for Example 1-(10) are shown in Table 7 and Table 8.

Example 1-(11)

Figure 10:
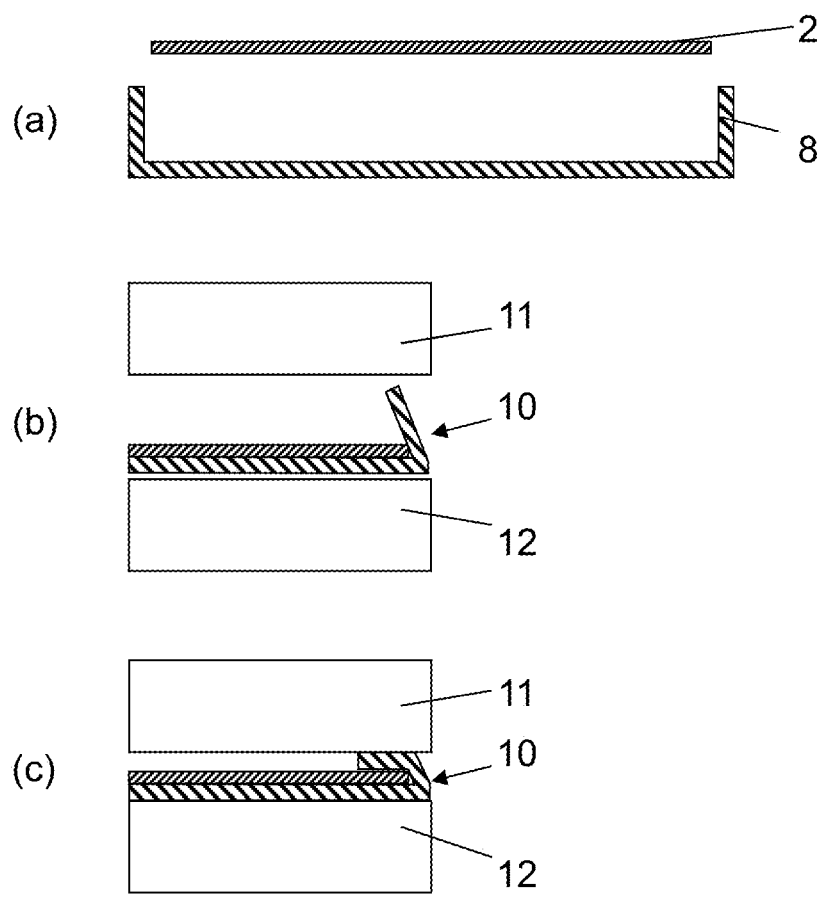
FIGS. 10 (a), 10 (b) and 10 (c) are a set of schematic sectional drawings illustrating the procedure of the hemming treatment in Example 1-(11) of the present invention.

A U-shaped aluminum alloy metal material plate as illustrated in FIG. 10 (*a*), prepared by bending each of a pair of opposing sides into a near 90° L shape, was furnished. A preform was prepared by placing a sheet substrate that is identical to Example 1-(5) as illustrated 1-(5) FIG. 10 (*b*) and bending the vertical leg of the L shape in. Except for these conditions, molding was performed in the same manner as Example 1-(5). The vertical leg of the L shape, which has been bent inwards, is flattened as it is compressed by the mold, and this provided a metal composite with hemmed edges. The manufacturing conditions and evaluation results for Example 1-(11) are shown in Table 7 and Table 8.

Example 1-(12)

The same setup as Example 1-(1) was used, except that industrial pure aluminum plates (A1100) were adopted as metal materials. The manufacturing conditions and evaluation results for Example 1-(12) are shown in Table 9 and Table 10.

Example 1-(13)

The same setup as Example 1-(9) was used, except that industrial pure titanium plates (KS40) were adopted as metal materials. The manufacturing conditions and evaluation results for Example 1-(13) are shown in Table 9 and Table 10.

Comparative Example 1-(1)

Preparation of Preform

Using the same method as Example 1-(1), except that the thermosetting resin was mixed at the composition mass ratio shown in Table 11, a metal composite was produced.

Here, using press molding equipment, the sheet substrate was mounted on a plate with a surface temperature of 130° C. and simultaneously heated and compressed at 1 MPa for 10 minutes. The glass transition temperature (Tg) of the resin in the obtained metal composite was measured and found to be 75° C. Since this glass transition temperature (Tg) was 52% of the saturated glass transition temperature (Tg), the resin was confirmed to be in a semi-cured state.

Production of Metal Composite:

As illustrated in FIG. 1 (*b*), the preform 10 was inserted between the upper mold 11 and the lower mold 12 and held under a pressure of 0.5 MPa.

About 1 minute after placing the preform 10 inside a mold in the step 1, it was compressed at 10 MPa by means of the upper mold 11 and the lower mold 12 in the step 1-2. During this process, the resin composition oozed out from the splitting line of the mold.

After about 2 minutes of compression, the mold was opened, and the metal composite A was taken out of it. There was a misalignment between the metal materials, while part of the sheet substrate protruded out of the metal materials. The desired metal composite could not therefore be obtained. Moreover, when ejecting the metal composite from the mold, the metal materials were found to have stuck to the mold, making it difficult to demold it as a composite material. For this reason, it was impossible to measure the bonding strength. The manufacturing conditions and evaluation results for Comparative example 1-(1) are shown in Table 11 and Table 12.

Comparative Example 1-(2)

Using the preform of Example 1-(2), a metal composite was produced.

Production of Metal Composite:

As illustrated in FIG. 1 (*b*), the preform 10 was inserted between the upper mold 11 and the lower mold 12 and held under a pressure of 0.5 MPa. Using the same method as the Example 1-(2), except that the surface temperature of both the upper mold 11 and the lower mold 12 was set to 130° C., a metal composite was produced and evaluated.

In the obtained metal composite, there was a misalignment between the two metal materials, while a small part of the sheet substrate had leaked out of the metal materials.

Wrinkles were observed on the squeezed-side surface of the metal composite associated with its wavy shape, with surface cracks appearing in deeply squeezed areas. Furthermore, it was possible to manually peel the metal materials apart. The manufacturing conditions and evaluation results for Comparative example 1-(2) are shown in Table 11 and Table 12.

Comparative Example 1-(3)

Heating and compression was performed by following the same procedure as Example 1-(3), except that a preform containing 1.5 mm-thick aluminum alloy plates (A5052) on whose surfaces an alumite treatment had been provided as metal materials and that the molding pressure was set to 0.5 MPa.

About 3 minutes after placing the preform in a mold, the mold was opened. It was observed that the preform had not formed into the desired shape. The manufacturing conditions and evaluation results for Comparative example 1-(3) are shown in Table 11 and Table 12.

Example 2-(1)

The same sheet substrate and metal materials as Example 1-(1) were furnished and a preform was prepared from them.
Production of Metal Composite:
Step 1:
As illustrated in FIG. 1 (b), the preform 10 was inserted between the upper mold 11 and the lower mold 12 and held under a pressure of 0.5 MPa. Both the upper mold 11 and the lower mold 12 had a surface temperature of 220° C. This state was maintained for about 1 minute, and the resin composition was semi-cured. During this process, the surface temperature of the metal materials was 215° C. and the temperature of the sheet substrate was 150° C.

Based on the correlations between the heating temperature, heating duration and glass transition temperature (Tg) measured in advance as described above, the glass transition temperature (Tg) of the resin composition contained in the metal composite was estimated to be 115° C. Since this glass transition temperature (Tg) was 82% of the saturated glass transition temperature (Tg), the resin composition was found to have been in a semi-cured state at the end of the step 1.
Step 2:
Then, the preform 10 was compressed at 10 MPa by means of the upper mold 11 and the lower mold 12, and a metal composite was produced.
Step 3:
About 1 minute after compression began in the step 2, cooling water was passed through the upper mold 11 and the lower mold 12 to cool them to 180° C. or less, with their temperature setting changed to 150° C. About 2 minutes after cooling began, the surface temperature of the metal materials fell to 180° C. or less, and compression was applied for about 1 minute thereafter.
Demolding:
The mold was opened, and the metal composite was taken out of it. In the obtained metal composite A, the metal materials 1, 3 were strongly bonded by virtue of the cured resin layer 2a, so that it was difficult to manually peel them apart. There was no misalignment between the two metal materials, and the metal composite had a thickness of 1.5 mm free of warping and deformation throughout, with no shrinkage or twisting observed. The bonding strength of the metal composite was measured and found to be 16 MPa. After the completion of the bonding test, a specimen was shaved off the resin composition, which was sandwiched between the metal materials 1, 3, and its glass transition temperature (Tg) was measured and found to be 137° C., confirming that the resin composition had been in the cured state at the end of the step 3.

The manufacturing conditions and evaluation results for Example 2-(1) are shown in Table 13 and Table 14.

Example 2-(2)

Preparation of Preform

For use as metal materials, 0.5 mm-thick magnesium alloy plates (AZ31) on whose surfaces a sand blasting treatment had been provided was furnished. Numerous pores with an average size of 50 μm were observed on the surfaces of the magnesium alloy plates. A preform was prepared in the same manner as Example 2-(1), except that the metal materials were changed to magnesium alloy plates.
Production of Metal Composite:
Step 1:
As illustrated in FIG. 1 (b), the preform 10 was inserted between the upper mold 11 and the lower mold 12 and held under a pressure of 0.5 MPa. Both the upper mold 11 and the lower mold 12 had a surface temperature of 210° C. This state was maintained for about 1 minute, and the resin composition was semi-cured. During this process, the surface temperature of the metal materials was 210° C. and the temperature of the sheet substrate was 150° C. Based on the correlations between the heating temperature, heating duration and glass transition temperature (Tg) measured in advance, the glass transition temperature (Tg) of the resin composition contained in the metal composite was estimated to be 180° C. Since this glass transition temperature (Tg) was 77% of the saturated glass transition temperature (Tg), the resin composition was found to have been in a semi-cured state at the end of the step 1.
Step 2:
Next, the preform 10 was compressed at 15 MPa by means of the upper mold 11 and the lower mold 12 and a metal composite was produced.
Step 3:
About 1 minute after compression began in the step 2, cooling water was passed through the upper mold 11 and the lower mold 12 to cool them to 180° C. or less, with their temperature setting changed to 150° C. About 2 minutes after cooling began, the surface temperature of the metal materials fell to 180° C. or less, and compression was applied for about 1 minute thereafter.
Demolding:
The mold was opened, and the metal composite was taken out of it. There was no misalignment between the two metal materials, and the metal composite had a thickness of 1.5 mm with a wavy shape. The metal composite was free of warping and deformation throughout, with no surface defects, such as wrinkling, cracking and tearing, observed. The metal materials were strongly bonded so that it was difficult to manually peel them apart. Using a method to be described later, the bonding strength of the metal composite was measured and found to be 18 MPa. After the completion of the bonding test, a specimen was shaved off the resin composition, which was sandwiched between the metal materials 1, 3, and its glass transition temperature (Tg) was measured and found to be 137° C., confirming that the resin composition had been in the cured state at the end of the step 3.

The manufacturing conditions and evaluation results for Example 2-(2) are shown in Table 13 and Table 14.

Example 2-(3)

For use as metal materials, 0.5 mm-thick aluminum alloy plates (A5052) on whose surfaces an alumite treatment had been provided were furnished. Numerous pores with an average size of 0.05 μm were observed on the surfaces of the aluminum alloy plates. Using the same method as Example 2-(1), except that the metal materials were changed to these aluminum alloy plates, a metal composite was produced and evaluated. The manufacturing conditions and evaluation results for Example 2-(3) are shown in Table 13 and Table 14.

Example 2-(4)

A resin film was prepared using the same resin composition as Example 2-(1). The resin coating density of the resin film was 50 g/m². Using the same method as the Example 2-(1), except that the sheet substrate was changed to this resin film, a metal composite was produced and evaluated. The manufacturing conditions and evaluation results for Example 2-(4) are shown in Table 15 and Table 16.

Example 2-(5)

Using the sheet substrate and metal material produced in Example 2-(1), a two-layer preform with a metal material/sheet substrate configuration was prepared. In the step 1, the surface temperature of the lower mold was set to 150° C. Using the same method as Example 2-(1), except that the above preform was used and the surface temperature of the lower mold was changed, a metal composite was produced and evaluated. The manufacturing conditions and evaluation results for Example 2-(5) are shown in Table 15 and Table 16.

Example 2-(6)

The same preform as the Example 2-(1) was used. About 30 seconds after heating in the step 1 began, compression in the step 2 was started, and about 30 seconds later, cooling water was passed through the upper mold and the lower mold as the step 3 to cool them to 180° C. or less, with their temperature setting changed to 170° C. About 2 minutes after cooling began, the surface temperature of the metal material fell to 180° C. or less, and compression was applied for about 1 minute thereafter. After this, the mold was opened, and the metal composite was taken out of it, followed by 10 minutes post curing performed by placing the metal composite into a hot air furnace whose ambient temperature had been adjusted to 150° C. The obtained metal composite was evaluated in the same manner as Example 2-(1). The manufacturing conditions and evaluation results for Example 2-(6) are shown in Table 15 and Table 16.

Comparative Example 2-(1)

Preparation of Preform

Using the same method as Example 2-(1), except that the composition of the thermosetting resin was changed to the mass ratio shown in Table 17, a metal composite was produced. Using press molding equipment, the sheet substrate was mounted on a plate with a surface temperature of 130° C. and simultaneously heated and compressed at 1 MPa for 10 minutes. When the glass transition temperature of the obtained molding (Tg) was measured using a method similar to the one described above, it was found to be 75° C. Since this glass transition temperature (Tg) was 52% of the saturated glass transition temperature (Tg), the resin composition was found to be in a semi-cured state.

Production of Metal Composite:

Step 1:

As illustrated in FIG. 1 (b), the preform 10 was inserted between the upper mold 11 and the lower mold 12 and held under a pressure of 0.5 MPa. Both the upper mold 11 and the lower mold 12 had a surface temperature of 220° C. The temperature of the sheet substrate was 150° C. This state was maintained for about 1 minute to have the resin composition undergo a reaction. Based on the correlations between the heating temperature, heating duration and glass transition temperature (Tg) obtained in advance as described above, the glass transition temperature (Tg) of the resin composition contained in the metal composite was estimated to be 14° C. Since this glass transition temperature (Tg) was 6% of the saturated glass transition temperature (Tg), the resin composition was found to have not been in a semi-cured state at the end of the step 1.

Step 2:

Next, the preform was compressed at 10 MPa by means of the upper mold 11 and the lower mold 12. During this process, a large amount of resin composition oozed out from the splitting line of the mold.

Demolding:

After providing compression for about 3 minutes without also providing cooling as in the step 3, the mold was opened. However, the desired metal composite could not be obtained as the metal materials were misaligned, while the metal composite was warped throughout, with part of the sheet substrate protruding out of the metal materials. Moreover, when ejecting the metal composite from the mold, the metal materials were found to have stuck to the mold, making it difficult to demold it as a composite material. For this reason, it was impossible to measure the bonding strength.

The manufacturing conditions and evaluation results for Comparative example 2-(1) are shown in Table 17 and Table 18.

Comparative Example 2-(2)

As illustrated in FIG. 1 (b), the preform 10 was inserted between the upper mold 11 and the lower mold 12 and held under a pressure of 0.5 MPa. Both the upper mold 11 and the lower mold 12 had a surface temperature of 130° C. Using the same method as Example 2-(2) except for the above, a metal composite was produced and evaluated. The manufacturing conditions and evaluation results for Comparative example 2-(2) are shown in Table 17 and Table 18.

In the obtained metal composite, there was a misalignment between the two metal materials, and a small portion of the thermosetting resin had leaked out of the metal materials. Wrinkles were observed on the squeezed-side surface of the metal composite associated with its wavy shape, with surface cracks appearing in deeply squeezed areas. It was also possible to manually peel the metal materials apart. The manufacturing conditions and evaluation results for Comparative example 2-(2) are shown in Table 17 and Table 18.

Example 3-(1)

The same sheet substrate and metal materials as Example 1-(1) were furnished.

Production of Metal Composite:

Step 1-1:

As illustrated in FIG. 4 (a-1), the sheet substrate 2 was placed on the lower mold 12, and the heating of the sheet substrate 2 was started. The surface temperature of the lower mold 12 was 150° C. Immediately before proceeding to a step 1-2 to be described later, the surface temperature of the sheet substrate 2 was 130° C. Based on the correlations between the heating temperature, heating duration and glass transition temperature (Tg) obtained in advance as described above, the glass transition temperature (Tg) of the resin composition contained in the metal composite was estimated to be 80° C. Since this glass transition temperature (Tg) was 57% of the saturated glass transition temperature (Tg), the resin composition was found to have been in a semi-cured state at the end of the step 1-1.

Step 1-2:

In a parallel process to the step 1-1, the metal material 1 was placed inside an electric furnace EF as illustrated in FIG. 4 (a-2) and the preheating of the metal material 1 was started. The ambient temperature inside the electric furnace EF was 250° C. Immediately before proceeding to a step 2 to be described later, the surface temperature of the metal material 1 was 245° C.

Step 2:

About 1 minute after the heating of the sheet substrate 2 and preheating of the metal material 1 began, the metal material 1, taken out of the electric furnace EF, was laminated onto the sheet substrate 2 as illustrated in FIG. 4 (b) to produce a preform 10. Next, as illustrated in FIG. 4 (c), the preform 10 was compressed at 10 MPa for about 2 minutes by means of the upper mold 11 and lower mold 12 to mold it into a metal composite A, while curing the resin composition contained in the sheet substrate 2.

Demolding:

The mold was opened, and the metal composite A was taken out of it. The metal material and sheet substrate that constitute the metal composite obtained were strongly bonded to the extent that it was difficult to manually peel them apart. The metal composite had a thickness of 1 mm, and no shrinkage or twisting was observed. The bonding strength of the metal composite was measured using a method to be described later and found to be 14 MPa. After the completion of the bonding test, a specimen was shaved off the resin composition, which had bonded to the metal material, and its glass transition temperature (Tg) was measured and found to be 137° C. Since this glass transition temperature (Tg) was 100% of the saturated glass transition temperature (Tg), the resin composition was confirmed to have been in the cured state at the end of the step 1-2.

The manufacturing conditions and evaluation results for Example 3-(1) are shown in Table 19 and Table 20.

Example 3-(2)

Metal Material

For use as the metal material, a 0.5 mm-thick magnesium alloy plate (AZ31) on whose surface a sand blasting treatment had been provided was furnished. Numerous pores with an average size of 50 μm were observed on the surface of the magnesium alloy plate.

Production of Metal Composite:

Step 1-1:

As illustrated in FIG. 4 (a-1), the sheet substrate 2 was placed on the lower mold 12, and the heating of the sheet substrate 2 was started. The surface temperature of the lower mold 12 was 150° C. Immediately before proceeding to a step 2 to be described later, the surface temperature of the sheet substrate 2 was 130° C. Based on the correlations between the heating temperature, heating duration and glass transition temperature (Tg) obtained in advance as described above, the glass transition temperature (Tg) of the resin composition contained in the metal composite was estimated to be 80° C. Since this glass transition temperature (Tg) was 57% of the saturated glass transition temperature (Tg), the resin composition was found to have been in a semi-cured state at the end of the step 1-1.

Step 1-2:

In a parallel process to the step 1-1, the metal material 1 was placed inside an electric furnace EF as illustrated in FIG. 4 (a-2) and the preheating of the metal material 1 was started. The ambient temperature inside the electric furnace EF was set to 250° C. Immediately before proceeding to a step 2 to be described later, the surface temperature of the metal material 1 was 240° C.

Step 2:

About 1 minute after the heating of the sheet substrate 2 and preheating of the metal material 1 began, the metal material 1, taken out of the electric furnace EF, was laminated onto the sheet substrate 2 as illustrated in FIG. 4 (b) to produce a preform 10. Next, as illustrated in FIG. 4 (c), the preform 10 was compressed at 10 MPa for about 2 minutes by means of the upper mold 11 and the lower mold 12 to mold it into a metal composite A, while curing the resin composition contained in the sheet substrate 2.

Demolding:

The mold was opened, and the metal composite A was taken out of it. There was no misalignment between the two metal materials. The metal composite had a thickness of 1 mm with a wavy shape. The metal composite exhibited no surface defects, such as wrinkling, cracking and tearing. The metal material and sheet substrate that constitute the metal composite obtained were strongly bonded to the extent that it was difficult to manually peel them apart. The bonding strength of the metal composite was measured using a method to be described later and found to be 16 MPa. After the completion of the bonding test, a specimen was shaved off the resin composition, which had bonded to the metal material, and its glass transition temperature (Tg) was measured and found to be 137° C. Since this glass transition temperature (Tg) was 100% of the saturated glass transition temperature (Tg), the resin composition was confirmed to have been in the cured state at the end of the step 2.

The manufacturing conditions and evaluation results for Example 3-(2) are shown in Table 19 and Table 20.

Example 3-(3)

For use as the metal material, a 0.5 mm-thick aluminum alloy plate (A5052) on whose surface an alumite treatment had been provided was adopted. Numerous pores with an average size of 0.05 μm were observed on the surface of the metal plate. Using the same method as Example 3-(1), except that the metal material was changed to this aluminum alloy plate, a metal composite was produce and evaluated. The manufacturing conditions and evaluation results for Example 3-(3) are shown in Table 19 and Table 20.

Example 3-(4)

Employing the thermosetting resin composition prepared in Example 3-(1), a resin film was prepared. The resin film had a resin coating density of 50 g/m². Using the same method as Example 3-(1), except that this resin film was adopted as the sheet substrate, a metal composite was produced and evaluated. The manufacturing conditions and evaluation results for Example 3-(4) are shown in Table 21 and Table 22.

Example 3-(5)

Using the same method as Example 3-(1), except that about 0.5 minutes after the heating of the sheet substrate in the step 1-1 and preheating of the metal material 1 in the step 1-2 were started, a preform was prepared, and that the duration of compression in the step 2 was set to about 1 minute, a metal composite was produced. The mold was opened, and the metal composite was taken out of it, followed by 10 minutes of post curing performed by placing the metal composite into a hot air furnace whose ambient temperature had been adjusted to 150° C. The obtained metal composite was evaluated in the same manner as Example 3-(1). The manufacturing conditions and evaluation results for Example 3-(5) are shown in Table 21 and Table 22.

Example 3-(6)

A sheet substrate and two metal materials, the same types as Example 3-(1), were furnished.
Step 1-1:
The sheet substrate was placed in a hot air furnace whose ambient temperature had been heated to 150° C. and began to be heated. Immediately before proceeding to a step 1-2 to be described later, the surface temperature of the sheet substrate was 130° C. Based on the correlations between the heating temperature, heating duration and glass transition temperature (Tg) obtained in advance as described above, the glass transition temperature (Tg) of the resin composition contained in the metal composite was estimated to be 80° C. Since this glass transition temperature (Tg) was 57% of the saturated glass transition temperature (Tg), the resin composition was found to have been in a semi-cured state at the end of the step 1-1.
Step 1-2:
In a parallel process to the step 1-1, two metal materials were placed inside an electric furnace whose ambient temperature had been heated to 250° C. and preheating was started. Immediately before proceeding to a step 2 to be described later, the surface temperature of the metal materials was 245° C.
Step 2:
About 1 minute after the step 1-1 began, the metal materials, taken out of the electric furnace, and the sheet substrate, taken out of the hot air furnace, were placed in a mold with a surface temperature of 150° C. in a metal material/sheet substrate/metal material configuration to produce a preform. The mold was then closed, and the preform was compressed at a pressure of 10 MPa for about 2 minutes to mold it, while curing the resin composition contained in the sheet substrate.
Demolding:
About 2 minutes after compression began in the step 2, the mold was opened, and metal composite was taken out of it. There was no misalignment between the two metal materials. The metal composite had a thickness of 1.5 mm with a wavy shape. The metal composite exhibited no surface defects, such as wrinkling, cracking and tearing. In the obtained metal composite, the metal materials were strongly bonded to the extent that it was difficult to manually peel them apart. The bonding strength of the metal composite was measured using a method to be described later and found to be 16 MPa. After the completion of the bonding test, a specimen was shaved off the resin composition, which was sandwiched between the metal material, and its glass transition temperature (Tg) was measured and found to be 137° C. Since this glass transition temperature (Tg) was 100% of the saturated glass transition temperature (Tg), the resin composition was confirmed to have been in the cured state at the end of the step 2.

The manufacturing conditions and evaluation results for Example 3-(6) are shown in Table 21 and Table 22.

Example 3-(7)

Preparation of Thermosetting Resin

The thermosetting resin was prepared as a resin composition under the same conditions as Example 3-(1), except that the composition mass ratio was changed to the one shown in Table 23.

The prepared resin composition was subjected to a glass transition temperature (Tg) measurement using the same measurement method as Example 3-(1). The glass transition temperature (Tg) of the resin composition was 6° C., while the saturated glass transition temperature (Tg), which had been reached through curing, was 136° C. It can be said that, when the glass transition temperature (Tg) is in the 13 to 117° C. range, the resin composition is in a semi-cured state.

The relationship between the heating temperature, heating duration and glass transition temperature (Tg) of the prepared resin composition was examined in the same manner as Example 3-(1). With the heating temperature fixed at 130° C. and 150° C., the glass transition temperature (Tg) was measured as the heating duration was changed, and the glass transition temperature (Tg) became 14° C. at a heating temperature of 130° C. and a heating duration of 10 minutes, indicating that the resin composition had reached a semi-cured state.
Preparation of Sheet Substrate:
A sheet substrate was prepared using the same method as Example 3-(1) except that the resin composition was changed to the one described above.

Figure 11:
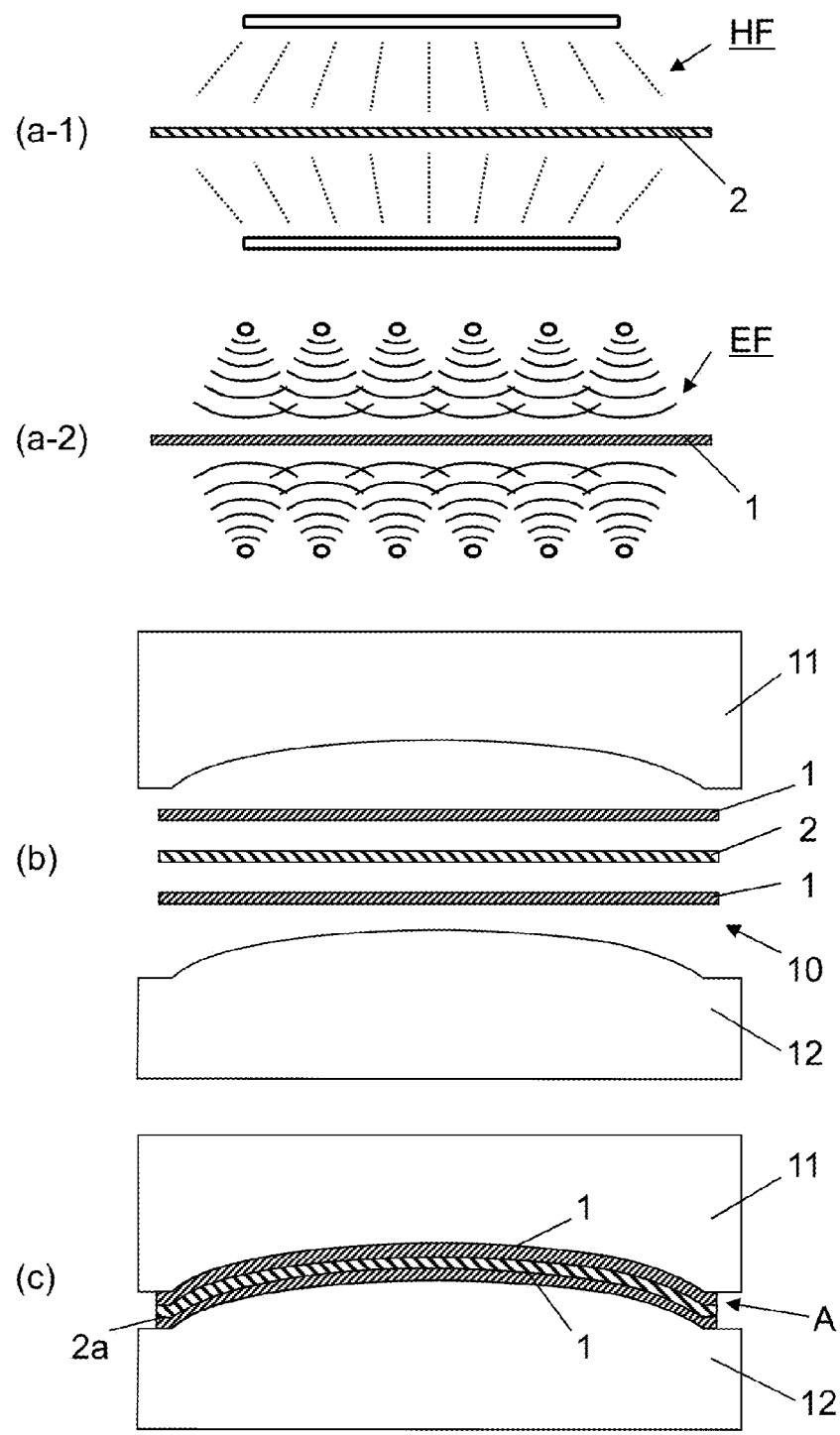
FIGS. 11 (a-1), 11 (a-2), 11 (b) and 11 (c) are a set of schematic sectional drawings illustrating the manufacturing procedure for another embodiment of the present invention with regard to manufacturing methods for metal composites.

Using press molding equipment, the sheet substrate was mounted on a plate with a surface temperature of 130° C. and simultaneously heated and compressed at 1 MPa for 10 minutes. The glass transition temperature (Tg) of the molding obtained was measured using the same method as the above and found to be 75° C. Since this glass transition temperature (Tg) was 52% of the saturated glass transition temperature (Tg), the resin was confirmed to be in a semi-cured state. The same setup as Example 3-(6) was used, except that the above sheet substrate was used.
Step 1-1:
The sheet substrate 2 was placed inside a hot air furnace HF with an ambient temperature of 150° C. as shown in FIG. 11 (*a*-1), and the heating of the sheet substrate 2 was started. Immediately before proceeding to a step 2 to be described later, the surface temperature of the sheet substrate 2 was 150° C. Based on the correlations between the heating temperature, heating duration and glass transition temperature (Tg) obtained in advance as described above, the glass transition temperature (Tg) of the resin composition contained in the metal composite was estimated to be 120° C. Since this glass transition temperature (Tg) was 86% of the saturated glass transition temperature (Tg), the resin composition was found to have been in a semi-cured state at the end of the step 1-1.

Step 1-2:

In a parallel process to the step 1-1, the two metal materials 1 were placed inside an electric furnace EF with an ambient temperature of 250° C. as illustrated in FIG. 11 (*a*-2), and preheating was started. Immediately before proceeding to a step 1-2 to be described later, the surface temperature of the metal materials 1 was 250° C.

Step 2:

About 20 minutes after the step 1-1 began, the two metal materials 1, taken out of the electric furnace EF, and the sheet substrate 2, taken out of the hot air furnace HF, were placed in a mold with a surface temperature of 150° C. in a metal material/sheet substrate/metal material configuration as illustrated FIG. 11 (*b*) to produce a preform 10. The mold was then closed as illustrated in FIG. 11 (*c*), and the preform was compressed at a pressure of 10 MPa for about 2 minutes to mold it, while curing the resin composition contained in the sheet substrate.

Demolding:

About 2 minutes after compression began in the step 2, the mold was opened, and metal composite A was taken out of it. There was no misalignment between the two metal materials. The metal composite had a thickness of 1.5 mm with an arched shape. The metal composite exhibited no surface defects, such as wrinkling, cracking and tearing. In the obtained metal composite, the metal materials were strongly bonded to the extent that it was difficult to manually peel them apart. The bonding strength of the metal composite was measured using a method to be described later and found to be 16 MPa. After the completion of the bonding test, a specimen was shaved off the resin composition, which was sandwiched between the metal material, and its glass transition temperature (Tg) was measured and found to be 137° C. Since this glass transition temperature (Tg) was 100% of the saturated glass transition temperature (Tg), the resin composition was confirmed to have been in the cured state at the end of the step 1-2.

The manufacturing conditions and evaluation results for Example 3-(7) are shown in Table 23 and Table 24.

Comparative Example 3-(1)

Preparation of Preform

The same sheet substrate as Example 3-(7) was furnished.
Production of Metal Composite:
Step 1-1:

As illustrated in FIG. 4 (*a*-1), the sheet substrate 2 was placed on the lower mold 12, and the heating of the sheet substrate 2 was started. The surface temperature of the lower mold 12 was 150° C. Immediately before proceeding to a step 1-2 to be described later, the surface temperature of the sheet substrate 2 was 130° C. Based on the correlations between the heating temperature, heating duration and glass transition temperature (Tg) obtained in advance as described above, the glass transition temperature (Tg) of the resin composition contained in the metal composite was estimated to be 14° C. Since this glass transition temperature (Tg) was 6% of the saturated glass transition temperature (Tg), the resin composition was found to have not reached a semi-cured state at the end of the step 1-1.

Step 1-2:

In a parallel process to the step 1-1, the metal material 1 was placed inside an electric furnace EF as illustrated in FIG. 4 (*a*-2) and the preheating of the metal material 1 was started. The ambient temperature inside the electric furnace EF was 250° C.

Step 2:

About 1 minute after the heating of the sheet substrate and preheating of the metal material began, the metal material 1, taken out of the electric furnace EF, was laminated onto the sheet substrate 2 as illustrated in FIG. 4 (*b*) to produce a preform 10. Next, as illustrated in FIG. 4 (*c*), the preform 10 was compressed at 10 MPa for about 2 minutes by means of the upper mold 11 and the lower mold 12 to mold it into a metal composite A. During this process, a large amount of resin composition oozed out from the splitting line of the mold.

After about 2 minutes of compression, the mold was opened. However, the desired metal composite could not be obtained as part of the sheet substrate protruded out. Moreover, when ejecting the metal composite from the mold, the metal materials were found to have stuck to the mold, making it difficult to demold it as a composite material. For this reason, it was impossible to measure the bonding strength as described later.

The manufacturing conditions and evaluation results for Comparative example 3-(1) are shown in Table 23 and Table 24.

Comparative Example 3-(2)

A metal composite was produced and evaluated under the same conditions as Example 3-(2), except that the ambient temperature inside the electric furnace in the step 1-2 was changed to 130° C.

In the obtained metal composite, wrinkles were observed on the squeezed-side surface of the metal composite associated with its wavy shape, and squeezing did not go as deep as the troughs of the mold. As a result, the desired shape could not be obtained.

The manufacturing conditions and evaluation results for Comparative example 3-(2) are shown in Table 23 and Table 24.

Example 4-(1)

Production of Electronic Equipment Chassis

The metal composite A obtained in Example 1-(3) was placed inside an injection mold as illustrated in FIG. 8 (*a*). The injection mold consisted of a fixed-side mold 42 and movable-side mold 41, and an injection molding machine 43 was connected to the fixed-side mold 42. As the resin constituting part B, polyamide resin pellets (CM1001 manufactured by Toray Industries, Inc.) were furnished, and an electronic equipment chassis EH with a shape as shown in FIG. 8(*d*) was prepared using those pellets. Injection molding was carried out using an J350EIII injection molding machine 43 manufactured by The Japan Steel Works, Ltd., and the cylinder that injects the resin b constituting part B had a temperature of 260° C.

The manufacturing conditions and evaluation results for Example 4-(1) are shown in Table 25 and Table 26.

Example 4-(2)

Production of Electronic Equipment Chassis

The metal composite obtained in Example 1-(3) was insert injection-molded in the same manner as Example 4-(1) to produce an electronic equipment chassis. The manufacturing conditions and evaluation results for Example 4-(2) are shown in Table 25 and Table 26.

Example 4-(3)

Preparation of Resin Sheet

Using a melt-kneaded mixture of two types of nylon resin pellets (CM4000 and CM1001 manufactured by Toray Industries, Inc.), a resin film was prepared. The resin film was 50 µm thick. Melt-kneading was carried out using the TEX-30α manufactured by The Japan Steel Works, Ltd., with the cylinder temperature set to 260° C.

Preparation of Preform:

Using the above resin film in addition to the same sheet substrate and metal material as Example 4-(1), a preform with a metal material/sheet substrate/resin film laminate structure was prepared.

Production of Metal Composite:

In the same manner as Example 4-(1), except that the surface temperature of the lower mold was 150° C., the preform was placed inside a mold and heated and compressed simultaneously to produce a metal composite A.

Production of Electronic Equipment Chassis:

In the same manner as Example 4-(1), except that carbon fiber-reinforced plastic pellets (TLP1040 manufactured by Toray Industries, Inc.) were used as part B, insert injection molding was carried out to produce an electronic equipment chassis. The manufacturing conditions and evaluation results for Example 4-(3) are shown in Table 25 and Table 26.

Example 4-(4)

Preparation of Preform

Using the preform prepared in Example 4-(1) and the same resin film as Example 4-(3), a new preform with a metal material/sheet substrate/metal material/resin film laminate structure was prepared.

Production of Metal Composite:

In the same manner as Example 4-(1), except that the above preform was used, the preform was placed inside a mold and heated and compressed simultaneously to produce a metal composite.

Production of Electronic Equipment Chassis:

In the same manner as Example 4-(1), except that glass fiber-reinforced plastic pellets (CM1001G-20 manufactured by Toray Industries, Inc.) were used as part B, insert injection molding was carried out to produce an electronic equipment chassis. The manufacturing conditions and evaluation results for Example 4-(4) are shown in Table 27 and Table 28.

Example 4-(5)

Figure 12:
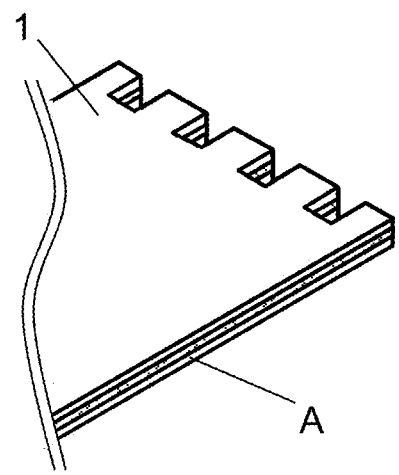
FIG. 12 is a partial schematic perspective-view drawing of an example of a metal composite provided with a match jointing treatment in Example 4-(5) of the present invention.

Production of Metal Composite:

A metal composite produced under the same conditions as Example 4-(1) was furnished. The edge of the prepared metal composite A was provided with a match jointing treatment with a repeated square notch pattern as illustrated in FIG. 12.

Production of Electronic Equipment Chassis:

In the same manner as Example 4-(1), except that a metal composite that had been provided with a match jointing treatment with a repeated square notch pattern along its edge was used, insert injection molding was carried out to produce an electronic equipment chassis. The manufacturing conditions and evaluation results for Example 4-(5) are shown in Table 27 and Table 28.

Example 4-(6)

Production of Electronic Equipment Chassis

A metal composite and nylon resin prepared in the same manner as Example 4-(1) were placed inside a press mold and press-molded to prepare an electronic equipment. The surface temperature of the mold was 260° C. both on the upper and lower sides. The manufacturing conditions and evaluation results for Example 4-(6) are shown in Table 27 and Table 28.

Example 4-(7)

Preparation of Thermosetting Resin Composition

A resin composition was prepared in the same manner as Example 4-(1), except that the Omicure 24 (2,4-toluene bis(dimethylurea), manufactured by PTI Japan Co., Ltd.), a curing accelerator, was not mixed in.

Preparation of Sheet Substrate:

A sheet substrate was prepared in the same manner as Example 4-(1), except that a thermosetting resin composition not containing a curing accelerator was used.

Using press molding equipment, the sheet substrate was placed on a plate with a surface temperature of 130° C. and simultaneously heated and compressed at 1 MPa for 10 minutes. The glass transition temperature (Tg) of the molding was measured and found to be 75° C. Since this glass transition temperature (Tg) was 52% of the saturated glass transition temperature (Tg), the resin was confirmed to be in a semi-cured state.

Preparation of Preform:

A preform was prepared by carrying out lamination in the same manner as Example 4-(1), except that the above sheet substrate was used.

Production of Metal Composite:

After being placed in a 150° C. hot air furnace and preheated for 10 minutes, the prepared preform was placed in a mold set under the same conditions as Example 4-(1). About 1 minute later, it was compressed at 10 MPa by means of an upper mold and lower mold.

After about 5 minutes of compression, the mold was opened, and the metal composite was taken out of it.

Production of Electronic Equipment Chassis:

In the same manner as Example 4-(1), insert injection molding was carried out to produce an electronic equipment chassis. The manufacturing conditions and evaluation results for Example 4-(7) are shown in Table 29 and Table 30.

Example 4-(8)

Figure 13:
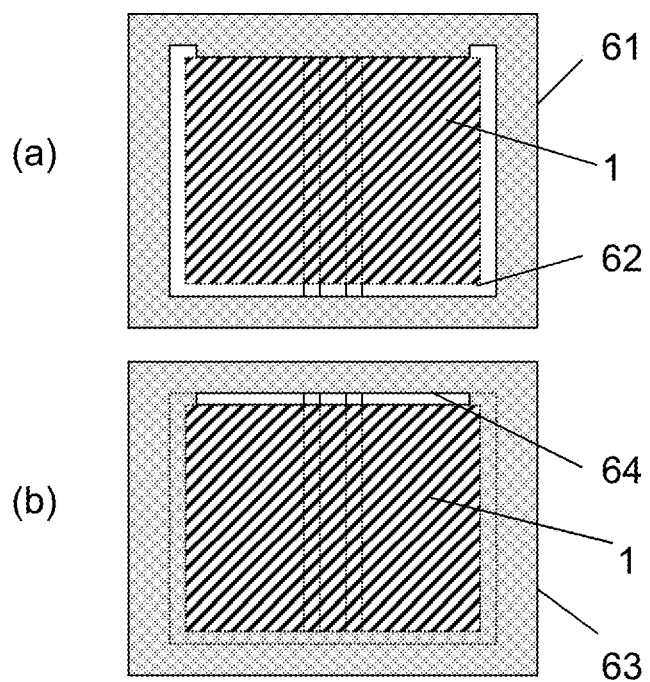
FIGS. 13 (a) and 13 (b) are a set of split-up schematic plan-view drawings of an example of a mold for injection molding used in Example 4-(8) of the present invention.

A metal composite produced in the same manner as Example 4-(1) was furnished. As illustrated in FIG. 13 (a), the insert placed inside an injection mold 61 was swapped, and a metal composite was placed inside an injection mold 61 whose molten resin flow channel had been closed off, with the flow channel 62 inside the mold filled with carbon fiber-reinforced plastic pellets used in Example 4-(3) to form rough three sides. After this, in addition to putting the interior of the injection mold into a state in which the flow channel 62 along rough three sides had been filled with resin pellets as illustrated in FIG. 13 (b), the metal composite whose rough three sides had been lined with injection molding material was placed inside a rectangular insert mold 63, along with a 1.5 mm-thick stainless steel plate, with flow channel 64 filled with the glass fiber-reinforced plastic pellets used in Example 4-(4) to form the remaining side by insert injection molding. In this manner, an electronic equipment chassis 33 as illustrated in FIG. 9 was produced. The manufacturing conditions and evaluation results for Example 4-(8) are shown in Table 29 and Table 30.

Example 4-(9)

The metal composite A obtained in Example 1-(12) was insert injection-molded in the same manner as Example 4-(1) to produce an electronic equipment chassis. The manufacturing conditions and evaluation results for Example 4-(9) are shown in Table 31 and Table 32.

Example 4-(10)

The metal composite A obtained in Example 1-(13) was insert injection-molded in the same manner as Example 4-(1) to produce an electronic equipment chassis. The manufacturing conditions and evaluation results for Example 4-(10) are shown in Table 31 and Table 32.

Comparative Example 4-(1)

Production of Metal Composite

A preform prepared in the same manner as Example 4-(1), except that the surface temperature of the mold was 130° C., was placed inside a mold and molded.

In the obtained metal composite, there was a misalignment between the metal materials, while a small amount of thermosetting resin had leaked out of the metal materials. Wrinkles were observed on the squeezed-side surface of the metal composite associated with its wavy shape, with surface cracks appearing in deeply squeezed areas. It was difficult to manually peel the metal materials apart. The manufacturing conditions and evaluation results for Comparative example 4-(1) are shown in Table 33 and Table 34.

Comparative Example 4-(2)

A preform prepared in the same manner as Example 4-(1), except that molding pressure was constantly 0.5 MPa, was placed inside a mold and molded. During this process, the mold did not become completely closed.

About 3 minutes after the preform was placed, the mold was opened, but the desired metal composite could not be obtained, so that it was impossible to produce an electronic equipment chassis. The manufacturing conditions and evaluation results for Comparative example 4-(2) are shown in Table 33 and Table 34.

Comparative Example 4-(3)

Preparation of Preform

Two 1.5 mm-thick aluminum alloy plate (A5052) on whose surfaces an alumite treatment had been provided were furnished for use as a preform. Numerous pores with an average size of 0.05 μm were observed on the surfaces of the aluminum alloy plates.

Production of Metal Composite:

In the same manner as Example 4-(1), except that the metal materials were used as the preform and that the molding pressure was set to 0.5 MPa, the preform was simultaneously heated and compressed.

About 3 minutes after the preform was placed, the mold was opened, but the, preform was found not to have taken the desired shape. When placed in an injection mold, the obtained metal composite did not allow it to close, so that it was impossible to produce an electronic equipment chassis.

The measurement method for the average size of pores on a metal material surface, measurement method for the bonding strength of a metal composite, and measurement methods for the weight and rigidity of an electronic equipment chassis used in Examples and Comparative examples are shown below:

Preparation Procedures for Observation Specimens:

Materials used and moldings obtained were cut to desired sizes using a cutter, diamond cutter, and the like for use as observation specimens. Where necessary, cross sections were subjected to a chemical polishing treatment to facilitate observation.

Evaluation Method 1

Measurement of Average Size of Pores on Metal Material Surface

Surfaces of metals used as metal materials were photographed at a magnification of 100× using the color 3D profile measuring microscopes model VK-9500 (controller unit)/VK-9510 (measurement unit) (manufactured by Keyence Corporation). From a photographed image, the average pore size was obtained by measuring diameters of a set of pores randomly selected from those that had formed on the metal surface, D(n) (n=1 to 100), using the analysis software VK-H1A9.

Evaluation Method 2

Measurement of Bonding Strength of Metal Composite

Figure 14:
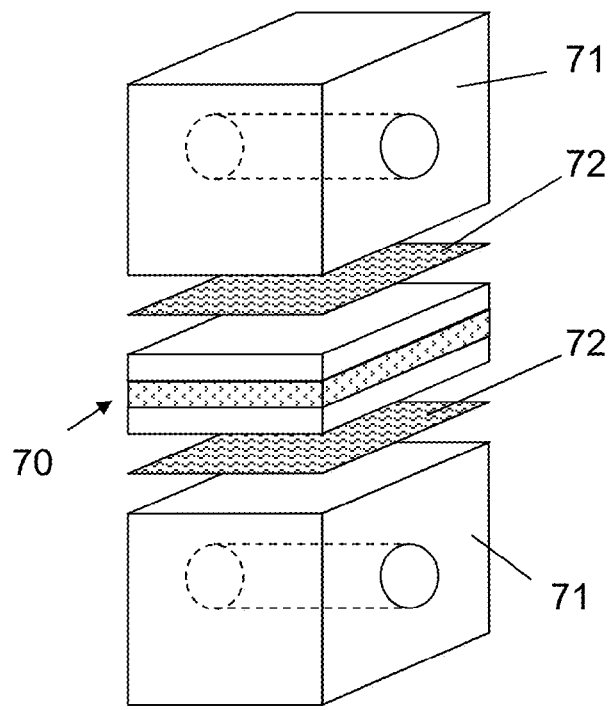
FIG. 14 is a schematic perspective-view drawing illustrating a specimen to measure the bonding strength of a metal composite of the present invention.

A 40 mm-square test piece 70 was cut from a smooth section of a produced metal composite A, and sand blasting was provided to roughen both surfaces, followed by a wiping off of oil content with acetone. A 40 mm-square aluminum alloy block 71 featuring a 10 mm-diam. through-hole was bonded onto one face of the test piece 70 using a structural epoxy resin (adhesive) 72 (TE-2220 manufactured by Toray Fine Chemicals Co., Ltd.). Another aluminum alloy block 71 was bonded onto the other face of the test piece 70 in the same manner to produce a bonding strength measurement specimen as illustrated in FIG. 14.

Using a tensile tester, an "Instron" (registered trademark) model 5565 universal testing machine (supplied by Instron Japan Co., Ltd.), a total of five evaluation specimens were tested at a tension speed of 1.6 mm/min by connecting the aluminum alloy block 71 to the top and bottom support jigs of the tester with pins, passed through the through-holes provided in the blocks. From the readings, the bonding strength S of the metal composite was calculated using formula (1) below. If the calculated bonding strength is 10 MPa or more, manual peeling is very difficult.

$$S = P/A \tag{1}$$

S: Bonding strength [MPa]
P: Maximum load [N]
A: Cross-sectional area of specimen [mm$^2$]

Evaluation Method 3

Measurement of Weight of Electric/Electronic Equipment Chassis

The weight of an electric/electronic equipment chassis obtained in an Example or Comparative example was measured using an electronic balance. Reference weight M was also calculated by assuming that the cavity of the mold used in Example or Comparative example was filled by a molding containing continuous reinforcement fibers and a thermosetting resin. From these values, the lightweighting rate was calculated using formula (2).

Evaluation results were graded as follows: 20% or more excellent, 10% or more and less than 20% good, 5% or more and less than 10% poor, and less than 5% unsatisfactory.

$$[(M-m)/M] \times 100 [\%] \quad (2)$$

Evaluation Method 4

Measurement of Rigidity of Electric/Electronic Equipment Chassis

Figure 15:
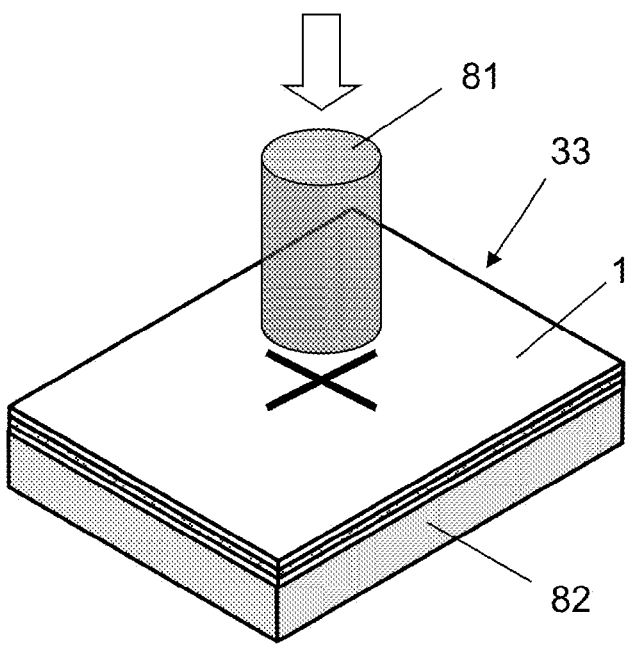
FIG. 15 is a schematic perspective-view drawing illustrating an example of the rigidity evaluation of an electronic equipment chassis of the present invention.

As illustrated in FIG. 15, an indenter 81, made of an R20 circular cylinder processed to be R100 at one end, was attached to the top of an "Instron" (registered trademark) model 5565 universal testing machine (supplied by Instron Japan Co., Ltd.) and moved to a position where its center coincided with the center of the top panel of the electric/electronic equipment chassis 33, placed on the top face of a support jig 82. The indenter 81 was then lowered at a descending speed of 1.6 mm/min to apply a load to the electric/electronic equipment chassis 33 by pressing down on it, and, as the load increased, its travel distance was measured. When the load measured reached 50 [N], the indenter 81 was stopped, and the distance it traveled from 0 [N] to 20 [N] was defined as deflection [mm] for use in rigidity evaluation.

Evaluation results were graded as follows: less than 0.3 [mm] excellent, 0.3 [mm] or more and less than 0.5 [mm] good, 0.5 [mm] or more and less than 0.7 [mm] poor, and 0.7 [mm] or more unsatisfactory.

TABLE 1

|  | Unit | Example 1-(1) | Example 1-(2) | Example 1-(3) |
|---|---|---|---|---|
| Laminate structure (top/bottom) |  | a2/a1/a2 | a2/a1/a2 | a2/a1/a2 |
| Metal composite A |  |  |  |  |
| Sheet substrate a1 |  |  |  |  |
| Composition of thermosetting resin |  |  |  |  |
| "Epikote" 828 | Parts by mass | 20 | 20 | 20 |
| "Epikote" 834 | Parts by mass | 20 | 20 | 20 |
| "Epikote" 1001 | Parts by mass | 25 | 25 | 25 |
| "Epikote" 154 | Parts by mass | 35 | 35 | 35 |
| F-a-type benzoxazine resin | Parts by mass |  |  |  |
| Resol-type phenol resin/ PHENOLITE 5010 | Parts by mass |  |  |  |
| Dicy7 (curing agent) | Parts by mass | 4 | 4 | 4 |
| DY9577 | Parts by mass |  |  |  |
| "Omicure" 24 (curing accelerator) | Parts by mass | 5 | 5 | 5 |
| Reinforcement fiber bundle | — | Carbon fiber | Carbon fiber | Carbon fiber |
| Degree of curing after 130° C. × 10 minutes | — | Cured state | Cured state | Cured state |
| Metal material a2 |  |  |  |  |
| Metal | — | Aluminum alloy | Magnesium alloy | Aluminum alloy |
| Thickness | mm | 0.5 | 0.5 | 0.5 |
| Surface treatment | — | Sand blasting | Sand blasting | Alumite treatment |
| Pore size | μm | 30 | 50 | 0.05 |
| Resin layer C |  |  |  |  |
| Thermoplastic resin c | — | — | — | — |
| Melting point or glass transition temperature | ° C. | — | — | — |
| Part B |  |  |  |  |
| Thermoplastic resin b | — | — | — | — |
| Reinforcement fiber | — | — | — | — |
| Melting point or glass transition temperature | ° C. | — | — | — |
| Volume specific resistance | Ω · cm | — | — | — |

TABLE 2

|  |  | Example 1-(1) | Example 1-(2) | Example 1-(3) |
|---|---|---|---|---|
| Molding Step 1 |  |  |  |  |
| Pressure | Mpa | 0.5 | 0.5 | 0.5 |
| Duration | min | 1 | 1 | 1 |
| Mold temperature: Upper mold | °C. | 220 | 210 | 220 |
| Mold temperature: Lower mold | °C. | 220 | 210 | 220 |
| Preheating temperature: Step 1-1 | °C. | — | — | — |
| Preheating temperature: Step 1-2 | °C. | — | — | — |
| Surface temperature of metal material | °C. | 215 | 200 | 215 |
| Degree of curing of thermosetting resin | % | 82 | 77 | 82 |
| Step 2 |  |  |  |  |
| Pressure | MPa | 10 | 15 | 10 |
| Duration | min | 2 | 2 | 2 |
| Degree of curing of thermosetting resin | % | 100 | 100 | 100 |
| Demolding | — | Problem free | Problem free | Problem free |
| Step 3 |  |  |  |  |
| Pressure | MPa | — | — | — |
| Duration | min | — | — | — |
| Mold temperature: Upper mold | °C. | — | — | — |
| Mold temperature: Lower mold | °C. | — | — | — |
| Surface temperature of metal material | °C. | — | — | — |
| Time taken to fall to 180° C. or less | min | — | — | — |
| Degree of curing of thermosetting resin | % | — | — | — |
| Demolding | — | — | — | — |
| Mold take-up time | min | 3 | 3 | 3 |
| After molding |  |  |  |  |
| Processing of metal composite A | — | — | — | — |
| Post cure |  | None | None | None |
| Technique to integrate A and B | — | — | — | — |
| Complex shaping of part B | — | — | — | — |
| Evaluation |  |  |  |  |
| Bonding strength of metal composite | MPa | 16 | 18 | 20 |
| Weight of metal composite A | — | — | — | — |
| Rigidity | — | — | — | — |

TABLE 3

|  | Unit | Example 1-(4) | Example 1-(5) | Example 1-(6) |
|---|---|---|---|---|
| Laminate structure (top/bottom) |  | a2/a1/a2 | a2/a1 | a2/a1/a2 |
| Metal composite A |  |  |  |  |
| Sheet substrate a1 |  |  |  |  |
| Composition of thermosetting resin |  |  |  |  |
| "Epikote" 828 | Parts by mass | 20 | 20 | 20 |
| "Epikote" 834 | Parts by mass | 20 | 20 | 20 |
| "Epikote" 1001 | Parts by mass | 25 | 25 | 25 |
| "Epikote" 154 | Parts by mass | 35 | 35 | 35 |
| F-a-type benzoxazine resin | Parts by mass |  |  |  |
| Resol-type phenol resin/ PHENOLITE 5010 | Parts by mass |  |  |  |

TABLE 3-continued

|  | Unit | Example 1-(4) | Example 1-(5) | Example 1-(6) |
|---|---|---|---|---|
| Dicy7 (curing agent) | Parts by mass | 4 | 4 | 4 |
| DY9577 | Parts by mass | | | |
| "Omicure" 24 (curing accelerator) | Parts by mass | 5 | 5 | 5 |
| Reinforcement fiber bundle | — | None | Carbon fiber | Carbon fiber |
| Degree of curing after 130° C. × 10 minutes | — | Cured state | Cured state | Cured state |
| Metal material a2 | | | | |
| Metal | — | Aluminum alloy | Aluminum alloy | Aluminum alloy |
| Thickness | mm | 0.5 | 0.5 | 0.5 |
| Surface treatment | — | Sand blasting | Sand blasting | Sand blasting |
| Pore size | μm | 30 | 30 | 30 |
| Resin layer C | | | | |
| Thermoplastic resin c | — | — | — | — |
| Melting point or glass transition temperature | ° C. | — | — | — |
| Part B | | | | |
| Thermoplastic resin b | — | — | — | — |
| Reinforcement fiber | — | — | — | — |
| Melting point or glass transition temperature | ° C. | — | — | — |
| Volume specific resistance | Ω · cm | — | — | — |

TABLE 4

|  |  | Example 1-(4) | Example 1-(5) | Example 1-(6) |
|---|---|---|---|---|
| Molding | | | | |
| Step 1 | | | | |
| Pressure | Mpa | 0.5 | 0.5 | 0.5 |
| Duration | min | 1 | 1 | 0.5 |
| Mold temperature: Upper mold | ° C. | 220 | 220 | 220 |
| Mold temperature: Lower mold | ° C. | 220 | 150 | 220 |
| Preheating temperature: Step 1-1 | ° C. | — | — | — |
| Preheating temperature: Step 1-2 | ° C. | — | — | — |
| Surface temperature of metal material | ° C. | 215 | 200 | 215 |
| Degree of curing of thermosetting resin | % | 82 | 85 | 53 |
| Step 2 | | | | |
| Pressure | MPa | 10 | 5 | 10 |
| Duration | min | 2 | 2 | 1 |
| Degree of curing of thermosetting resin | % | 100 | 100 | 100 |
| Demolding | — | Problem free | Problem free | Problem free |
| Step 3 | | | | |
| Pressure | MPa | — | — | — |
| Duration | min | — | — | — |
| Mold temperature: Upper mold | ° C. | — | — | — |
| Mold temperature: Lower mold | ° C. | — | — | — |
| Surface temperature of metal material | ° C. | — | — | — |
| Time taken to fall to 180° C. or less | min | — | — | — |
| Degree of curing of thermosetting resin | % | — | — | — |
| Demolding | — | — | — | — |
| Mold take-up time | min | 3 | 3 | 1.5 |

TABLE 4-continued

|  | Example 1-(4) | Example 1-(5) | Example 1-(6) |
|---|---|---|---|
| After molding |  |  |  |
| Processing of metal composite A | — | — | — |
| Post cure | None | None | None |
| Technique to integrate A and B | — | — | — |
| Complex shaping of part B | — | — | — |
| Evaluation |  |  |  |
| Bonding strength of metal composite (MPa) | 15 | 13 | 17 |
| Weight of metal composite A | — | — | — |
| Rigidity | — | — | — |

TABLE 5

|  | Unit | Example 1-(7) | Example 1-(8) | Example 1-(9) |
|---|---|---|---|---|
| Laminate structure (top/bottom) |  | a2/a1/a2 | a2/a1/a2 | a2/a1/a2 |
| Metal composite A |  |  |  |  |
| Sheet substrate a1 |  |  |  |  |
| Composition of thermosetting resin |  |  |  |  |
| "Epikote" 828 | Parts by mass |  |  | 20 |
| "Epikote" 834 | Parts by mass |  |  | 20 |
| "Epikote" 1001 | Parts by mass |  |  | 25 |
| "Epikote" 154 | Parts by mass |  |  | 35 |
| F-a-type benzoxazine resin | Parts by mass | 100 |  |  |
| Resol-type phenol resin/ PHENOLITE 5010 | Parts by mass |  | 100 |  |
| Dicy7 (curing agent) | Parts by mass |  |  | 4 |
| DY9577 | Parts by mass | 5 |  |  |
| "Omicure" 24 (curing accelerator) | Parts by mass |  |  | 5 |
| Reinforcement fiber bundle | — | Carbon fiber | Carbon fiber | Carbon fiber |
| Degree of curing after 130° C. × 10 minutes | — | Semi-cured state | Cured state | Cured state |
| Metal material a2 |  |  |  |  |
| Metal | — | Aluminum alloy | Aluminum alloy | Titanium alloy |
| Thickness | mm | 0.5 | 0.5 | 0.5 |
| Surface treatment | — | Sand blasting | Sand blasting | Sand blasting |
| Pore size | μm | 30 | 30 | 15 |
| Resin layer C |  |  |  |  |
| Thermoplastic resin c | — | — | — | — |
| Melting point or glass transition temperature | ° C. | — | — | — |
| Part B |  |  |  |  |
| Thermoplastic resin b | — | — | — | — |
| Reinforcement fiber | — | — | — | — |
| Melting point or glass transition temperature | ° C. | — | — | — |
| Volume specific resistance | Ω · cm | — | — | — |

TABLE 6

|  |  | Example 1-(7) | Example 1-(8) | Example 1-(9) |
|---|---|---|---|---|
| Molding Step 1 |  |  |  |  |
| Pressure | Mpa | 0.5 | 0.5 | 0.5 |
| Duration | min | 1 | 1 | 1 |
| Mold temperature: Upper mold | °C. | 220 | 220 | 240 |
| Mold temperature: Lower mold | °C. | 220 | 220 | 240 |
| Preheating temperature: Step 1-1 | °C. | — | — | — |
| Preheating temperature: Step 1-2 | °C. | — | — | — |
| Surface temperature of metal material | °C. | 215 | 215 | 238 |
| Degree of curing of thermosetting resin | % | 30 | 72 | 88 |
| Step 2 |  |  |  |  |
| Pressure | MPa | 10 | 10 | 15 |
| Duration | min | 2 | 2 | 2 |
| Degree of curing of thermosetting resin | % | 100 | 100 | 100 |
| Demolding | — | Problem free | Problem free | Problem free |
| Step 3 |  |  |  |  |
| Pressure | MPa | — | — | — |
| Duration | min | — | — | — |
| Mold temperature: Upper mold | °C. | — | — | — |
| Mold temperature: Lower mold | °C. | — | — | — |
| Surface temperature of metal material | °C. | — | — | — |
| Time taken to fall to 180° C. or less | min | — | — | — |
| Degree of curing of thermosetting resin | % | — | — | — |
| Demolding | — | — | — | — |
| Mold take-up time | min | 3 | 3 | 3 |
| After molding |  |  |  |  |
| Processing of metal composite A |  | — | — | — |
| Post cure |  | None | None | None |
| Technique to integrate A and B | — | — | — | — |
| Complex shaping of part B |  | — | — | — |
| Evaluation |  |  |  |  |
| Bonding strength of metal composite | MPa | 15 | 14 | 13 |
| Weight of metal composite A | — | — | — | — |
| Rigidity |  | — | — | — |

TABLE 7

|  | Unit | Example 1-(10) | Example 1-(11) |
|---|---|---|---|
| Laminate structure (top/bottom) |  | a2/a1/a2 | a2/a1 |
| Metal composite A |  |  |  |
| Sheet substrate a1 |  |  |  |
| Composition of thermosetting resin |  |  |  |
| "Epikote" 828 | Parts by mass | 20 | 20 |
| "Epikote" 834 | Parts by mass | 20 | 20 |
| "Epikote" 1001 | Parts by mass | 25 | 25 |
| "Epikote" 154 | Parts by mass | 35 | 35 |
| F-a-type benzoxazine resin | Parts by mass |  |  |
| Resol-type phenol resin/ PHENOLITE 5010 | Parts by mass |  |  |

TABLE 7-continued

|  | Unit | Example 1-(10) | Example 1-(11) |
|---|---|---|---|
| Dicy7 (curing agent) | Parts by mass | 4 | 4 |
| DY9577 | Parts by mass |  |  |
| "Omicure" 24 (curing accelerator) | Parts by mass | 5 | 5 |
| Reinforcement fiber bundle | — | Carbon fiber | Carbon fiber |
| Degree of curing after 130° C. × 10 minutes | — | Cured state | Cured state |
| Metal material a2 |  |  |  |
| Metal | — | Aluminum alloy | Aluminum alloy |
| Thickness | mm | 0.5 | 0.5 |
| Surface treatment | — | Sand blasting | Sand blasting |
| Pore size | μm | 30 | 30 |
| Resin layer C |  |  |  |
| Thermoplastic resin c | — | — | — |
| Melting point or glass transition temperature | ° C. | — | — |
| Part B |  |  |  |
| Thermoplastic resin b | — | — | — |
| Reinforcement fiber | — | — | — |
| Melting point or glass transition temperature | ° C. | — | — |
| Volume specific resistance | Ω · cm | — | — |

TABLE 8

|  | Unit | Example 1-(10) | Example 1-(11) |
|---|---|---|---|
| Molding |  |  |  |
| Step 1 |  |  |  |
| Pressure | Mpa | 0.5 | 0.5 |
| Duration | min | 1 | 1 |
| Mold temperature: Upper mold | ° C. | 190 | 220 |
| Mold temperature: Lower mold | ° C. | 190 | 150 |
| Preheating temperature: Step 1-1 | ° C. | — | — |
| Preheating temperature: Step 1-2 | ° C. | — | — |
| Surface temperature of metal material | ° C. | 185 | 215 |
| Degree of curing of thermosetting resin | % | 59 | 85 |
| Step 2 |  |  |  |
| Pressure | MPa | 12 | 5 |
| Duration | min | 2 | 2 |
| Degree of curing of thermosetting resin | % | 100 | 100 |
| Demolding | — | Problem free | Problem free |
| Step 3 |  |  |  |
| Pressure | MPa | — | — |
| Duration | min | — | — |
| Mold temperature: Upper mold | ° C. | — | — |
| Mold temperature: Lower mold | ° C. | — | — |
| Surface temperature of metal material | ° C. | — | — |
| Time taken to fall to 180° C. or less | min | — | — |
| Degree of curing of thermosetting resin | % | — | — |
| Demolding | — | — | — |
| Mold take-up time | min | 3 | 3 |
| After molding |  |  |  |
| Processing of metal composite A | — | — | — |
| Post cure | — | None | None |
| Technique to integrate A and B | — | — | — |
| Complex shaping of part B | — | — | — |
| Evaluation |  |  |  |
| Bonding strength of metal composite | MPa | 15 | 13 |
| Weight of metal composite A | — | — | — |
| Rigidity | — | — | — |

TABLE 9

|  | Unit | Example 1-(12) | Example 1-(13) |
|---|---|---|---|
| Laminate structure (top/bottom) |  | a2/a1/a2 | a2/a1/a2 |
| Metal composite A |  |  |  |
| Sheet substrate a1 |  |  |  |
| Composition of thermosetting resin |  |  |  |
| "Epikote" 828 | Parts by mass | 20 | 20 |
| "Epikote" 834 | Parts by mass | 20 | 20 |
| "Epikote" 1001 | Parts by mass | 25 | 25 |

TABLE 9-continued

|  | Unit | Example 1-(12) | Example 1-(13) |
|---|---|---|---|
| "Epikote" 154 | Parts by mass | 35 | 35 |
| F-a-type benzoxazine resin | Parts by mass |  |  |
| Resol-type phenol resin/ PHENOLITE 5010 | Parts by mass |  |  |
| Dicy7 (curing agent) | Parts by mass | 4 | 4 |
| DY9577 | Parts by mass |  |  |
| "Omicure" 24 (curing accelerator) | Parts by mass | 5 | 5 |
| Reinforcement fiber bundle | — | Carbon fiber | Carbon fiber |
| Degree of curing after 130° C. × 10 minutes | — | Cured state | Cured state |
| Metal material a2 |  |  |  |
| Metal | — | Aluminum | Titanium |
| Thickness | mm | 0.5 | 0.2 |
| Surface treatment | — | Sand blasting | Sand blasting |
| Pore size | μm | 30 | 15 |
| Resin layer C |  |  |  |
| Thermoplastic resin c | — | — | — |
| Melting point or glass transition temperature | ° C. | — | — |
| Part B |  |  |  |
| Thermoplastic resin b | — | — | — |
| Reinforcement fiber | — | — | — |
| Melting point or glass transition temperature | ° C. | — | — |
| Volume specific resistance | Ω · cm | — | — |

TABLE 10

|  |  | Example 1-(12) | Example 1-(13) |
|---|---|---|---|
| Molding |  |  |  |
| Step 1 |  |  |  |
| Pressure | MPa | 0.5 | 0.5 |
| Duration | min | 1 | 1 |
| Mold temperature: Upper mold | ° C. | 220 | 240 |
| Mold temperature: Lower mold | ° C. | 220 | 240 |
| Preheating temperature: Step 1-1 | ° C. | — | — |
| Preheating temperature: Step 1-2 | ° C. | — | — |
| Surface temperature of metal material | ° C. | 215 | 238 |
| Degree of curing of thermosetting resin | % | 82 | 88 |
| Step 2 |  |  |  |
| Pressure | MPa | 10 | 15 |
| Duration | min | 2 | 2 |
| Degree of curing of thermosetting resin | % | 100 | 100 |
| Demolding | — | Problem free | Problem free |
| Step 3 |  |  |  |
| Pressure | MPa | — | — |
| Duration | min | — | — |
| Mold temperature: Upper mold | ° C. | — | — |
| Mold temperature: Lower mold | ° C. | — | — |
| Surface temperature of metal material | ° C. | — | — |
| Time taken to fall to 180° C. or less | min | — | — |
| Degree of curing of thermosetting resin | % | — | — |
| Demolding | — | — | — |
| Mold take-up time | min | 3 | 3 |
| After molding |  |  |  |
| Processing of metal composite A | — | — | — |
| Post cure |  | None | None |
| Technique to integrate A and B | — | — | — |
| Complex shaping of part B | — | — | — |
| Evaluation |  |  |  |
| Bonding strength of metal composite | MPa | 16 | 13 |
| Weight of metal composite A | — | — | — |
| Rigidity | — | — | — |

TABLE 11

| | Unit | Comparative example 1-(1) | Comparative example 1-(2) | Comparative example 1-(3) |
|---|---|---|---|---|
| Laminate structure (top/bottom) Metal composite A Sheet substrate a1 Composition of thermosetting resin | | a2/a1/a2 | a2/a1/a2 | a2 |
| "Epikote" 828 | Parts by mass | 20 | 20 | |
| "Epikote" 834 | Parts by mass | 20 | 20 | |
| "Epikote" 1001 | Parts by mass | 25 | 25 | |
| "Epikote" 154 | Parts by mass | 35 | 35 | |
| F-a-type benzoxazine resin | Parts by mass | | | |
| Resol-type phenol resin/ PHENOLITE 5010 | Parts by mass | | | |
| Dicy7 (curing agent) | Parts by mass | 4 | 4 | |
| DY9577 | Parts by mass | | | |
| "Omicure" 24 (curing accelerator) | Parts by mass | 5 | 5 | |
| Reinforcement fiber bundle | — | Carbon fiber | Carbon fiber | None |
| Degree of curing after 130° C. × 10 minutes | — | Semi-cured state | Cured state | — |
| Metal material a2 | | | | |
| Metal | — | Aluminum alloy | Magnesium alloy | Aluminum alloy |
| Thickness | mm | 0.5 | 0.5 | 1.5 |
| Surface treatment | — | Sand blasting | Sand blasting | Alumite treatment |
| Pore size | μm | 30 | 50 | 0.05 |
| Resin layer C | | | | |
| Thermoplastic resin c | — | — | — | — |
| Melting point or glass transition temperature | ° C. | — | — | — |
| Part B | | | | |
| Thermoplastic resin b | — | — | — | — |
| Reinforcement fiber | — | — | — | — |
| Melting point or glass transition temperature | ° C. | — | — | — |
| Volume specific resistance | Ω · cm | — | — | — |

TABLE 12

| | | Comparative example 1-(1) | Comparative example 1-(2) | Comparative example 1-(3) |
|---|---|---|---|---|
| Molding Step 1 | | | | |
| Pressure | Mpa | 0.5 | 0.5 | 0.5 |
| Duration | min | 1 | 1 | 1 |
| Mold temperature: Upper mold | ° C. | 220 | 130 | 220 |
| Mold temperature: Lower mold | ° C. | 220 | 130 | 220 |
| Preheating temperature: Step 1-1 | ° C. | — | — | — |
| Preheating temperature: Step 1-2 | ° C. | — | — | — |
| Surface temperature of metal material | ° C. | 215 | 120 | 215 |
| Degree of curing of thermosetting resin | % | 6 | 12 | — |
| Step 2 | | | | |
| Pressure | MPa | 10 | 15 | 0.5 |
| Duration | min | 2 | 2 | 2 |
| Degree of curing of thermosetting resin | % | 52 | 22 | — |
| Demolding | — | Problematic | Problem free | Problem free |

TABLE 12-continued

|  |  | Comparative example 1-(1) | Comparative example 1-(2) | Comparative example 1-(3) |
|---|---|---|---|---|
| Step 3 |  |  |  |  |
| Pressure | MPa | — | — | — |
| Duration | min | — | — | — |
| Mold temperature: Upper mold | ° C. | — | — | — |
| Mold temperature: Lower mold | ° C. | — | — | — |
| Surface temperature of metal material | ° C. | — | — | — |
| Time taken to fall to 180° C. or less | min | — | — | — |
| Degree of curing of thermosetting resin | % | — | — | — |
| Demolding | — | — | — | — |
| Mold take-up time | min | 3 | 3 | 3 |
| After molding |  |  |  |  |
| Processing of metal composite A |  | — | — | — |
| Post cure |  | None | None | None |
| Technique to integrate A and B | — | — | — | — |
| Complex shaping of part B |  | — | — | — |
| Evaluation |  |  |  |  |
| Bonding strength of metal composite | MPa | Measurement not possible | 5 | Measurement not possible |
| Weight of metal composite A | — | — | — | — |
| Rigidity |  | — | — | — |

TABLE 13

|  | Unit | Example 2-(1) | Example 2-(2) | Example 2-(3) |
|---|---|---|---|---|
| Laminate structure (top/bottom) |  | a2/a1/a2 | a2/a1/a2 | a2/a1/a2 |
| Metal composite A |  |  |  |  |
| Sheet substrate a1 |  |  |  |  |
| Composition of thermosetting resin |  |  |  |  |
| "Epikote" 828 | Parts by mass | 20 | 20 | 20 |
| "Epikote" 834 | Parts by mass | 20 | 20 | 20 |
| "Epikote" 1001 | Parts by mass | 25 | 25 | 25 |
| "Epikote" 154 | Parts by mass | 35 | 35 | 35 |
| F-a-type benzoxazine resin | Parts by mass |  |  |  |
| Resol-type phenol resin/PHENOLITE 5010 | Parts by mass |  |  |  |
| Dicy7 (curing agent) | Parts by mass | 4 | 4 | 4 |
| DY9577 | Parts by mass |  |  |  |
| "Omicure" 24 (curing accelerator) | Parts by mass | 5 | 5 | 5 |
| Reinforcement fiber bundle | — | Carbon fiber | Carbon fiber | Carbon fiber |
| Degree of curing after 130° C. × 10 minutes | — | Cured state | Cured state | Cured state |
| Metal material a2 |  |  |  |  |
| Metal | — | Aluminum alloy | Magnesium alloy | Aluminum alloy |
| Thickness | mm | 0.5 | 0.5 | 0.5 |
| Surface treatment | — | Sand blasting | Sand blasting | Alumite treatment |
| Pore size | μm | 30 | 50 | 0.05 |
| Resin layer C |  |  |  |  |
| Thermoplastic resin c | — | — | — | — |
| Melting point or glass transition temperature | ° C. | — | — | — |

TABLE 13-continued

|  | Unit | Example 2-(1) | Example 2-(2) | Example 2-(3) |
|---|---|---|---|---|
| Part B |  |  |  |  |
| Thermoplastic resin b | — | — | — | — |
| Reinforcement fiber | — | — | — | — |
| Melting point or glass transition temperature | ° C. | — | — | — |
| Volume specific resistance | Ω · cm | — | — | — |

TABLE 14

|  |  | Example 2-(1) | Example 2-(2) | Example 2-(3) |
|---|---|---|---|---|
| Molding Step 1 |  |  |  |  |
| Pressure | Mpa | 0.5 | 0.5 | 0.5 |
| Duration | min | 1 | 1 | 1 |
| Mold temperature: Upper mold | ° C. | 220 | 210 | 220 |
| Mold temperature: Lower mold | ° C. | 220 | 210 | 220 |
| Preheating temperature: Step 1-1 | ° C. | — | — | — |
| Preheating temperature: Step 1-2 | ° C. | — | — | — |
| Surface temperature of metal material | ° C. | 215 | 200 | 215 |
| Degree of curing of thermosetting resin | % | 82 | 77 | 82 |
| Step 2 |  |  |  |  |
| Pressure | MPa | 10 | 15 | 10 |
| Duration | min | 1 | 1 | 1 |
| Degree of curing of thermosetting resin | % | — | — | — |
| Demolding | — | — | — | — |
| Step 3 |  |  |  |  |
| Pressure | MPa | 15 | 20 | 15 |
| Duration | min | 1 | 1 | 1 |
| Mold temperature: Upper mold | ° C. | 150 | 150 | 150 |
| Mold temperature: Lower mold | ° C. | 150 | 150 | 150 |
| Surface temperature of metal material | ° C. | 160 | 165 | 160 |
| Time taken to fall to 180° C. or less | min | 2 | 2 | 2 |
| Degree of curing of thermosetting resin | % | 100 | 100 | 100 |
| Demolding | — | Problem free | Problem free | Problem free |
| Mold take-up time | min | 5 | 5 | 5 |
| After molding |  |  |  |  |
| Processing of metal composite A |  | — | — | — |
| Post cure |  | None | None | None |
| Technique to integrate A and B | — | — | — | — |
| Complex shaping of part B |  | — | — | — |
| Evaluation |  |  |  |  |
| Bonding strength of metal composite | MPa | 16 | 18 | 20 |
| Weight of metal composite A | — | — | — | — |
| Rigidity |  | — | — | — |

TABLE 15

|  | Unit | Example 2-(4) | Example 2-(5) | Example 2-(6) |
|---|---|---|---|---|
| Laminate structure (top/bottom) |  | a2/a1/a2 | a2/a1 | a2/a1/a2 |
| Metal composite A |  |  |  |  |
| Sheet substrate a1 |  |  |  |  |
| Composition of thermosetting resin |  |  |  |  |
| "Epikote" 828 | Parts by mass | 20 | 20 | 20 |
| "Epikote" 834 | Parts by mass | 20 | 20 | 20 |
| "Epikote" 1001 | Parts by mass | 25 | 25 | 25 |
| "Epikote" 154 | Parts by mass | 35 | 35 | 35 |
| F-a-type benzoxazine resin | Parts by mass |  |  |  |
| Resol-type phenol resin/ PHENOLITE 5010 | Parts by mass |  |  |  |
| Dicy7 (curing agent) | Parts by mass | 4 | 4 | 4 |
| DY9577 | Parts by mass |  |  |  |
| "Omicure" 24 (curing accelerator) | Parts by mass | 5 | 5 | 5 |
| Reinforcement fiber bundle | — | None | Carbon fiber | Carbon fiber |
| Degree of curing after 130° C. × 10 minutes | — | Cured state | Cured state | Cured state |
| Metal material a2 |  |  |  |  |
| Metal | — | Aluminum alloy | Aluminum alloy | Aluminum alloy |
| Thickness | mm | 0.5 | 0.5 | 0.5 |
| Surface treatment | — | Sand blasting | Sand blasting | Sand blasting |
| Pore size | μm | 30 | 30 | 30 |
| Resin layer C |  |  |  |  |
| Thermoplastic resin c | — | — | — | — |
| Melting point or glass transition temperature | ° C. | — | — | — |
| Part B |  |  |  |  |
| Thermoplastic resin b | — | — | — | — |
| Reinforcement fiber | — | — | — | — |
| Melting point or glass transition temperature | ° C. | — | — | — |
| Volume specific resistance | Ω · cm | — | — | — |

TABLE 16

|  |  | Example 2-(4) | Example 2-(5) | Example 2-(6) |
|---|---|---|---|---|
| Molding |  |  |  |  |
| Step 1 |  |  |  |  |
| Pressure | Mpa | 0.5 | 0.5 | 0.5 |
| Duration | min | 1 | 1 | 1 |
| Mold temperature: Upper mold | ° C. | 220 | 220 | 220 |
| Mold temperature: Lower mold | ° C. | 220 | 150 | 220 |
| Preheating temperature: Step 1-1 | ° C. | — | — | — |
| Preheating temperature: Step 1-2 | ° C. | — | — | — |
| Surface temperature of metal material | ° C. | 215 | 215 | 215 |
| Degree of curing of thermosetting resin | % | 82 | 85 | 53 |
| Step 2 |  |  |  |  |
| Pressure | MPa | 10 | 5 | 10 |
| Duration | min | 1 | 1 | 0.5 |
| Degree of curing of thermosetting resin | % | — | — | — |
| Demolding |  | — | — | — |
| Step 3 |  |  |  |  |
| Pressure | MPa | 15 | 10 | 15 |
| Duration | min | 1 | 1 | 1 |

TABLE 16-continued

|  |  | Example 2-(4) | Example 2-(5) | Example 2-(6) |
|---|---|---|---|---|
| Mold temperature: Upper mold | ° C. | 150 | 150 | 170 |
| Mold temperature: Lower mold | ° C. | 150 | 150 | 170 |
| Surface temperature of metal material | ° C. | 160 | 165 | 175 |
| Time taken to fall to 180° C. or less | min | 2 | 2 | 1 |
| Degree of curing of thermosetting resin | % | 100 | 100 | 95 |
| Demolding | — | Problem free | Problem free | Problem free |
| Mold take-up time After molding | min | 5 | 5 | 3 |
| Processing of metal composite A |  | — | — | — |
| Post cure |  | None | None | 150° C. × 100 min |
| Technique to integrate A and B | — | — | — | — |
| Complex shaping of part B Evaluation | — | — | — | — |
| Bonding strength of metal composite | MPa | 15 | 13 | 17 |
| Weight of metal composite A | — | — | — | — |
| Rigidity |  | — | — | — |

TABLE 17

|  | Unit | Comparative example 2-(1) | Comparative example 2-(2) |
|---|---|---|---|
| Laminate structure (top/bottom) |  | a2/a1/a2 | a2/a1 |
| Metal composite A Sheet substrate a1 Composition of thermosetting resin |  |  |  |
| "Epikote" 828 | Parts by mass | 20 | 20 |
| "Epikote" 834 | Parts by mass | 20 | 20 |
| "Epikote" 1001 | Parts by mass | 25 | 25 |
| "Epikote" 154 | Parts by mass | 35 | 35 |
| F-a-type benzoxazine resin | Parts by mass |  |  |
| Resol-type phenol resin/ PHENOLITE 5010 | Parts by mass |  |  |
| Dicy7 (curing agent) | Parts by mass | 4 | 4 |
| DY9577 | Parts by mass |  |  |
| "Omicure" 24 (curing accelerator) | Parts by mass |  |  |
| Reinforcement fiber bundle | — | Carbon fiber | Carbon fiber |
| Degree of curing after 130° C. × 10 minutes | — | Semi-cured state | Cured state |
| Metal material a2 |  |  |  |
| Metal | — | Aluminum alloy | Magnesium alloy |
| Thickness | mm | 0.5 | 0.5 |
| Surface treatment | — | Sand blasting | Sand blasting |
| Pore size | μm | 30 | 50 |
| Resin layer C |  |  |  |
| Thermoplastic resin c | — | — | — |
| Melting point or glass transition temperature | ° C. | — | — |
| Part B |  |  |  |
| Thermoplastic resin b | — | — | — |
| Reinforcement fiber | — | — | — |
| Melting point or glass transition temperature | ° C. | — | — |
| Volume specific resistance | Ω · cm | — | — |

TABLE 18

|  | | Comparative example 2-(1) | Comparative example 2-(2) |
|---|---|---|---|
| Molding Step 1 | | | |
| Pressure | Mpa | 0.5 | 0.5 |
| Duration | min | 1 | 1 |
| Mold temperature: Upper mold | ° C. | 220 | 130 |
| Mold temperature: Lower mold | ° C. | 220 | 130 |
| Preheating temperature: Step 1-1 | ° C. | — | — |
| Preheating temperature: Step 1-2 | ° C. | — | — |
| Surface temperature of metal material | ° C. | 215 | 125 |
| Degree of curing of thermosetting resin | % | 6 | 12 |
| Step 2 | | | |
| Pressure | MPa | 10 | 15 |
| Duration | min | 3 | 3 |
| Degree of curing of thermosetting resin | % | 56 | 22 |
| Demolding | — | Problematic | Problematic |
| Step 3 | | | |
| Pressure | MPa | — | — |
| Duration | min | — | — |
| Mold temperature: Upper mold | ° C. | — | — |
| Mold temperature: Lower mold | ° C. | — | — |
| Surface temperature of metal material | ° C. | — | — |
| Time taken to fall to 180° C. or less | min | — | — |
| Degree of curing of thermosetting resin | % | — | — |
| Demolding | — | — | — |
| Mold take-up time | min | 4 | 4 |
| After molding | | | |
| Processing of metal composite A | | — | — |
| Post cure | | None | None |
| Technique to integrate A and B | | — | — |
| Complex shaping of part B | | — | — |
| Evaluation | | | |
| Bonding strength of metal composite | MPa | Measurement not possible | Measurement not possible |
| Weight of metal composite A | | — | — |
| Rigidity | | — | — |

TABLE 19

|  | Unit | Example 3-(1) | Example 3-(2) | Example 3-(3) |
|---|---|---|---|---|
| Laminate structure (top/bottom) | | a2/a1 | a2/a1 | a2/a1 |
| Metal composite A | | | | |
| Sheet substrate a1 | | | | |
| Composition of thermosetting resin | | | | |
| "Epikote" 828 | Parts by mass | 20 | 20 | 20 |
| "Epikote" 834 | Parts by mass | 20 | 20 | 20 |
| "Epikote" 1001 | Parts by mass | 25 | 25 | 25 |
| "Epikote" 154 | Parts by mass | 35 | 35 | 35 |
| F-a-type benzoxazine resin | Parts by mass | | | |

TABLE 19-continued

|  | Unit | Example 3-(1) | Example 3-(2) | Example 3-(3) |
|---|---|---|---|---|
| Resol-type phenol resin/ PHENOLITE 5010 | Parts by mass |  |  |  |
| Dicy7 (curing agent) DY9577 | Parts by mass | 4 | 4 | 4 |
| "Omicure" 24 (curing accelerator) | Parts by mass | 5 | 5 | 5 |
| Reinforcement fiber bundle | — | Carbon fiber | Carbon fiber | Carbon fiber |
| Degree of curing after 130° C. × 10 minutes | — | Cured state | Cured state | Cured state |
| Metal material a2 |  |  |  |  |
| Metal | — | Aluminum alloy | Magnesium alloy | Aluminum alloy |
| Thickness | mm | 0.5 | 0.5 | 0.5 |
| Surface treatment | — | Sand blasting | Sand blasting | Alumite treatment |
| Pore size | μm | 30 | 50 | 0.05 |
| Resin layer C |  |  |  |  |
| Thermoplastic resin c | — | — | — | — |
| Melting point or glass transition temperature | ° C. | — | — | — |
| Part B |  |  |  |  |
| Thermoplastic resin b | — | — | — | — |
| Reinforcement fiber | — | — | — | — |
| Melting point or glass transition temperature | ° C. | — | — | — |
| Volume specific resistance | Ω · cm | — | — | — |

TABLE 20

|  |  | Example 3-(1) | Example 3-(2) | Example 3-(3) |
|---|---|---|---|---|
| Molding |  |  |  |  |
| Step 1 |  |  |  |  |
| Pressure | Mpa | 0.5 | 0.5 | 0.5 |
| Duration | min | 1 | 1 | 1 |
| Mold temperature: Upper mold | ° C. | 150 | 150 | 150 |
| Mold temperature: Lower mold | ° C. | 150 | 150 | 150 |
| Preheating temperature: Step 1-1 | ° C. | 150 | 150 | 150 |
| Preheating temperature: Step 1-2 | ° C. | 250 | 250 | 250 |
| Surface temperature of metal material | ° C. | 245 | 240 | 245 |
| Degree of curing of thermosetting resin | % | 57 | 57 | 57 |
| Step 2 |  |  |  |  |
| Pressure | MPa | 10 | 20 | 10 |
| Duration | min | 2 | 2 | 2 |
| Degree of curing of thermosetting resin | % | 100 | 100 | 100 |
| Demolding | — | Problem free | Problem free | Problem free |
| Step 3 |  |  |  |  |
| Pressure | MPa | — | — | — |
| Duration | min | — | — | — |
| Mold temperature: Upper mold | ° C. | — | — | — |
| Mold temperature: Lower mold | ° C. | — | — | — |
| Surface temperature of metal material | ° C. | — | — | — |
| Time taken to fall to 180° C. or less | min | — | — | — |
| Degree of curing of thermosetting resin | % | — | — | — |

TABLE 20-continued

|  |  | Example 3-(1) | Example 3-(2) | Example 3-(3) |
|---|---|---|---|---|
| Demolding |  | — | — | — |
| Mold take-up time | min | 3 | 3 | 3 |
| After molding |  |  |  |  |
| Processing of metal composite A |  | — | — | — |
| Post cure |  | None | None | None |
| Technique to integrate A and B |  | — | — | — |
| Complex shaping of part B |  | — | — | — |
| Evaluation |  |  |  |  |
| Bonding strength of metal composite | MPa | 14 | 16 | 18 |
| Weight of metal composite A |  | — | — | — |
| Rigidity |  | — | — | — |

TABLE 21

|  | Unit | Example 3-(4) | Example 3-(5) | Example 3-(6) |
|---|---|---|---|---|
| Laminate structure (top/bottom) |  | a2/a1 | a2/a1 | a2/a1/a2 |
| Metal composite A |  |  |  |  |
| Sheet substrate a1 |  |  |  |  |
| Composition of thermosetting resin |  |  |  |  |
| "Epikote" 828 | Parts by mass | 20 | 20 | 20 |
| "Epikote" 834 | Parts by mass | 20 | 20 | 20 |
| "Epikote" 1001 | Parts by mass | 25 | 25 | 25 |
| "Epikote" 154 | Parts by mass | 35 | 35 | 35 |
| F-a-type benzoxazine resin | Parts by mass |  |  |  |
| Resol-type phenol resin/ PHENOLITE 5010 | Parts by mass |  |  |  |
| Dicy7 (curing agent) | Parts by mass | 4 | 4 | 4 |
| DY9577 | Parts by mass |  |  |  |
| "Omicure" 24 (curing accelerator) | Parts by mass | 5 | 5 | 5 |
| Reinforcement fiber bundle | — | None | Carbon fiber | Carbon fiber |
| Degree of curing after 130° C. × 10 minutes | — | Cured state | Cured state | Cured state |
| Metal material a2 |  |  |  |  |
| Metal | — | Aluminum alloy | Magnesium alloy | Aluminum alloy |
| Thickness | mm | 0.5 | 0.5 | 0.5 |
| Surface treatment | — | Sand blasting | Sand blasting | Alumite treatment |
| Pore size | μm | 30 | 30 | 30 |
| Resin layer C |  |  |  |  |
| Thermoplastic resin c | — | — | — | — |
| Melting point or glass transition temperature | ° C. | — | — | — |
| Part B |  |  |  |  |
| Thermoplastic resin b | — | — | — | — |
| Reinforcement fiber | — | — | — | — |
| Melting point or glass transition temperature | ° C. | — | — | — |
| Volume specific resistance | Ω · cm | — | — | — |

TABLE 22

|  |  | Example 3-(4) | Example 3-(5) | Example 3-(6) |
|---|---|---|---|---|
| Molding Step 1 |  |  |  |  |
| Pressure | Mpa | 0.5 | 0.5 | 0.5 |
| Duration | min | 1 | 0.5 | 1 |
| Mold temperature: Upper mold | °C. | 150 | 150 | 150 |
| Mold temperature: Lower mold | °C. | 150 | 150 | 150 |
| Preheating temperature: Step 1-1 | °C. | 150 | 150 | 150 |
| Preheating temperature: Step 1-2 | °C. | 250 | 250 | 250 |
| Surface temperature of metal material | °C. | 245 | 245 | 245 |
| Degree of curing of thermosetting resin | % | 57 | 53 | 57 |
| Step 2 |  |  |  |  |
| Pressure | MPa | 10 | 10 | 10 |
| Duration | min | 2 | 1 | 2 |
| Degree of curing of thermosetting resin | % | 100 | 95 | 100 |
| Demolding | — | Problem free | Problem free | Problem free |
| Step 3 |  |  |  |  |
| Pressure | MPa | — | — | — |
| Duration | min | — | — | — |
| Mold temperature: Upper mold | °C. | — | — | — |
| Mold temperature: Lower mold | °C. | — | — | — |
| Surface temperature of metal material | °C. | — | — | — |
| Time taken to fall to 180° C. or less | min | — | — | — |
| Degree of curing of thermosetting resin | % | — | — | — |
| Demolding | — | — | — | — |
| Mold take-up time | min | 3 | 1.5 | 2 |
| After molding |  |  |  |  |
| Processing of metal composite A |  | — | — | — |
| Post cure |  | None | 150° C. × 10 min | None |
| Technique to integrate A and B | — | — | — | — |
| Complex shaping of part B |  | — | — | — |
| Evaluation |  |  |  |  |
| Bonding strength of metal composite | MPa | 14 | 17 | 16 |
| Weight of metal composite A | — | — | — | — |
| Rigidity |  | — | — | — |

TABLE 23

|  | Unit | Example 3-(7) | Comparative example 3-(1) | Comparative example 3-(2) |
|---|---|---|---|---|
| Laminate structure (top/bottom) |  | a2/a1/a2 | a2/a1 | a2/a1 |
| Metal composite A |  |  |  |  |
| Sheet substrate a1 |  |  |  |  |
| Composition of thermosetting resin |  |  |  |  |
| "Epikote" 828 | Parts by mass | 20 | 20 | 20 |
| "Epikote" 834 | Parts by mass | 20 | 20 | 20 |
| "Epikote" 1001 | Parts by mass | 25 | 25 | 25 |
| "Epikote" 154 | Parts by mass | 35 | 35 | 35 |
| F-a-type benzoxazine resin | Parts by mass |  |  |  |

TABLE 23-continued

|  | Unit | Example 3-(7) | Comparative example 3-(1) | Comparative example 3-(2) |
|---|---|---|---|---|
| Resol-type phenol resin/ PHENOLITE 5010 | Parts by mass |  |  |  |
| Dicy7 (curing agent) DY9577 | Parts by mass | 4 | 4 | 4 |
| "Omicure" 24 (curing accelerator) | Parts by mass |  |  | 5 |
| Reinforcement fiber bundle | — | Carbon fiber | Carbon fiber | Carbon fiber |
| Degree of curing after 130° C. × 10 minutes | — | Semi-cured state | Semi-cured state | Cured state |
| Metal material a2 |  |  |  |  |
| Metal | — | Aluminum alloy | Aluminum alloy | Magnesium alloy |
| Thickness | mm | 0.5 | 0.5 | 0.5 |
| Surface treatment | — | Sand blasting | Sand blasting | Sand blasting |
| Pore size | μm | 30 | 30 | 50 |
| Resin layer C |  |  |  |  |
| Thermoplastic resin c | — | — | — | — |
| Melting point or glass transition temperature | ° C. | — | — | — |
| Part B |  |  |  |  |
| Thermoplastic resin b | — | — | — | — |
| Reinforcement fiber | — | — | — | — |
| Melting point or glass transition temperature | ° C. | — | — | — |
| Volume specific resistance | Ω·cm | — | — | — |

TABLE 24

|  |  | Example 3-(7) | Comparative example 3-(1) | Comparative example 3-(2) |
|---|---|---|---|---|
| Molding Step 1 |  |  |  |  |
| Pressure | Mpa | 0.5 | 0.5 | 0.5 |
| Duration | min | 20 | 1 | 1 |
| Mold temperature: Upper mold | ° C. | 150 | 150 | 130 |
| Mold temperature: Lower mold | ° C. | 150 | 150 | 130 |
| Preheating temperature: Step 1-1 | ° C. | 150 | 150 | 130 |
| Preheating temperature: Step 1-2 | ° C. | 250 | 250 | 250 |
| Surface temperature of metal material | ° C. | 250 | 245 | 120 |
| Degree of curing of thermosetting resin | % | 86 | 6 | 12 |
| Step 2 |  |  |  |  |
| Pressure | MPa | 10 | 10 | 10 |
| Duration | min | 2 | 2 | 2 |
| Degree of curing of thermosetting resin | % | 100 | 48 | 22 |
| Demolding | — | Problem free | Problematic | Problematic |
| Step 3 |  |  |  |  |
| Pressure | MPa | — | — | — |
| Duration | min | — | — | — |
| Mold temperature: Upper mold | ° C. | — | — | — |
| Mold temperature: Lower mold | ° C. | — | — | — |
| Surface temperature of metal material | ° C. | — | — | — |
| Time taken to fall to 180° C. or less | min | — | — | — |
| Degree of curing of thermosetting resin | % | — | — | — |

TABLE 24-continued

|  |  | Example 3-(7) | Comparative example 3-(1) | Comparative example 3-(2) |
|---|---|---|---|---|
| Demolding |  | — | — | — |
| Mold take-up time | min | 22 | 3 | 3 |
| After molding |  |  |  |  |
| Processing of metal composite A |  | — | — | — |
| Post cure |  | None | None | None |
| Technique to integrate A and B | — | — | — | — |
| Complex shaping of part B | — | — | — | — |
| Evaluation |  |  |  |  |
| Bonding strength of metal composite | MPa | 16 | Measurement not possible | 4 |
| Weight of metal composite A | — | — | — | — |
| Rigidity | — | — | — | — |

TABLE 25

|  | Unit | Example 4-(1) | Example 4-(2) | Example 4-(3) |
|---|---|---|---|---|
| Laminate structure (top/bottom) |  | a2/a1/a2 | a2/a1/a2 | a2/a1/c |
| Metal composite A |  |  |  |  |
| Sheet substrate a1 |  |  |  |  |
| Composition of thermosetting resin |  |  |  |  |
| "Epikote" 828 | Parts by mass | 20 | 20 | 20 |
| "Epikote" 834 | Parts by mass | 20 | 20 | 20 |
| "Epikote" 1001 | Parts by mass | 25 | 25 | 25 |
| "Epikote" 154 | Parts by mass | 35 | 35 | 35 |
| F-a-type benzoxazine resin | Parts by mass |  |  |  |
| Resol-type phenol resin/ PHENOLITE 5010 | Parts by mass |  |  |  |
| Dicy7 (curing agent) | Parts by mass | 4 | 4 | 4 |
| DY9577 | Parts by mass |  |  |  |
| "Omicure" 24 (curing accelerator) | Parts by mass | 5 | 5 | 5 |
| Reinforcement fiber bundle | — | Carbon fiber | Carbon fiber | Carbon fiber |
| Degree of curing after 130° C. × 10 minutes | — | Cured state | Cured state | Cured state |
| Metal material a2 |  |  |  |  |
| Metal | — | Aluminum alloy | Magnesium alloy | Aluminum alloy |
| Thickness | mm | 0.5 | 0.5 | 0.5 |
| Surface treatment | — | Alumite treatment | Sand blasting | Alumite treatment |
| Pore size | μm | 0.05 | 50 | 0.05 |
| Resin layer C |  |  |  |  |
| Thermoplastic resin c | — | None | None | Polyamide |
| Melting point or glass transition temperature | ° C. | None | None | 155 |
| Part B |  |  |  |  |
| Thermoplastic resin b | — | Polyamide | Polyamide | Polyamide |
| Reinforcement fiber | — | None | None | Carbon fiber |
| Melting point or glass transition temperature | ° C. | 225 | 225 | 225 |
| Volume specific resistance | Ω · cm | Out of scale | Out of scale | 101 |

TABLE 26

|  |  | Example 4-(1) | Example 4-(2) | Example 4-(3) |
|---|---|---|---|---|
| Molding |  |  |  |  |
| Step 1 |  |  |  |  |
| Pressure | Mpa | 0.5 | 0.5 | 0.5 |
| Duration | min | 1 | 1 | 1 |
| Mold temperature: Upper mold | ° C. | 220 | 210 | 220 |
| Mold temperature: Lower mold | ° C. | 220 | 210 | 150 |
| Preheating temperature: Step 1-1 | ° C. | — | — | — |
| Preheating temperature: Step 1-2 | ° C. | — | — | — |
| Surface temperature of metal material | ° C. | 215 | 200 | 215 |
| Degree of curing of thermosetting resin | % | 82 | 77 | 85 |
| Step 2 |  |  |  |  |
| Pressure | MPa | 10 | 10 | 5 |
| Duration | min | 2 | 2 | 2 |
| Degree of curing of thermosetting resin | % | 100 | 100 | 100 |
| Demolding | — | Problem free | Problem free | Problem free |
| Step 3 |  |  |  |  |
| Pressure | MPa | — | — | — |
| Duration | min | — | — | — |
| Mold temperature: Upper mold | ° C. | — | — | — |
| Mold temperature: Lower mold | ° C. | — | — | — |
| Surface temperature of metal material | ° C. | — | — | — |
| Time taken to fall to 180° C. or less | min | — | — | — |
| Degree of curing of thermosetting resin | % | — | — | — |
| Demolding | — | — | — | — |
| Mold take-up time | min | 3 | 3 | 3 |
| After molding |  |  |  |  |
| Processing of metal composite A | | None | None | None |
| Post cure | | — | — | — |
| Technique to integrate A and B | — | Injection molding | Injection molding | Injection molding |
| Complex shaping of part B | — | Frame, rib | Frame, rib | Frame, rib |
| Evaluation |  |  |  |  |
| Bonding strength of metal composite | MPa | 16 | 18 | 16 |
| Weight of metal composite A | — | Good | Excellent | Good |
| Rigidity | — | Excellent | Excellent | Good |

TABLE 27

|  | Unit | Example 4-(4) | Example 4-(5) | Example 4-(6) |
|---|---|---|---|---|
| Laminate structure (top/bottom) |  | a2/a1/c | a2/a1/a2 | a2/a1/a2 |
| Metal composite A |  |  |  |  |
| Sheet substrate a1 |  |  |  |  |
| Composition of thermosetting resin |  |  |  |  |
| "Epikote" 828 | Parts by mass | 20 | 20 | 20 |
| "Epikote" 834 | Parts by mass | 20 | 20 | 20 |
| "Epikote" 1001 | Parts by mass | 25 | 25 | 25 |
| "Epikote" 154 | Parts by mass | 35 | 35 | 35 |
| F-a-type benzoxazine resin | Parts by mass |  |  |  |
| Resol-type phenol resin/ PHENOLITE 5010 | Parts by mass |  |  |  |

TABLE 27-continued

|  | Unit | Example 4-(4) | Example 4-(5) | Example 4-(6) |
|---|---|---|---|---|
| Dicy7 (curing agent) | Parts by mass | 4 | 4 | 4 |
| DY9577 | Parts by mass |  |  |  |
| "Omicure" 24 (curing accelerator) | Parts by mass | 5 | 5 | 5 |
| Reinforcement fiber bundle | — | Carbon fiber | Carbon fiber | Carbon fiber |
| Degree of curing after 130° C. × 10 minutes | — | Cured state | Cured state | Cured state |
| Metal material a2 |  |  |  |  |
| Metal | — | Aluminum alloy | Aluminum alloy | Aluminum alloy |
| Thickness | mm | 0.5 | 0.5 | 0.5 |
| Surface treatment | — | Alumite treatment | Alumite treatment | Alumite treatment |
| Pore size | μm | 0.05 | 0.05 | 0.05 |
| Resin layer C |  |  |  |  |
| Thermoplastic resin c | — | Polyamide | None | None |
| Melting point or glass transition temperature | ° C. | 198 | None | None |
| Part B |  |  |  |  |
| Thermoplastic resin b | — | Polyamide | Polyamide | Polyamide |
| Reinforcement fiber | — | Glass fiber | None | None |
| Melting point or glass transition temperature | ° C. | 225 | 225 | 225 |
| Volume specific resistance | Ω · cm | Out of scale | Out of scale | Out of scale |

TABLE 28

|  |  | Example 4-(4) | Example 4-(5) | Example 4-(6) |
|---|---|---|---|---|
| Molding Step 1 |  |  |  |  |
| Pressure | Mpa | 0.5 | 0.5 | 0.5 |
| Duration | min | 1 | 1 | 1 |
| Mold temperature: Upper mold | ° C. | 220 | 220 | 220 |
| Mold temperature: Lower mold | ° C. | 220 | 220 | 150 |
| Preheating temperature: Step 1-1 | ° C. | — | — | — |
| Preheating temperature: Step 1-2 | ° C. | — | — | — |
| Surface temperature of metal material | ° C. | 215 | 215 | 215 |
| Degree of curing of thermosetting resin | % | 82 | 82 | 82 |
| Step 2 |  |  |  |  |
| Pressure | MPa | 10 | 10 | 10 |
| Duration | min | 2 | 2 | 2 |
| Degree of curing of thermosetting resin | % | 100 | 100 | 100 |
| Demolding | — | Problem free | Problem free | Problem free |
| Step 3 |  |  |  |  |
| Pressure | MPa | — | — | — |
| Duration | min | — | — | — |
| Mold temperature: Upper mold | ° C. | — | — | — |
| Mold temperature: Lower mold | ° C. | — | — | — |
| Surface temperature of metal material | ° C. | — | — | — |
| Time taken to fall to 180° C. or less | min | — | — | — |
| Degree of curing of thermosetting resin | % | — | — | — |
| Demolding | — | — | — | — |
| Mold take-up time | min | 3 | 3 | 3 |

TABLE 28-continued

|  | | Example 4-(4) | Example 4-(5) | Example 4-(6) |
|---|---|---|---|---|
| After molding | | | | |
| Processing of metal composite A | | None | Match jointing treatment | None |
| Post cure | | — | — | — |
| Technique to integrate A and B | | Injection molding | Injection molding | Press molding |
| Complex shaping of part B | | Frame, rib | Frame, rib | Frame, rib |
| Evaluation | | | | |
| Bonding strength of metal composite | MPa | 16 | 16 | 17 |
| Weight of metal composite A | — | Good | Good | Good |
| Rigidity | — | Excellent | Excellent | Excellent |

TABLE 29

|  | Unit | Example 4-(7) | Example 4-(8) |
|---|---|---|---|
| Laminate structure (top/bottom) | | a2/a1/a2 | a2/a1/a2 |
| Metal composite A | | | |
| Sheet substrate a1 | | | |
| Composition of thermosetting resin | | | |
| "Epikote" 828 | Parts by mass | 20 | 20 |
| "Epikote" 834 | Parts by mass | 20 | 20 |
| "Epikote" 1001 | Parts by mass | 25 | 25 |
| "Epikote" 154 | Parts by mass | 35 | 35 |
| F-a-type benzoxazine resin | Parts by mass | | |
| Resol-type phenol resin/ PHENOLITE 5010 | Parts by mass | | |
| Dicy7 (curing agent) | Parts by mass | 4 | 4 |
| DY9577 | Parts by mass | | |
| "Omicure" 24 (curing accelerator) | Parts by mass | | 5 |
| Reinforcement fiber bundle | — | Carbon fiber | Carbon fiber |
| Degree of curing after 130° C. × 10 minutes | — | Semi-cured state | Cured state |
| Metal material a2 | | | |
| Metal | — | Aluminum alloy | Aluminum alloy |
| Thickness | mm | 0.5 | 0.5 |
| Surface treatment | — | Alumite treatment | Alumite treatment |
| Pore size | μm | 0.05 | 0.05 |
| Resin layer C | | | |
| Thermoplastic resin c | — | None | None |
| Melting point or glass transition temperature | ° C. | None | None |
| Part B | | | |
| Thermoplastic resin b | — | Polyamide | Polyamide |
| Reinforcement fiber | — | Glass fiber | Carbon fiber/ Glass fiber |
| Melting point or glass transition temperature | ° C. | 225 | 225 |
| Volume specific resistance | Ω · cm | Out of scale | Out of scale |

TABLE 30

| | | Example 4-(7) | Example 4-(8) |
|---|---|---|---|
| Molding Step 1 | | | |
| Pressure | Mpa | 0.5 | 0.5 |
| Duration | min | 1 | 1 |
| Mold temperature: Upper mold | °C. | 220 | 220 |
| Mold temperature: Lower mold | °C. | 220 | 220 |
| Preheating temperature: Step 1-1 | °C. | 150° C. × 10 min (Hot air furnace) | — |
| Preheating temperature: Step 1-2 | °C. | 150° C. × 10 min (Hot air furnace) | — |
| Surface temperature of metal material | °C. | 215 | 215 |
| Degree of curing of thermosetting resin | % | 85 | 82 |
| Step 2 | | | |
| Pressure | MPa | 10 | 10 |
| Duration | min | 2 | 2 |
| Degree of curing of thermosetting resin | % | 100 | 100 |
| Demolding | — | Problem free | Problem free |
| Step 3 | | | |
| Pressure | MPa | — | — |
| Duration | min | — | — |
| Mold temperature: Upper mold | °C. | — | — |
| Mold temperature: Lower mold | °C. | — | — |
| Surface temperature of metal material | °C. | — | — |
| Time taken to fall to 180° C. or less | min | — | — |
| Degree of curing of thermosetting resin | % | — | — |
| Demolding | — | — | — |
| Mold take-up time | min | 3 | 3 |
| After molding | | | |
| Processing of metal composite A | | None | None |
| Post cure | | — | — |
| Technique to integrate A and B | — | Injection molding | Injection molding |
| Complex shaping of part B | | Frame, rib | Frame, rib |
| Evaluation | | | |
| Bonding strength of metal composite | MPa | 16 | 16 |
| Weight of metal composite A | — | Good | Good |
| Rigidity | — | Excellent | Excellent |

TABLE 31

| | Unit | Example 4-(9) | Example 4-(10) |
|---|---|---|---|
| Laminate structure (top/bottom) | | a2/a1/a2 | a2/a1/a2 |
| Metal composite A | | | |
| Sheet substrate a1 | | | |
| Composition of thermosetting resin | | | |
| "Epikote" 828 | Parts by mass | 20 | 20 |
| "Epikote" 834 | Parts by mass | 20 | 20 |
| "Epikote" 1001 | Parts by mass | 25 | 25 |
| "Epikote" 154 | Parts by mass | 35 | 35 |
| F-a-type benzoxazine resin | Parts by mass | | |
| Resol-type phenol resin/PHENOLITE 5010 | Parts by mass | | |
| Dicy7 (curing agent) | Parts by mass | 4 | 4 |
| DY9577 | Parts by mass | | |
| "Omicure" 24 (curing accelerator) | Parts by mass | 5 | 5 |
| Reinforcement fiber bundle | — | Carbon fiber | Carbon fiber |
| Degree of curing after 130° C. × 10 minutes | — | Cured state | Cured state |
| Metal material a2 | | | |
| Metal | — | Aluminum | Titanium |
| Thickness | mm | 0.5 | 0.2 |
| Surface treatment | — | Sand blasting | Sand blasting |
| Pore size | μm | 30 | 15 |
| Resin layer C | | | |
| Thermoplastic resin c | — | None | None |
| Melting point or glass transition temperature | °C. | None | None |
| Part B | | | |
| Thermoplastic resin b | — | Polyamide | Polyamide |
| Reinforcement fiber | — | None | None |
| Melting point or glass transition temperature | °C. | 225 | 225 |
| Volume specific resistance | Ω·cm | Out of scale | Out of scale |

TABLE 32

|  |  | Example 4-(9) | Example 4-(10) |
|---|---|---|---|
| Molding |  |  |  |
| Step 1 |  |  |  |
| Pressure | Mpa | 0.5 | 0.5 |
| Duration | min | 1 | 1 |
| Mold temperature: Upper mold | ° C. | 220 | 240 |
| Mold temperature: Lower mold | ° C. | 220 | 240 |
| Preheating temperature: Step 1-1 | ° C. | — | — |
| Preheating temperature: Step 1-2 | ° C. | — | — |
| Surface temperature of metal material | ° C. | 215 | 238 |
| Degree of curing of thermosetting resin | % | 82 | 88 |
| Step 2 |  |  |  |
| Pressure | MPa | 10 | 15 |
| Duration | min | 2 | 2 |
| Degree of curing of thermosetting resin | % | 100 | 100 |
| Demolding | — | Problem free | Problem free |
| Step 3 |  |  |  |
| Pressure | MPa | — | — |
| Duration | min | — | — |
| Mold temperature: Upper mold | ° C. | — | — |
| Mold temperature: Lower mold | ° C. | — | — |
| Surface temperature of metal material | ° C. | — | — |
| Time taken to fall to 180° C. or less | min | — | — |
| Degree of curing of thermosetting resin | % | — | — |
| Demolding | — | — | — |
| Mold take-up time | min | 3 | 3 |
| After molding |  |  |  |
| Processing of metal composite A |  | None | None |
| Post cure |  | — | — |
| Technique to integrate A and B | — | Injection molding | Injection molding |
| Complex shaping of part B | — | Frame, rib | Frame, rib |
| Evaluation |  |  |  |
| Bonding strength of metal composite | MPa | 16 | 16 |
| Weight of metal composite A | — | Good | Excellent |
| Rigidity | — | Excellent | Excellent |

TABLE 33

|  | Unit | Comparative example 4-(1) | Comparative example 4-(2) | Comparative example 4-(3) |
|---|---|---|---|---|
| Laminate structure (top/bottom) |  | a2/a1/a2 | a2/a1/a2 | a2 |
| Metal composite A |  |  |  |  |
| Sheet substrate a1 |  |  |  |  |
| Composition of thermosetting resin |  |  |  |  |
| "Epikote" 828 | Parts by mass | 20 | 20 |  |
| "Epikote" 834 | Parts by mass | 20 | 20 |  |
| "Epikote" 1001 | Parts by mass | 25 | 25 |  |
| "Epikote" 154 | Parts by mass | 35 | 35 |  |
| F-a-type benzoxazine resin | Parts by mass |  |  |  |
| Resol-type phenol resin/PHENOLITE 5010 | Parts by mass |  |  |  |
| Dicy7 (curing agent) | Parts by mass | 4 | 4 |  |
| DY9577 | Parts by mass |  |  |  |
| "Omicure" 24 (curing accelerator) | Parts by mass | 5 | 5 |  |
| Reinforcement fiber bundle | — | Carbon fiber | Carbon fiber | None |
| Degree of curing after 130° C. × 10 minutes | — | Cured state | Cured state | — |
| Metal material a2 |  |  |  |  |
| Metal | — | Aluminum alloy | Aluminum alloy | Aluminum alloy |
| Thickness | mm | 0.5 | 0.5 | 0.5 |
| Surface treatment | — | Alumite treatment | Alumite treatment | Alumite treatment |
| Pore size | μm | 0.05 | 0.05 | 0.05 |
| Resin layer C |  |  |  |  |
| Thermoplastic resin c | — | None | None | None |
| Melting point or glass transition temperature | ° C. | None | None | None |
| Part B |  |  |  |  |
| Thermoplastic resin b | — | Polyamide | Polyamide | Polyamide |
| Reinforcement fiber | — | None | None | None |

TABLE 33-continued

|  | Unit | Comparative example 4-(1) | Comparative example 4-(2) | Comparative example 4-(3) |
|---|---|---|---|---|
| Melting point or glass transition temperature | °C. | 225 | 225 | 225 |
| Volume specific resistance | Ω · cm | Out of scale | Out of scale | Out of scale |

TABLE 34

|  |  | Comparative example 4-(1) | Comparative example 4-(2) | Comparative example 4-(3) |
|---|---|---|---|---|
| Molding Step 1 |  |  |  |  |
| Pressure | Mpa | 0.5 | 0.5 | 0.5 |
| Duration | min | 1 | 1 | 1 |
| Mold temperature: Upper mold | °C. | 130 | 220 | 220 |
| Mold temperature: Lower mold | °C. | 130 | 220 | 220 |
| Preheating temperature: Step 1-1 | °C. | — | — | — |
| Preheating temperature: Step 1-2 | °C. | — | — | — |
| Surface temperature of metal material | °C. | 125 | 215 | 215 |
| Degree of curing of thermosetting resin | % | 12 | 82 | — |
| Step 2 |  |  |  |  |
| Pressure | MPa | 10 | 0.5 | 0.5 |
| Duration | min | 2 | 2 | 2 |
| Degree of curing of thermosetting resin | % | 22 | 100 | — |
| Demolding | — | Problem free | Problem free | Problem free |
| Step 3 |  |  |  |  |
| Pressure | MPa | — | — | — |
| Duration | min | — | — | — |
| Mold temperature: Upper mold | °C. | — | — | — |
| Mold temperature: Lower mold | °C. | — | — | — |
| Surface temperature of metal material | °C. | — | — | — |
| Time taken to fall to 180° C. or less | min | — | — | — |
| Degree of curing of thermosetting resin | % | — | — | — |
| Demolding | — | — | — | — |
| Mold take-up time | min | 3 | 3 | 3 |
| After molding |  |  |  |  |
| Processing of metal composite A |  | None | None | None |
| Post cure |  | — | — | — |
| Technique to integrate A and B | — | Molding not possible | Molding not possible | Molding not possible |
| Complex shaping of part B | — | — | — | — |
| Evaluation |  |  |  |  |
| Bonding strength of metal composite | MPa | Measurement not possible | Measurement not possible | Measurement not possible |
| Weight of metal composite A | — | Good | Good | Unsatisfactory |
| Rigidity | — | Unsatisfactory | Poor | Excellent |

INDUSTRIAL APPLICABILITY

The present invention provides manufacturing methods for metal composites which integrate metal materials together or metal materials and other structural materials via a cured resin layer or layers and which easily achieve an ability to process high-rigidity metal materials with an excellent amenability to thin-walling and lightweighting and a high degree of design freedom into complex shapes and an ability for fast compositing as demanded by the market. Such manufacturing methods make it possible to produce metal composites with excellent bonding strength. Metal composites produced using such manufacturing methods are advantageously used as electronic equipment chassis parts, including parts for electronic equipment chassis incorporating an electromagnetic shielding capability and antenna characteristics as required of electronic equipment fitted with telecommunications features.

EXPLANATION OF SYMBOLS

1 Metal material
2 Sheet substrate
2a Cured resin layer
3 Metal material
8 U-shaped metal material
10 Preform
11 Upper mold
12 Lower mold
21 Upper mold
22 Lower mold
31 Metal composite (A)
32 Part (B) composed of thermoplastic resin (b)
33 Electronic equipment chassis
41 Movable-side mold
42 Fixed-side mold
43 Injection molding machine
51 Part (B) composed of thermoplastic resin (b) (volume specific resistance $10^4$ Ω·cm or more)
52 Part (B) composed of thermoplastic resin (b) (volume specific resistance $10^4$ Ω·cm or less)
53 Antenna part
61 Injection mold (one half)
62 Flow channel
63 Injection mold (one half)
64 Flow channel
70 Test piece
71 Aluminum alloy block
72 Adhesive
81 Indenter
82 Support jig
EF Electric furnace
EH Electronic equipment chassis
HF Hot air furnace
P Pressure
Pm Molding pressure
S1 Step 1
S2 Step 2
S3 Step 3
T Temperature
T1 180° C.
T2 Metal mold temperature 1
T3 Metal mold temperature 2
Tm Surface temperature of metal material
(I) Semi-cured state
(II) Cured state

The invention claimed is:

1. A method for producing a metal composite which is molded by heating and pressurizing a preform including a sheet substrate containing a thermosetting resin and a metal material disposed in contact with the sheet substrate or laminated therewith to form the metal composite comprising the metal material and a cured resin layer formed by curing the thermosetting resin provided along the metal material, wherein the method comprises:
    a step 1 for placing the preform in a mold and heating the metal material to a temperature in excess of 180° C. while heating the sheet substrate to semi-cure the thermosetting resin, and
    a step 2 for applying a pressure to the preform being heated in the step 1 to form a composite material; and wherein the thermosetting resin is at least one selected from the group consisting of epoxy resin, phenol resin, benzoxazine resin and unsaturated polyester resin.

2. The method according to claim 1, wherein the mold has a surface temperature of 200 to 300° C. when the preform is placed in the step 1.

3. The method according to claim 1, wherein the thermosetting resin reaches a cured state in the step 2.

4. The method according to claim 1, wherein the sheet substrate is a prepreg obtained by impregnating a fiber base with a thermosetting resin.

5. The method according to claim 1, wherein a metal constituting the metal material is at least one selected from the group consisting of an aluminum alloy, magnesium alloy and titanium alloy.

6. A method for producing a metal composite which is molded by heating and pressurizing a preform including a sheet substrate containing at least one thermosetting resin selected from the group consisting of epoxy resin, phenol resin, benzoxazine resin and unsaturated polyester resin, and a metal material disposed in contact with the sheet substrate or laminated therewith to form the metal composite comprising the metal material and a cured resin layer formed by curing the thermosetting resin provided along the metal material, wherein the method comprises:
    a step 1 for placing the preform in a mold and heating the metal material so as to raise its surface temperature in excess of 180° C. while semi-curing the thermosetting resin,
    a step 2 for applying a pressure to the preform being heated in the step 1 to form the metal composite, and
    a step 3 for cooling down the metal composite molded in the step 2 under pressure so as to lower the surface temperature of the metal material to 180° C. or less.

7. The method according to claim 6, wherein the pressure applied to the metal composite in the step 3 is equal to or larger than the pressure applied to the preform in the step 2.

8. The method according to claim 6, wherein the mold has a surface temperature of 200 to 300° C. when the preform is placed in the step 1.

9. The method according to claim 6, wherein the sheet substrate is a prepreg obtained by impregnating a fiber base with a thermosetting resin.

10. The method according to claim 6, wherein a metal constituting the metal material is at least one selected from the group consisting of an aluminum alloy, magnesium alloy and titanium alloy.

11. A method for producing a metal composite including a metal material and a cured resin layer provided along the metal material, wherein the method comprises:
    a step 1-1 for heating a sheet substrate containing at least one thermosetting resin selected from the group consisting of epoxy resin, phenol resin, benzoxazine resin and unsaturated polyester resin, to semi-cure the thermosetting resin,
    a step 1-2 for preheating the metal material to its surface temperature of more than 180° C. but not more than 400° C., and
    a step 2 for placing in contact with each other or laminating the sheet substrate, which has undergone the step 1-1, and the metal material, which has been preheated in the step 1-2, inside a mold having a surface temperature of 180° C. or less and applying a pressure to mold them into the metal composite.

12. The method according to claim 11, wherein heating in the step 1-1 and heating in the step 1-2 are performed in apparatuses different from each other.

13. The method according to claim 11, wherein the sheet substrate is a prepreg obtained by impregnating a fiber base with a thermosetting resin.

14. The method according to claim 11, wherein a metal constituting the metal material is at least one selected from the group consisting of an aluminum alloy, magnesium alloy and titanium alloy.

* * * * *